United States Patent
Hashimoto

(10) Patent No.: US 9,672,918 B2
(45) Date of Patent: Jun. 6, 2017

(54) SEMICONDUCTOR MEMORY

(71) Applicant: KABUSHIKI KAISHA TOSHIBA, Tokyo (JP)

(72) Inventor: Toshifumi Hashimoto, Kanagawa (JP)

(73) Assignee: kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,702

(22) Filed: Feb. 27, 2015

(65) Prior Publication Data

US 2016/0071593 A1 Mar. 10, 2016

(30) Foreign Application Priority Data

Sep. 10, 2014 (JP) ................. 2014-184198

(51) Int. Cl.
| | | |
|---|---|---|
| *G11C 11/34* | (2006.01) | |
| *G11C 16/08* | (2006.01) | |
| *G11C 16/24* | (2006.01) | |
| *G11C 16/16* | (2006.01) | |
| *G11C 16/30* | (2006.01) | |
| *G11C 16/04* | (2006.01) | |
| G11C 16/26 | (2006.01) | |
| G11C 16/10 | (2006.01) | |

(52) U.S. Cl.
CPC .......... *G11C 16/08* (2013.01); *G11C 16/0483* (2013.01); *G11C 16/16* (2013.01); *G11C 16/24* (2013.01); *G11C 16/30* (2013.01); *G11C 16/10* (2013.01); *G11C 16/26* (2013.01)

(58) Field of Classification Search
CPC ................................ G11C 16/0483
USPC .................................... 365/185.33
See application file for complete search history.

(56) References Cited

U.S. PATENT DOCUMENTS

| | | | |
|---|---|---|---|
| 2010/0124116 A1 | 5/2010 | Maeda et al. | |
| 2011/0127597 A1* | 6/2011 | Fukuzumi | G11C 16/0466 257/314 |
| 2011/0199829 A1* | 8/2011 | Lee | G11C 16/0483 365/185.17 |
| 2011/0216603 A1* | 9/2011 | Han | G11C 16/04 365/185.23 |
| 2011/0235421 A1 | 9/2011 | Itagaki et al. | |
| 2011/0267885 A1 | 11/2011 | Kato | |
| 2012/0033501 A1* | 2/2012 | Park | G11C 11/5642 365/185.19 |

(Continued)

FOREIGN PATENT DOCUMENTS

| | | |
|---|---|---|
| JP | 2011-044222 A | 3/2011 |
| JP | 2011-198435 A | 10/2011 |
| JP | 2011-204856 A | 10/2011 |

OTHER PUBLICATIONS

TW Office Action dated Jun. 21, 2016 for Application No. 104106708.

*Primary Examiner* — Min Huang
*Assistant Examiner* — Pablo Huerta
(74) *Attorney, Agent, or Firm* — Patterson & Sheridan, LLP

(57) ABSTRACT

A semiconductor memory includes a first selection transistor and a second selection transistor on one end of a memory string. The first selection transistor includes a channel region in a semiconductor substrate, a channel region in a semiconductor pillar, and a gate electrode connected to a first line. The second selection transistor includes a channel region in the semiconductor pillar and a gate electrode connected to a second line. The first line is connected to a first voltage circuit, and the second line is connected to a second voltage circuit.

15 Claims, 39 Drawing Sheets

(56) References Cited

U.S. PATENT DOCUMENTS

| | | | |
|---|---|---|---|
| 2012/0039130 A1* | 2/2012 | Yoon | G11C 16/0483 365/185.18 |
| 2012/0051136 A1* | 3/2012 | Kang | G11C 16/344 365/185.17 |
| 2012/0230103 A1* | 9/2012 | Choe | G11C 16/0483 365/185.2 |
| 2012/0275234 A1* | 11/2012 | Lee | G11C 16/0483 365/185.23 |
| 2012/0307557 A1* | 12/2012 | Itagaki | G11C 16/0483 365/185.02 |
| 2013/0058165 A1* | 3/2013 | Maejima | H01L 27/088 365/185.11 |
| 2013/0114345 A1* | 5/2013 | Lee | G11C 16/0483 365/185.22 |
| 2013/0194868 A1* | 8/2013 | Hashimoto | G11C 16/0483 365/185.11 |
| 2013/0215684 A1* | 8/2013 | Oh | H01L 27/11582 365/185.29 |
| 2013/0279256 A1* | 10/2013 | Costa | G11O 5/02 365/185.17 |
| 2013/0332659 A1* | 12/2013 | Maejima | G11C 16/10 711/103 |
| 2014/0254268 A1* | 9/2014 | Dunga | G11C 16/0425 365/185.11 |
| 2014/0269100 A1* | 9/2014 | Sel | G11C 16/24 365/185.24 |
| 2015/0076578 A1* | 3/2015 | Sakamoto | H01L 27/11529 257/300 |
| 2015/0221385 A1* | 8/2015 | Ahn | G11C 16/10 365/185.2 |
| 2015/0262698 A1* | 9/2015 | Shirakawa | G11C 16/3445 365/185.11 |
| 2015/0325303 A1* | 11/2015 | Hashimoto | G11C 16/08 365/185.11 |
| 2016/0049192 A1* | 2/2016 | Lee | G11C 16/3427 365/185.03 |
| 2016/0071596 A1* | 3/2016 | Lee | G11C 16/10 365/185.22 |

* cited by examiner

SEMICONDUCTOR MEMORY

CROSS-REFERENCE TO RELATED APPLICATION

This application is based upon and claims the benefit of priority from Japanese Patent Application No. 2014-184198, filed Sep. 10, 2014, the entire contents of which are incorporated herein by reference.

FIELD

Embodiments described herein relate generally to a semiconductor memory.

BACKGROUND

Recently, flash memory having a structure in which memory cells are stacked has been proposed as an approach to improve bit density.

The stacked flash memory may realize a semiconductor memory having low cost and large capacitance.

DETAILED DESCRIPTION

Figure 1:
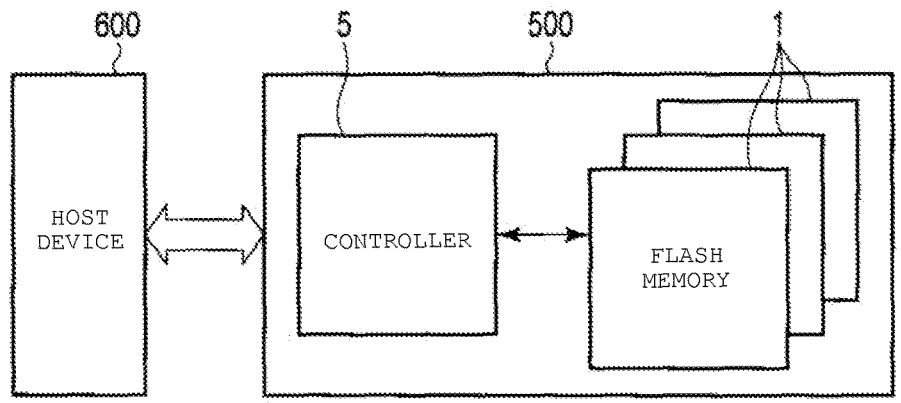
FIG. 1 is a diagram illustrating a device which includes a semiconductor memory according to an embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

According to one embodiment, a technology is proposed in which reliability of a semiconductor memory may be improved.

In general, according to one embodiment, a semiconductor memory includes a first memory string and a second memory string. The first memory includes a first selection transistor above a semiconductor substrate, a second selection transistor above the first selection transistor, first memory cells above the second selection transistor, and a third selection transistor above the first memory cells. The second memory string includes a fourth selection transistor, a fifth selection transistor above the fourth selection transistor, second memory cells above the fifth selection transistor, and a sixth selection transistor above the second memory cells. The semiconductor memory further includes a first line connected to gate electrodes of the first selection transistor and the fourth selection transistor, a second line connected to a gate electrode of the second selection transistor, a third line connected to a gate electrode of the fifth selection transistor, a first voltage generation circuit configured to generate a first voltage to the first line, and a second voltage generation circuit configured to generate a second voltage to the second line.

Hereinafter, embodiments will be described with reference to the drawings. In the following description, components having the same function and configuration are denoted by the same reference numerals and repetitive descriptions will be omitted.

In the respective embodiments, when reference numbers or letters (for example, word line WL, bit line BL, various switches, or the like) have suffixes, a description made using the reference numbers or letters with the suffix omitted applies to all elements identified by the reference numbers or letters.

(1) First Embodiment (a) Overall Configuration

A semiconductor memory according to a first embodiment will be described referring to FIG. 1 to FIG. 4.

As illustrated in FIG. 1, a storage device 500 includes a memory controller 5 and a semiconductor memory 1 according to the embodiment.

The storage device 500 is connected to a host device 600 through a connector to communicate using a certain standard, wireless communication, the Internet, and the like. The storage device 500 and the host device 600 transmit and receive data based on an interface standard which is set between the device 500 and 600.

The host device 600 requests writing/erasing of data and reading of data from the storage device 500.

The storage device 500 includes at least one semiconductor memory 1.

The memory controller 5 controls the semiconductor memory 1 according to the embodiment. The memory controller 5 executes to write, erase and read data in the semiconductor memory 1 based on, for example, a request of the host device 600. The memory controller 5 transmits data from the outside (for example, host device) of the storage device 500 to the semiconductor memory 1 when writing is executed. The memory controller 5 transmits data from the semiconductor memory 1 to the outside of the storage device 500 when reading is executed.

The storage device 500 and the host device 600 form a memory system.

The storage device 500 or the memory system including the storage device 500 is, e.g., a memory card such as an SD™ card, a USB memory, a solid state drive (SSD) or the like.

The semiconductor memory 1 according to the embodiment is, e.g., a flash memory.

Figure 2:
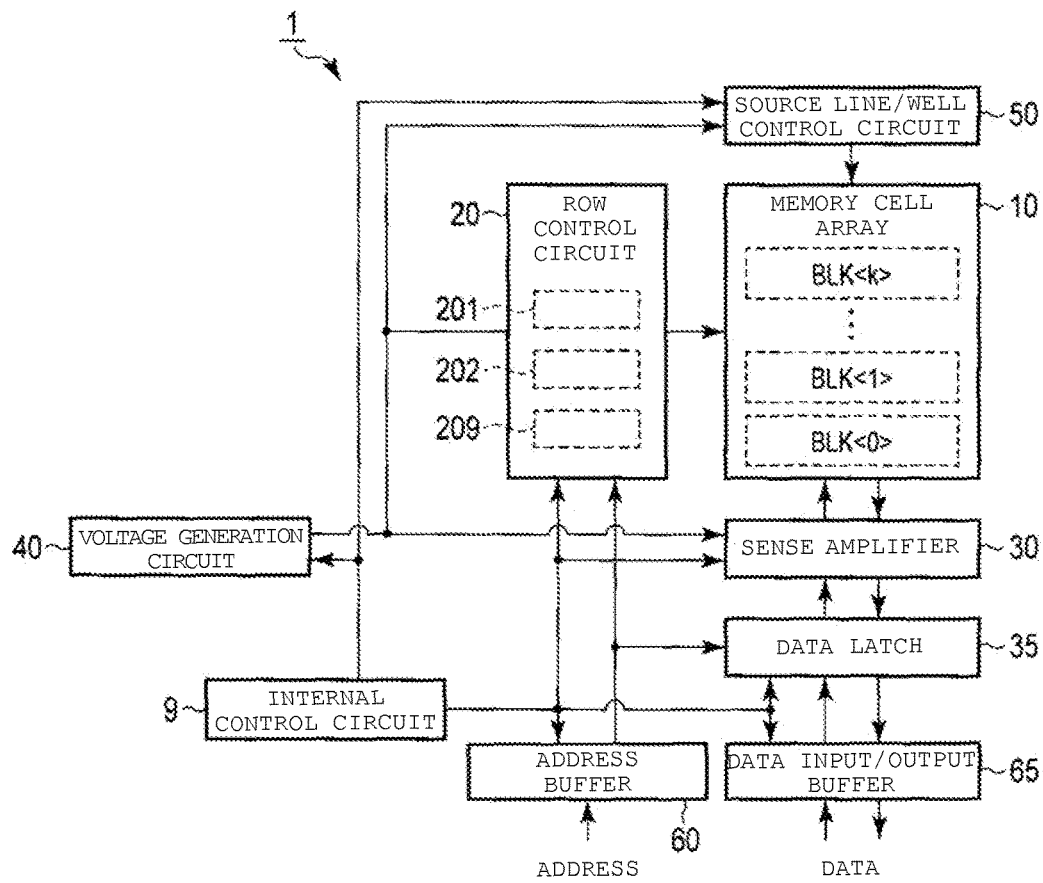
FIG. 2 is a diagram illustrating the overall configuration of the semiconductor memory according to the embodiment.

As illustrated in FIG. 2, the flash memory 1 includes a memory cell array and multiple circuits (referred to as a peripheral circuit below) that control an operation of the memory cell array.

The memory cell array 10 includes one or more memory cell regions BLK<0>, BLK<1>, and BLK<k−1> (k is an integer of equal to or more than one). For example, the memory cell region BLK refers to a block.

The flash memory 1 includes at least the following peripheral circuit.

A row control circuit 20 decodes a block address or a page address and selects a word line in the block BLK corresponding to the address. The row control circuit 20 applies various voltages to a line in the memory cell array 10 in order to execute an operation requested from the host device 600.

The row control circuit 20 includes a word line/selection gate line driver 201. The word line/selection gate line driver 201 drives a word line and a selection gate line in the block BLK. The row control circuit 20 includes a row decoder 209. The row decoder 209 causes the block, the word line and the selection gate line to be in a selected state or in a non-selected state. The row decoder 209 includes multiple switch circuits 290 and one or more address decoders 203 (see FIG. 5). The row control circuit 20 includes a selection gate line control circuit 202 which will be described later.

A sense amplifier circuit 30 senses a signal (data) output from a memory cell to a bit line and amplifies the sensed signal when data is read from the memory cell array 10. The sense amplifier circuit 30 transmits data to be written to a memory cell when the data is written in the memory cell array 10. In one embodiment, writing and reading of data in the memory cell array 10 are performed in units of a page.

A data latch circuit 35 temporarily stores data read from a memory cell and data to be written from the outside of the flash memory 1.

The data input/output buffer 65 buffers data from outside of the flash memory 1 and data from the memory cell array 10.

A voltage generation circuit 40 generates multiple voltages used for writing of data and reading of data. The voltage generation circuit 40 includes multiple power source circuits (e.g., voltage source circuits).

A source line/well control circuit 50 controls a potential (voltage) of a source line and a potential (voltage) of a well region.

An address buffer 60 buffers an address from the host device 600 and the memory controller 5.

The flash memory 1 includes an internal control circuit (for example, state machine) 9. The internal control circuit 9 controls each circuit inside the flash memory based on a command from the memory controller 5.

The flash memory 1 according to the embodiment includes a memory cell array having a three-dimensional structure.

Figure 3:
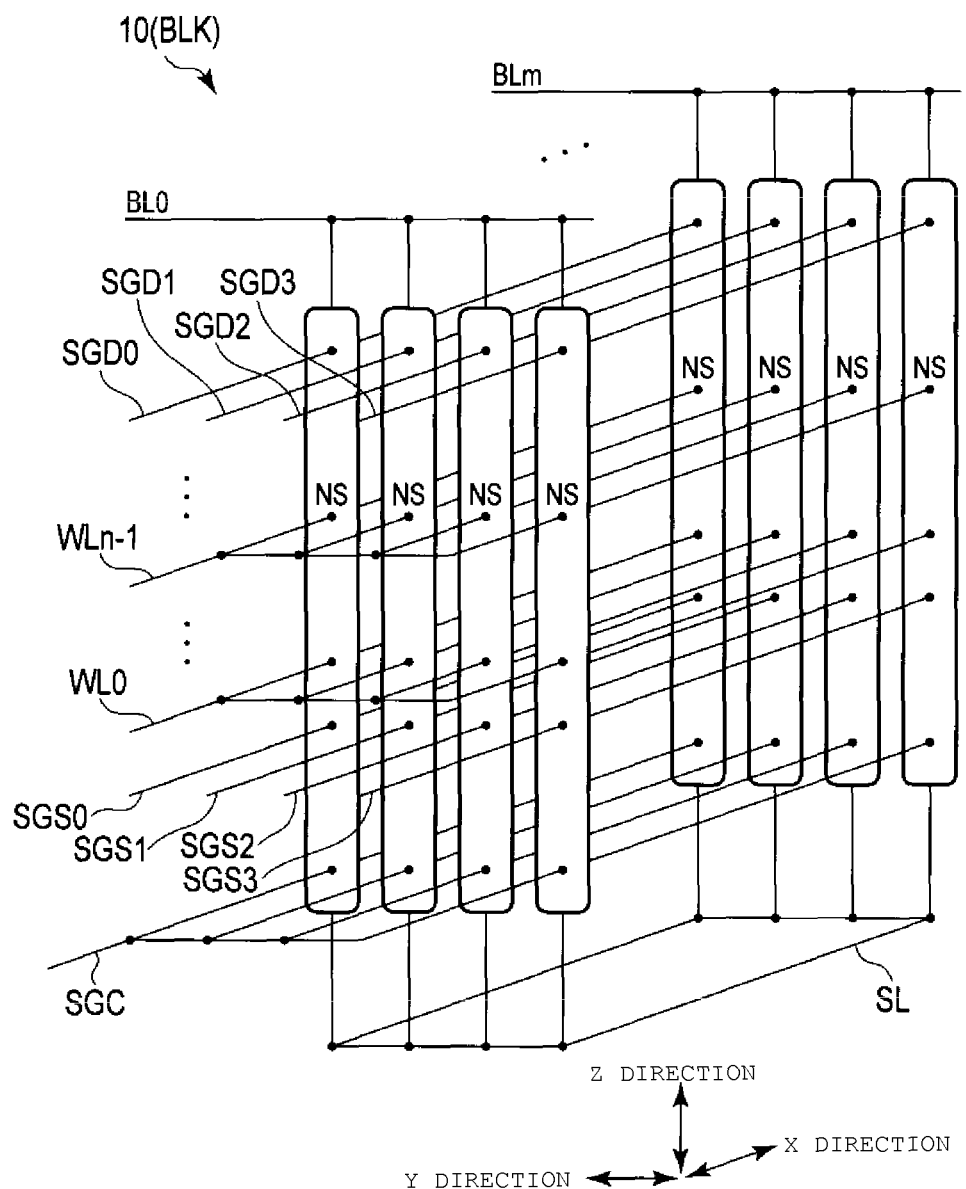
FIG. 3 is a diagram illustrating the basic configuration of the semiconductor memory according to the embodiment.
Figure 4A:
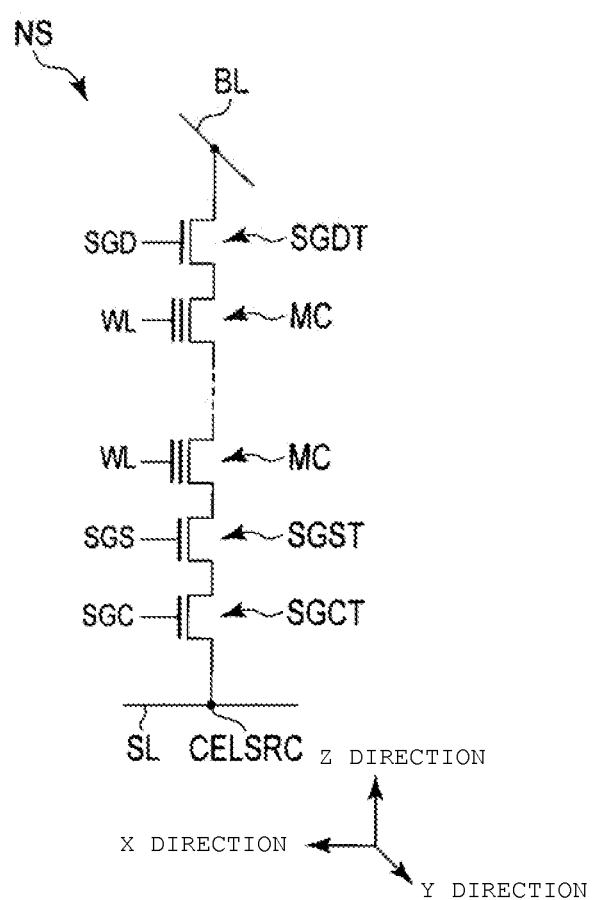
FIGS. 4A and 4B are diagrams illustrating the basic configuration of the semiconductor memory according to the embodiment.
Figure 4B:
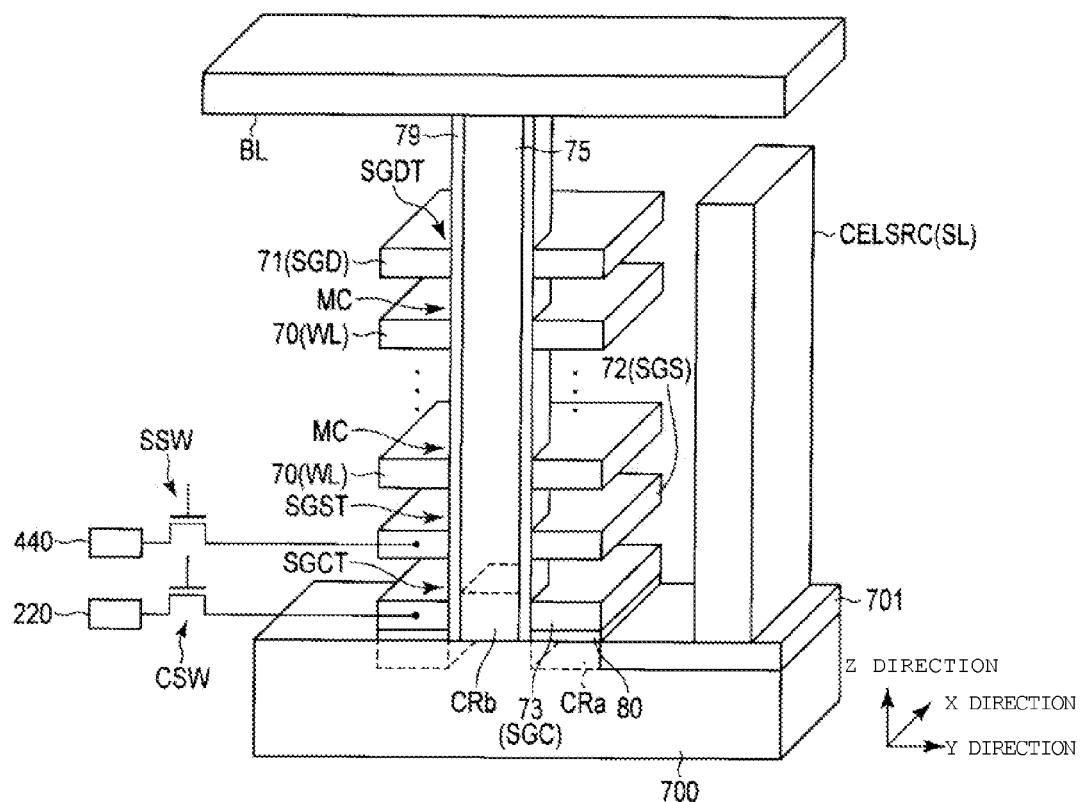

An internal configuration of the memory cell array having the three-dimensional structure according to the embodiment will be described referring to FIG. 3, FIG. 4A and FIG. 4B. FIG. 3 illustrates a schematic configuration example of one block BLK in the memory cell array 10. FIG. 4A is an equivalent circuit diagram illustrating components of the memory cell array in the flash memory according to the embodiment. FIG. 4B is a three-dimensional view illustrating a schematic structure of the components of the memory cell array.

The memory cell array 10 includes multiple bit lines BL0 to BLm−1. The memory cell array 10 includes a source line SL. The memory cell array 10 includes multiple word lines WL0 to WLn−1 stacked in a Z direction. The block BLK includes m bit lines BL0 to BLm−1 (m is an integer equal to or more than two) and n word lines WL0 to WLn−1 (n is an integer equal to or more than two).

In the following description, when the multiple bit lines BL0 to BLm−1 are not distinguished from each other, the multiple bit lines are referred to as the bit lines BL. When the multiple word lines WL0 to WLn−1 are not distinguished from each other, the multiple word lines are referred to as the word lines WL.

The memory cell array 10 of a NAND flash memory includes multiple memory units NS. The multiple memory units NS are disposed in an X direction and a Y direction in the memory cell array 10. Hereinafter, the memory unit NS of the NAND flash memory is referred to as a NAND string.

One of the multiple bit lines BL is connected to one end of the respective NAND strings NS disposed in the Y direction.

The source line SL is commonly connected to another end of the respective NAND strings NS. An internal configuration of a block is not limited to a configuration in which the multiple NAND strings are commonly connected to one source line. For example, multiple source lines may be provided in the memory cell array (or block) and voltage different from each other may be applied to the source lines.

The memory cell array 10 includes multiple selection gate lines SGD, SGS, and SGC. For example, one block BLK of the memory cell array 10 includes four selection gate lines SGD0, SGD1, SGD2, and SGD3 and four selection gate lines SGS0, SGS1, SGS2, and SGS3. The one block BLK includes one selection gate line SGC.

The block BLK includes multiple string units SU. The string units SU are disposed in the Y direction in the block BLK.

The string unit SU includes the multiple NAND strings NS commonly connected to the drain side selection gate line SGD and the source side selection gate line SGS. The multiple string units SU are commonly connected to the one selection gate line SGC. Hereinafter, the selection gate line SGC commonly connected to the string units SU is referred to as a common selection gate line SGC in order to separate the selection gate lines SGD and SGS included in each string unit SU from the selection gate line SGC.

As illustrated in FIG. 4A, the NAND string NS includes multiple memory cells MC and selection gate transistors SGDT, SGST, and SGCT in the NAND flash memory.

The multiple memory cells MC are connected to each other so that a current path is formed in series. The one selection gate transistor SGDT is connected to one end (drain side) of the multiple memory cells MC. The two selection transistors SGST and SGCT are connected to another end (source side) of the multiple memory cells.

The NAND string NS includes the multiple memory cells stacked in the Z direction on the substrate 700.

For example, the multiple memory cells MC are disposed in the X direction and the Y direction in one layer (position obtained by setting the Z direction to be a reference) and gates of the multiple memory cells MC are connected to the same word line WL. The memory cells MC adjacent to each other in the Z direction are connected to the word lines different from each other.

A gate of the selection gate transistor (hereinafter, referred to as a drain side selection gate transistor) SGDT on the drain side of the NAND string NS is connected to the drain side selection gate line SGD. The drain side selection gate transistor SGDT has a current path connected to a current path of the memory cell at a drain side end of the NAND string NS.

A gate of the selection gate transistor (hereinafter, referred to as a source side selection gate transistor) SGST on one of the source side in the NAND string NS is connected to the source side selection gate line SGS. The source side selection gate transistor SGST has a current path connected to a current path of the memory cell at a source side end of the NAND string NS.

A gate of the selection gate transistor SGCT on another of the source side in the NAND string NS is connected to the selection gate line SGC. The selection gate transistor SGCT has a current path connected to the source line SL and a current path of the memory cell at a source side end of the NAND string NS. Hereinafter, the selection gate transistor SGCT connected to the common selection gate line SGC is referred to as a common selection gate transistor SGCT.

As illustrated in FIG. 4B, the NAND string NS includes one semiconductor pillar. The semiconductor pillar 75 extends from the bit line BL to the substrate 700. For example, the semiconductor pillar 75 extends in a direction (Z direction) substantially perpendicular to a surface of the substrate 700.

Multiple conductive layers 70, 71, 72, and 73 are stacked on the substrate 700 in the Z direction. Each of the conductive layers 70, 71, 72, and 73 surrounds a side surface of the semiconductor pillar 75 through a film 79.

The multiple word lines WL include respectively multiple conductive layers 70.

The drain side selection gate line SGD includes the conductive layer 71. The conductive layer 71 is stacked above the multiple conductive layers 70 used as the word lines WL.

The source side selection gate line SGS includes the conductive layer 72. The conductive layer 72 is provided between the conductive layer 70 used as the word line WL and the substrate 700.

The common selection gate line SGC includes the conductive layer 73. The conductive layer 73 is provided between the conductive layer 72 and the substrate 700.

The memory cell MC and the selection gate transistors SGDT and SGST are provided on the side surface of the semiconductor pillar 75 for connecting the bit line BL and the substrate 700.

A gate electrode of the memory cell MC includes the conductive layer 70. That is, the word line WL functions as the gate electrode of the memory cell MC. The memory cell MC includes the film 79 between the semiconductor pillar 75 and the conductive layer 70, as a memory film 79. The memory film 79 is a film having a stacked structure which includes a charge accumulation layer (for example, charge trapping film).

A gate electrode of the drain side selection gate transistor SGDT includes the conductive layer 71 as the drain side selection gate line SGD.

A gate electrode of the source side selection gate transistor SGST includes the conductive layer 72 as the source side selection gate line SGS.

A gate electrode of the common selection gate transistor SGCT includes the conductive layer 73 as the common selection gate line SGC.

The common selection gate transistor SGCT is connected to the source line SL through, for example, a source line contact (hereinafter, also referred to as an internal source line) CELSRC.

A gate insulating film 80 of the common selection gate transistor SGCT is interposed between the gate electrode 73 of the selection gate transistor SGCT and the substrate 700.

The gate electrode 73 of the selection gate transistor SGCT faces the semiconductor pillar 75 through an insulating film (for example, memory film 79) on the side surface of the semiconductor pillar 75. The common selection gate transistor SGCT includes the memory film 79 as the gate insulating film, similarly to the source side selection gate transistor SGST, for example.

The common selection gate transistor SGCT includes a channel region CRa of the semiconductor substrate (semiconductor region) 700 and a channel region CRb in the semiconductor pillar 75.

The source line contact CELSRC connects the semiconductor pillar 75 to the source line SL. The source line contact CELSRC is provided on a diffusion layer 701 in the semiconductor substrate 700. For example, the source line contact CELSRC is commonly used to two string units SU which are adjacent to each other in the Y direction.

A configuration of the memory cell array 10 and a manufacturing method thereof may be as disclosed in, for example, U.S. patent application Ser. No. 12/407,403 filed Mar. 19, 2009 titled "Three dimensional stacked nonvolatile semiconductor memory". A configuration of the memory cell array 10 and a manufacturing method thereof may be as disclosed in U.S. patent application Ser. No. 12/406,524 filed Mar. 18, 2009 titled "Three dimensional stacked non-volatile semiconductor memory", U.S. patent application Ser. No. 12/679,991 filed Mar. 25, 2010 titled "Non-volatile semiconductor storage device and method of manufacturing the same", and U.S. patent application Ser. No. 12/532,030 filed Mar. 23, 2009 titled "Semiconductor memory and method for manufacturing same". All of these Patent Applications are incorporated by reference herein in their entireties.

In the flash memory according to the embodiment, the common selection gate line SGC and the source side selection gate line SGS are independently controlled. The common selection gate line SGC and the source side selection gate line SGS are connected to the voltage circuits different from each other.

The source side selection gate line SGS is connected to the voltage circuit (voltage source) 40 through a switch SSW and a line SGSI.

The common selection gate line SGC is connected to a voltage circuit 220 different from the voltage circuit 40 through a switch CSW different from the switch SSW and the line SGCI different from the line SGSI.

Accordingly, the flash memory 1 according to the embodiment may independently apply the respective voltages to the selection gate line SGS on the source line side and the common selection gate line SGC.

When an ON voltage of the common selection gate transistor SGCT is applied to the common selection gate line SGC crossing over the multiple string units SU, a channel (inversion layer) is generated in the semiconductor substrate 700 below the gate electrode 73 of the selection gate transistor SGCT which is in an ON state, regardless of whether or not the NAND string NS includes the memory cell which is an operation target.

The NAND string NS including the selected memory cell is connected to the source line contact CELSRC which is connected to the non-selected NAND string NS through multiple channels in the semiconductor substrate 700.

Accordingly, the flash memory according to the embodiment may supply a current flowing from the bit line BL toward the source line when data is read to the source line SL through the multiple source line contacts CELSRC. As a result, it is possible for the flash memory according to the embodiment to reduce an influence due to resistance between the source line and the substrate.

In the embodiment, the source side selection gate transistor SGST turns OFF between the common selection gate transistor SGCT of the non-selected string unit SU and the memory cell MC when data is read.

The non-selected NAND string NS is electrically isolated from the substrate 700 and the source line contact CELSRC by the source side selection gate transistor SGST which is in an OFF state even though the common selection gate transistor SGCT is in the ON state. Accordingly, it is possible for the flash memory according to the embodiment to suppress disturbance in the non-selected cell when reading is performed.

(b) Specific Example

A configuration example of the flash memory according to the embodiment will be described referring to FIG. 5 to FIG. 13. FIG. 1 to FIG. 4B are appropriately used in order to describe the configuration example of the flash memory illustrated in FIG. 5 to FIG. 13.

(b-1) Circuit

Figure 5:
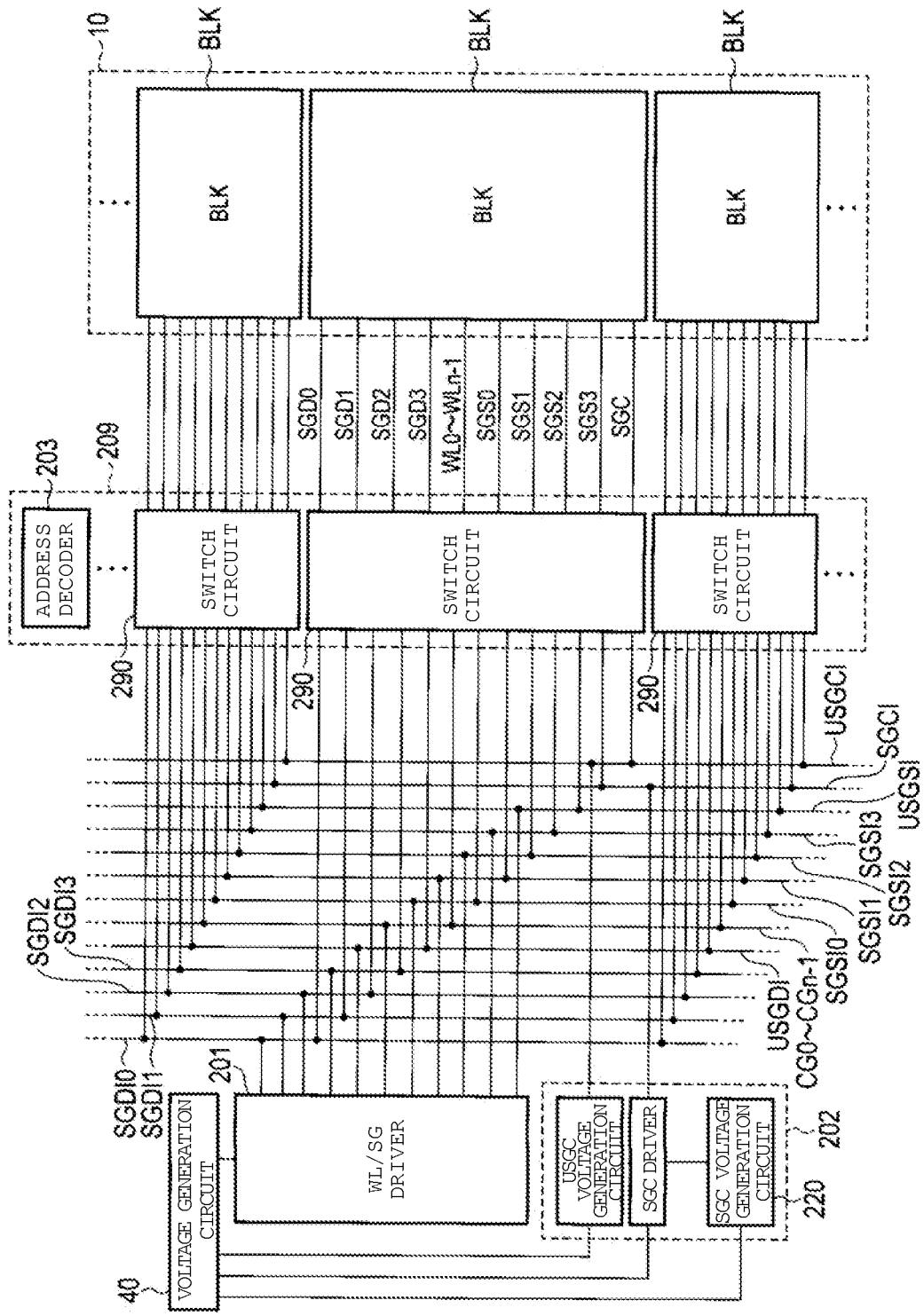
FIG. 5 is a block diagram illustrating a configuration example of a semiconductor memory according to the first embodiment.

As illustrated in FIG. 5, the row decoder 209 includes one or more address decoder 203 and multiple switch circuits 290. One switch circuit 290 corresponds to one block BLK.

The switch circuit 290 is electrically connected to the block BLK. The switch circuit 290 is electrically connected to circuits 201 and 202 in the flash memory.

The voltage generation circuit 40 outputs various voltages (control voltage/driving voltage) to be applied to, for example, the word line WL and the respective selection gate lines SGD, SGS, and SGC to drivers 201 and 221. For example, the voltage generation circuit 40 includes multiple power sources (e.g., voltage source or power supply terminal).

A word line/selection gate line driver 201 drive the word line WL and the drain side/source side selection gate lines SGD and SGS. The word line/selection gate line driver 201 applies a voltage from the voltage generation circuit 40 to the word line WL, the drain side selection gate line SGD, and the source side selection gate line SGS through the switch circuit 290 in accordance with an operation of the flash memory 1.

The flash memory 1 according to the embodiment includes the circuit (hereinafter, referred to as a common selection gate control circuit) 202 for controlling the common selection gate line SGC connected to the NAND string NS.

The common selection gate line control circuit 202 includes a selection voltage generation circuit (hereinafter, also represented by an SGC voltage generation circuit) 220, a common selection gate line driver (hereinafter, also represented by an SGC driver) 221, and a non-selection voltage generation circuit (hereinafter, also represented by a USGC voltage generation circuit) 225.

The selection voltage generation circuit 220 generates a voltage for driving the common selection gate line SGC in the selected block BLK in accordance with an address of the selected block.

The common selection gate line driver 221 applies a voltage from the selection voltage generation circuit 220 to the common selection gate line SGC through the line SGCI and the switch circuit 290. The common selection gate line driver 221 may apply a voltage from the voltage generation circuit 40 to the common selection gate line SGC through the switch circuit 290.

The non-selection voltage generation circuit 225 generates a voltage for driving the common selection gate line SGC in the non-selected block BLK. The non-selection voltage generation circuit 225 applies the generated voltage to the common selection gate line SGC through the switch circuit 290.

The voltage generation circuit 40 may include the selection voltage generation circuit 220 and the non-selection voltage generation circuit 225.

In the flash memory 1, multiple lines to the multiple switch circuits 290 are commonly used. The switch circuit 290 causes the word line WL and the respective selection gate lines SGS and SGD in the memory cell array 10 to be connected to the word line/selection gate line driver 201 in accordance with an address of the selected block.

The flash memory 1 includes multiple lines (selection control line) SGDI connected to the drain side selection gate line SGD of the block BLK through the switch circuit 290. When the block BLK includes four drain side selection gate lines, the flash memory 1 includes four lines SGDI0 to SGDI3 respectively corresponding to the four drain side selection gate lines SGD0 to SGD3.

The flash memory 1 includes one line (non-selection control line) USGDI connected to the drain side selection gate line SGD of the block BLK through the switch circuit 290.

The flash memory 1 includes multiple lines (hereinafter also represented by a CG line) CG0 to CGn−1 connected to the word lines WL of the block BLK through the switch circuit 290. FIG. 5 illustrates only one CG line to simplify the illustration. For example, the number of the CG lines CG0 to CGn−1 in the flash memory 1 is equal to the number (n) of the word lines WL in the block BLK.

The flash memory 1 includes the multiple lines (selection control line) SGSI connected to the source side selection gate line SGS of the block BLK through the switch circuit 290. When the block BLK includes the four source side selection gate lines SGS0 to SGS3, the flash memory 1 includes four lines SGSI0 to SGSI3 respectively corresponding to the four source side selection gate lines SGS0 to SGS3.

The flash memory 1 includes one line (non-selection control line) USGSI connected to the source side selection gate line SGS of the block BLK through the switch circuit 290.

The flash memory 1 according to the embodiment includes the line SGCI and the line USGCI. The line SGCI and the line USGCI connect the common selection gate line SGC of the block BLK to the common selection gate line control circuit 202 through the switch circuit 290.

The common selection gate line driver 221 is connected to the line (selection control line) SGCI.

The non-selection voltage generation circuit 225 is connected to the line (non-selection control line) USGCI. The non-selection voltage generation circuit 225 may be connected to the line USGCI through the common selection gate line driver 221.

In this manner, the common selection gate line control circuit 202 applies a voltage to the common selection gate line SGC in the memory cell array 10 through the line SGCI and the line USGCI which respectively correspond to the common selection gate line SGC. With this, the common selection gate line control circuit 202 controls and drives the common selection gate line SGC of the NAND string NS in the block BLK.

Figure 6:
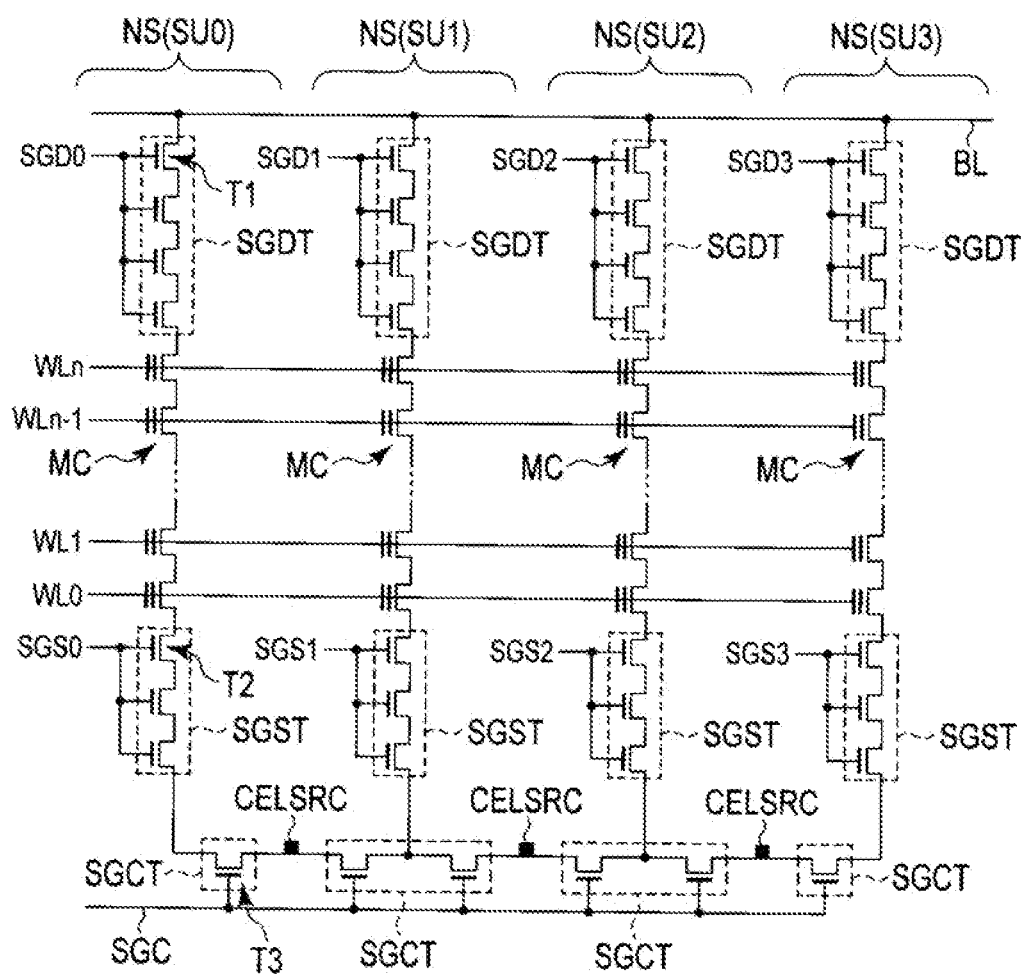
FIG. 6 is an equivalent circuit diagram of the semiconductor memory according to the first embodiment.

As with an equivalent circuit diagram illustrating a configuration example of the NAND string illustrated in FIG. 6, the block BLK includes four string units SU. In the block BLK, four NAND strings NS are connected to one bit line BL.

For example, the drain side selection gate transistor SGDT includes four transistors T1 which are connected such that a current path is formed in series. The drain side selection gate line SGD is connected to gates of the four transistors T1.

For example, the source side selection gate transistor SGST includes three transistors T2 which are connected such that a current path is formed in series. The source side selection gate line SGS is connected to gates of the three transistors T2.

Even though the selection gate transistor SGDT includes the multiple transistors T1 and the selection gate transistor SGST includes the multiple transistors T2, as illustrated in FIG. 6, the multiple transistors T1 and the multiple transistors T2 are respectively connected such that the current paths thereof are formed in series. In addition, the gate electrodes of the multiple transistors T1 are connected to each other and the gate electrodes of the multiple transistors T2 are connected to each other. For this reason, the multiple transistors T1 which form the selection gate transistor SGDT and the multiple transistors T2 which form the selection gate transistor SGST may be considered as equivalent to one transistor (selection gate transistor). The drain side selection gate transistor SGDT may be one transistor T1 and the source side selection gate transistor SGST may be one transistor T2.

The common selection gate transistor SGCT is provided between the source side selection gate transistor SGST and the source line SL.

The common selection gate transistor SGCT which is connected to two source line contacts CELSRC includes two transistors T3. The two transistors T3 may be considered as two common selection gate transistors SGCT which are independent from each other. The two transistors T3 may be considered as one common selection gate transistor.

Figure 7:
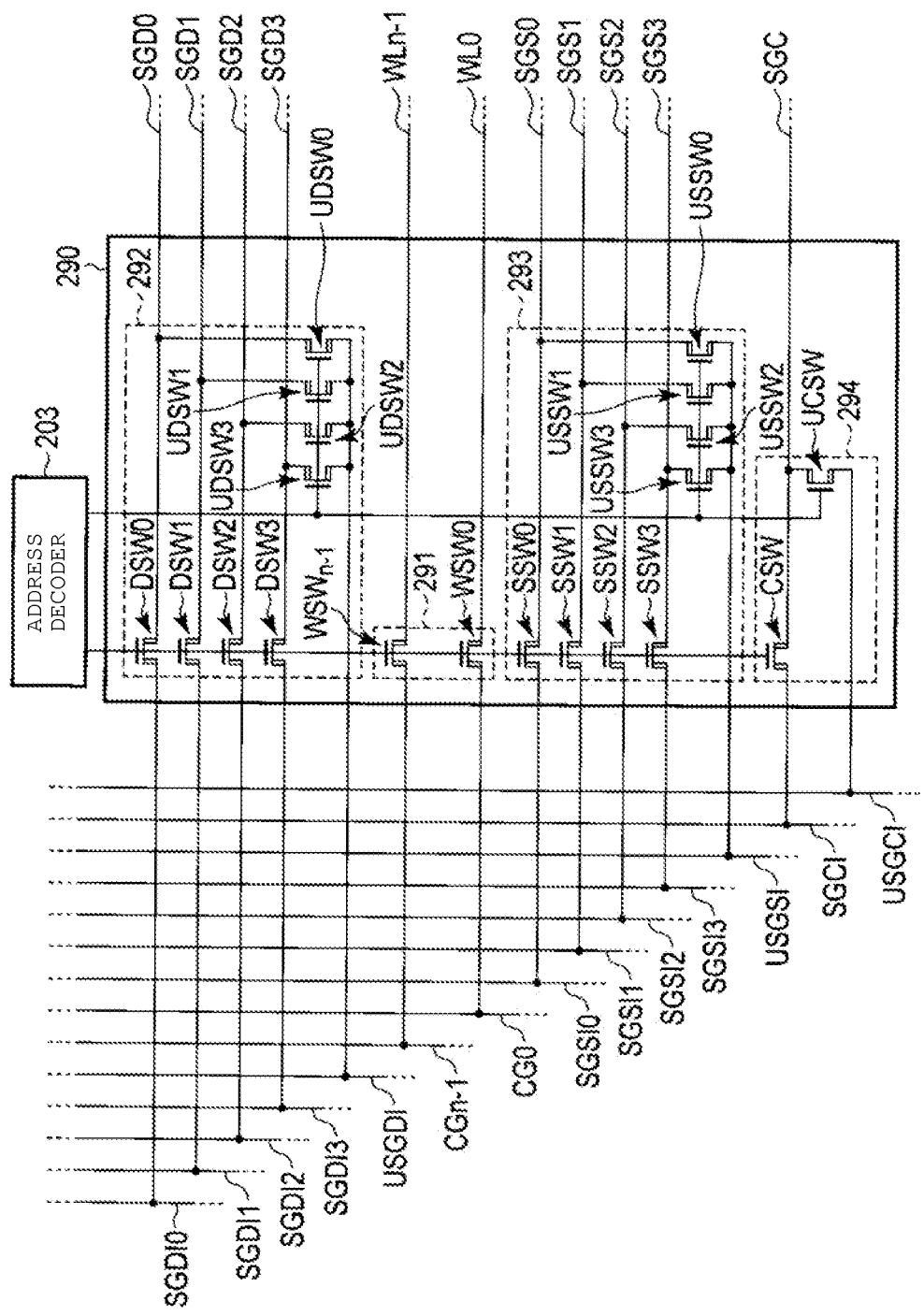
FIG. 7 is an equivalent circuit diagram of the semiconductor memory according to the first embodiment.

As illustrated in FIG. 7, the switch circuit 290 includes a word line switch unit 291, a drain side selection gate line switch unit 292, a source side selection gate line switch unit 293, and a common selection gate line switch unit 294.

Each of the switch units 291, 292, 293, and 294 includes, for example, a high breakdown voltage transistor.

The word line switch unit 291 includes switches (selection switch) WSW of which the number is equal to the number of the word lines in the block BLK.

One end of a current path in the switch WSW is connected to the one word line WL. Another end of the current path in each of the switches WSW is connected to one CG line CG corresponding to the word line WL. A control terminal (gate) of the switch WSW is connected to a selection signal line of the address decoder 203. ON and OFF of the switch WSW is controlled based on a decode signal (block selection signal) BLKSEL from the address decoder 203.

The switch WSW in the ON state transmits various voltages in accordance with an operation of the flash memory to the word line in the selected block BLK.

The drain side selection gate line switch unit 292 includes multiple switches (selection switch) DSW0, DSW1, DSW2, and DSW3.

The number of the switches DSW0 to DSW3 is equal to the number of the drain side selection gate lines SGD in the block. The switches DSW0 to DSW3 correspond to the drain side selection gate lines SGD0 to SGD3 one to one.

One ends of the switches DSW0 to DSW3 are respectively connected to the drain side selection gate lines SGD0 to SGD3. Another ends of the switches DSW0 to DSW3 are respectively connected to the line SGDI0 to SGDI3.

Control terminals (gate of transistor) of the switches DSW0 to DSW1 are connected to the selection signal line of the address decoder 203.

ON/OFF of the switches DSW0 to DSW3 are controlled based on the decode signal BLKSEL.

The drain side selection gate line switch unit 292 includes multiple switches (non-selection switch) UDSW0, UDSW1, UDSW2, and UDSW3.

The number of the switches UDSW is equal to the number of the drain side selection gate lines SGD in the block BLK. The switches UDSW0 to UDSW3 correspond to the drain side selection gate lines SGD0 to SGD3 one to one.

One ends of the switches UDSW0 to UDSW3 are respectively connected to the drain side selection gate lines SGD0 to SGD3. Another ends of the switches UDSW0 to UDSW3 are commonly connected to the line USGDI.

The selection signal BLKSEL and a non-selection signal BLKSELn, have signal levels complementary to each other (H level and L level), for example. When the switch DSW turns ON by an H level signal, the switch UDSW turns OFF by an L level signal.

In this case, the drain side selection gate line SGD is electrically coupled with the line SGDI. The switch DSW in the ON state transmits a voltage applied by the line SGDI corresponding to an operation of the flash memory and a selection address to the drain side selection gate line SGD in the selected block.

When the switch UDSW is in the ON state, the drain side selection gate line SGD is electrically coupled with the line USGDI. The switch UDSW in the ON state transmits a voltage of the line USGDI to the drain side selection gate line SGD in the non-selected block.

The source side selection gate line switch unit 293 includes multiple switches (selection switch) SSW.

The number of the switches SSW0 to SSW3 is equal to the number of the source side selection gate lines SGS in the block BLK. The switches SSW0 to SSW3 correspond to the source side selection gate lines SGS0 to SGS3 one to one.

One ends of the switches SSW0 to SSW3 are respectively connected to the source side selection gate lines SGS0 to SGS3. Another ends of the switches SSW0 to SSW3 are respectively connected to the line SGSI0 to SGSI3.

Control terminals (gate of transistor) of the switches SSW0 to SSW1 are connected to the selection signal line of the address decoder 203.

ON/OFF of the switches SSW0 to SSW3 are controlled based on the decode signal BLKSEL.

The source side selection gate line switch unit 293 includes multiple switches (non-selection switch) USSW. The number of the switches USSW is equal to the number (for example, four) of the source side selection gate lines SGS in the block BLK. The switches USSW correspond to the source side selection gate lines SGS one to one.

One ends of the switches USSW0 to USSW3 are respectively connected to the source side selection gate line SGS0 to SGS3. Another ends of the switches USSW0 to USSW3 are commonly connected to the line USGSI.

Control terminals (gate of transistor) of the switches USSW are connected to the non-selection signal line of the address decoder 203. ON/OFF of the switches USSW are controlled based on the decode signal BLKSELn.

When the switch SSW is in the ON state and the switch USSW is in the OFF state based on the decode signals BLKSEL and BLKSELn, the switch SSW in the ON state transmits a voltage applied to the line SGDI corresponding to an operation of the flash memory and the selected address to the respective source side selection gate lines SGS.

On the other hand, when the switch SSW turns OFF and the switch USSW turns ON, the switch USSW in the ON state transmits a voltage applied to the line USGDI to the drain side selection gate line SGD. The switch USSW may or may not be in the switch circuit 290 considering the number of elements in the switch circuit 290.

The common selection gate line switch unit 293 includes multiple switches CSW and UCSW.

The switches CSW and UCSW correspond to the common selection gate line SGC provided in the block BLK.

One end of a current path in the switch (selection switch) CSW is connected to the common selection gate line SGC in the block BLK. Another end of the current path in the switch CSW is connected to the control line SGCI which is commonly used in the multiple blocks BLK.

A control terminal (gate) of the switch CSW is connected to the selection signal line of the address decoder 203. ON/OFF of the switch CSW is controlled based on the decode signal BLKSEL.

One end of a current path in the switch (non-selection switch) UCSW is connected to the common selection gate line SGC in the block BLK. Another end of the current path in the switch UDSW is connected to the line USGCI which is commonly used in the multiple blocks BLK.

A control terminal (gate) of the switch UCSW is connected to the non-selection signal line of the address decoder 203. ON/OFF of the switch UCSW is controlled based on the decode signal BLKSELn.

When the switch CSW is in the ON state and the switch UCSW is in the OFF state based on the decode signals BLKSEL and BLKSELn, the common selection gate line SGC in the selected block BLK is electrically coupled with the line SGCI. The switch CSW in the ON state transmits a voltage applied to the line SGCI corresponding to an operation of the flash memory to the common selection gate line SGC.

When the switch CSW turns OFF and the switch UCSW turns ON, the common selection gate line SGC in the non-selected block BLK is electrically coupled with the line USGDI. The switch UCSW in the ON state transmits a voltage applied to the line USGCI to the common selection gate line SGD.

(b-2) Structure

A structural example in the block BLK of the flash memory according to the embodiment will be described by using FIG. 8 to FIG. 11.

As with a schematic planar structure illustrated in FIG. 8 and a schematic cross-sectional structure illustrated in FIG. 9 and FIG. 10, a contact (hereinafter, referred to as a well contact) CPWELL is provided at end regions of the block BLK. For example, the well contact CPWELL surrounds the block BLK.

The well contact CPWELL is connected to a P well region 709 in the substrate 700. The contact CPWELL comes into contact with a $P^+$ type diffusion layer 702 at the P well region. The $P^+$ type diffusion layer 702 causes contact resistance of the contact CPWELL with the P well region 709 to be reduced.

The multiple NAND strings NS of the block BLK are provided at a region which is surrounded by the well contact CPWELL. The region at which the multiple NAND strings NS (storing units) are provided in the block BLK is referred to as a continuous semiconductor region.

When drain side selection gate transistor SGDT includes the four transistors T1, as in FIG. 6, the drain side selection gate transistor SGDT includes four conductive layers 71A, 71B, 71C, and 71D on an upper end side of the semiconductor pillar 75 as the gate electrodes of the transistors T1.

When the source side selection gate transistor SGST includes the three transistors T2, similarly to the drain side selection gate transistor SGDT, the source side selection gate transistor SGST includes three conductive layers 72A, 72B, and 72C on a lower end side of the semiconductor pillar 75 as the gate electrode of the transistors T2.

The conductive layer 70 as the word line WL extends in the X direction.

The word line WL in a line level is not divided for each string unit SU in the block BLK. The continuous conductive layer 70 in the line level is used as the word line WL common with the multiple string units SU.

The conductive layer 71 as the drain side selection gate line SGD extends in the X direction. The conductive layer 71 is divided for each string unit SU. The stacked conductive layer 71 is connected to the common line (not illustrated) at end regions of the memory cell array 10.

The conductive layer 72 as the source side selection gate line SGS extends in the X direction. The conductive layer 72 is divided for each string unit SU. The stacked conductive layer 72 is connected to the common line (not illustrated) at the end regions of the memory cell array 10.

The conductive layer 73 as the common selection gate line SGC includes a continuous line pattern in the block BLK without division for each string unit SU, for example.

For example, the conductive layer 73 has a planar shape similarly to the conductive layer 70.

Figure 8:
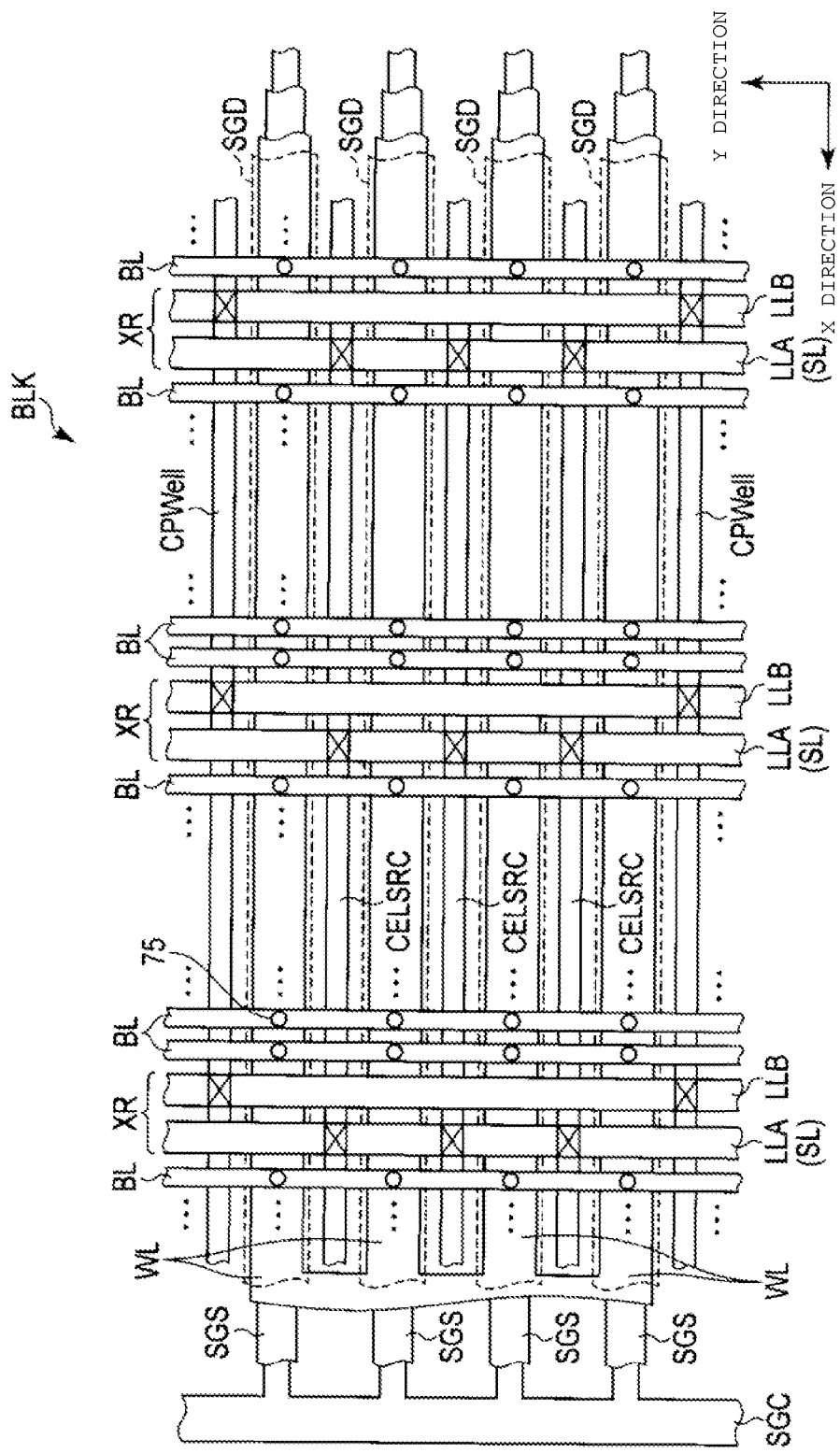
FIG. 8 is a schematic diagram illustrating a structural example of the semiconductor memory according to the first embodiment.

FIG. 8 illustrates the word line WL extending in the X direction and the selection gate lines SGD and SGS extending in the X direction. In accordance with a line layout of the block BLK, the word line WL and the selection gate lines SGD and SGS may be bent in the Y direction at an end of the block BLK.

The source line contact CELSRC is provided between the string units SU.

The string units SU adjacent to each other share the source line contact CELSRC. The contact CELSRC has, for example, a plate-shaped structure which extends in the X direction. The source line contact CELSRC has a relatively high resistance value due to the shape of the source line contact CELSRC.

The source line contact CELSRC is connected to an N+ type diffusion layer 701 of the P well region 709.

An upper end of the semiconductor pillar 75 is connected to the bit line BL through a bit line contact BC. A lower end of the semiconductor pillar 75 comes into contact with the P well region 709.

The source line (also referred to as an internal source line) SL is connected to the N+ type diffusion layer 701 through the source line contact CELSRC. A shunt line LLA is provided above the source line SL. The shunt line LLA is connected to the source line SL through a plug SC.

The source line contact CELSRC and the source line SL are subjected to shunt at a certain distance in the memory cell array 10 in order to reduce resistance. The memory cell array 10 (block BLK) includes multiple shunt regions XR.

For example, a shunt line LLB for the well region is provided in the shunt region XR. The shunt line LLB is connected to the well contact CPWELL.

Figure 11:
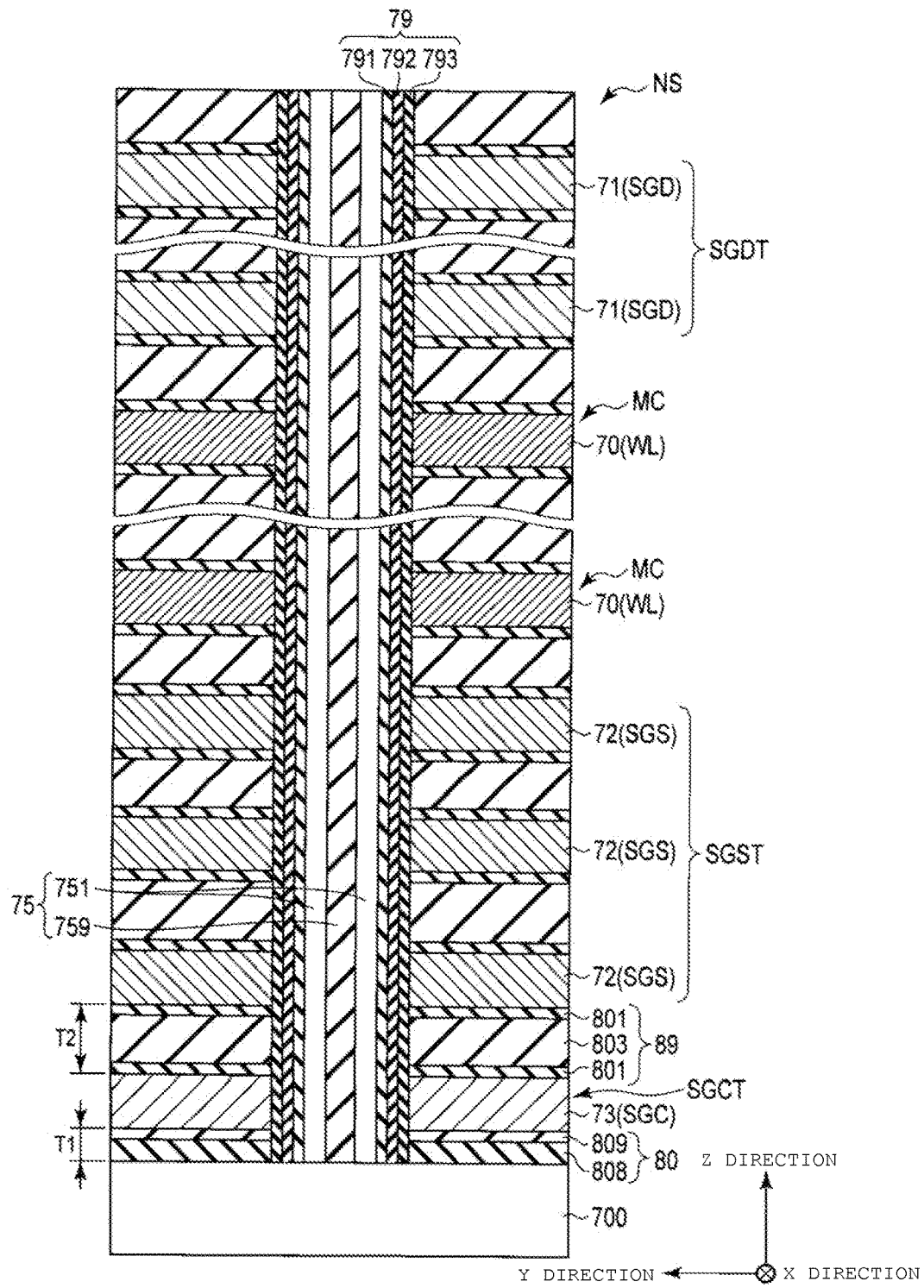
FIG. 11 is a cross-sectional view illustrating a structural example of the semiconductor memory according to the first embodiment.

As with more specific cross-sectional structure of the NAND string illustrated in FIG. 11, for example, the semiconductor pillar 75 includes a core section 759 and a semiconductor region 751. The core section 759 includes a columnar insulator (for example, silicon oxide). The semiconductor region 751 covers a side surface of the core section 759.

The memory cell MC includes a channel region in the semiconductor region 751. The semiconductor pillar 75 may be a semiconductor layer formed by epitaxial growth on the semiconductor substrate 700.

The conductive layers 70, 71, 72, and 73 and inter-layer insulating films 89 are alternately stacked on the substrate 700. The conductive layers 70 to 73 and the inter-layer insulating films 89 cover a side surface of the semiconductor pillar 75.

Each of the inter-layer insulating films 89 has a stacked structure.

The inter-layer insulating film 89 has a structure in which a silicon oxide film 803 is interposed between two aluminum oxide films (alumina films) 801 in the Z direction. Each of the conductive layers 70, 71, and 72 is interposed between the two alumina films 801 in the Z direction. For example, the thickness of the alumina film 801 is thinner than the thickness of the silicon oxide film 803.

The memory film 79 including the charge accumulation layer has a three-layer structure, for example. The charge accumulation layer (for example, silicon nitride layer) is interposed between a silicon oxide film 791 on the semiconductor pillar side and an aluminum oxide film (alumina film) 793 on the conductive layer side in a direction parallel with the surface of the substrate.

Gate insulating films of the drain side selection gate transistor SGDT and the source side selection gate transistor SGST include the memory film 79.

The common selection gate transistor SGCT includes the insulating film 80 on the substrate 700 as a portion of the gate insulating film. The gate insulating film 80 has a stacked structure and includes a silicon oxide film 808 on the substrate 700 and an alumina film 809 on the silicon oxide film 808. The thickness of the alumina film 809 is thinner than the thickness of the silicon oxide film 808. For example, the thickness of the alumina film 809 is approximately half of the thickness of the silicon oxide film 808.

The thickness T1 of the gate insulating film 80 is thinner than the thickness T2 of the inter-layer insulating film 89.

For example, the thickness of the insulating film 80 is approximately 15 nm to 18 nm when the film is changed to the silicon oxide film.

The common selection gate transistor SGCT includes the memory film 79 as a portion of the gate insulating film.

Regarding the shape of the semiconductor pillar 75, dimensions on the lower end side (substrate side) of the semiconductor pillar 75 tends to be smaller than dimensions on the upper end side (bit line side) of the semiconductor pillar 75 in accordance with the number (height of stacked structure) of the conductive layers which are stacked. As a result, the semiconductor pillar 75 may have a tapered-shaped cross-sectional structure.

Figure 9:
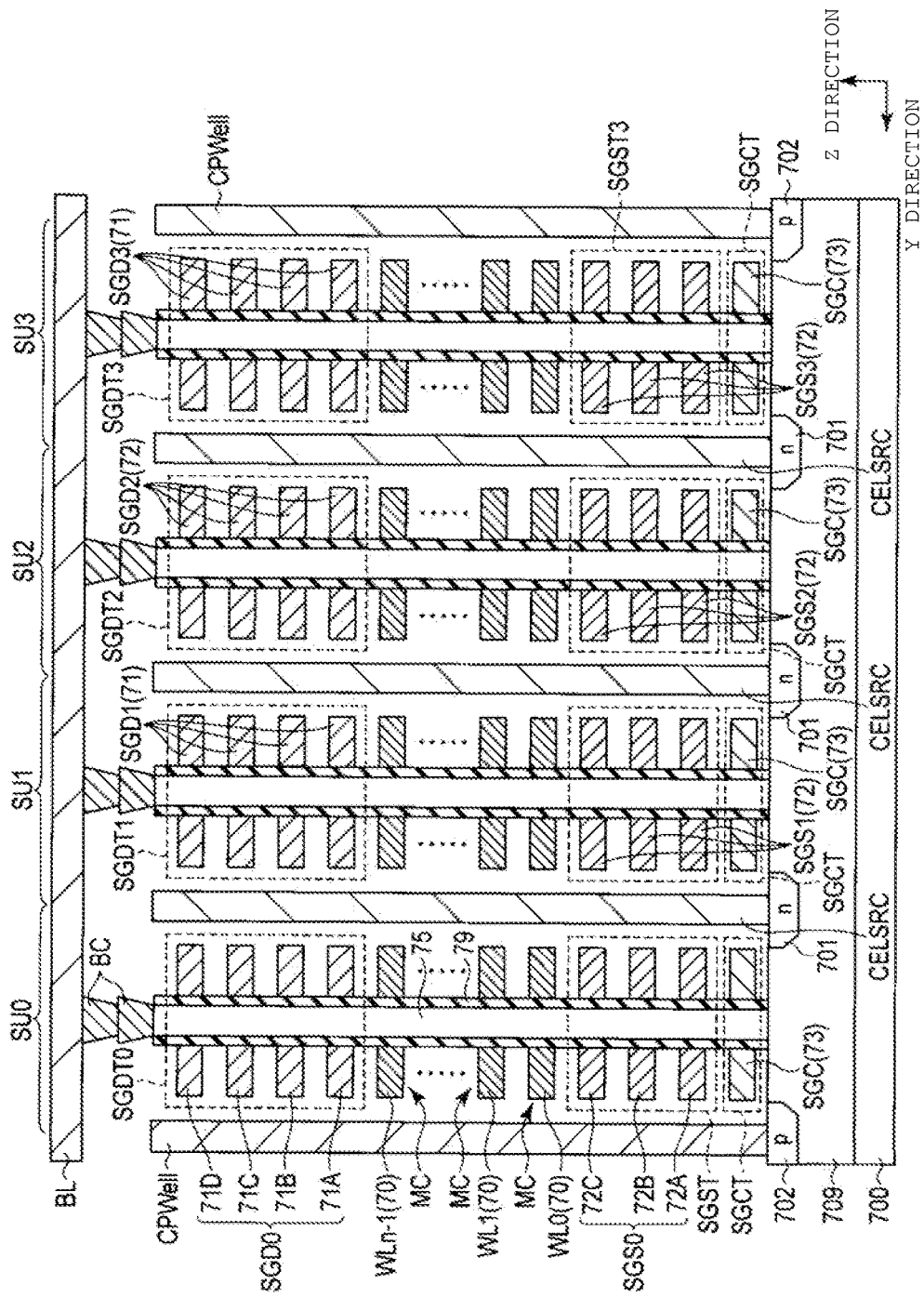
FIG. 9 is a schematic diagram illustrating a structural example of the semiconductor memory according to the first embodiment.
Figure 10:
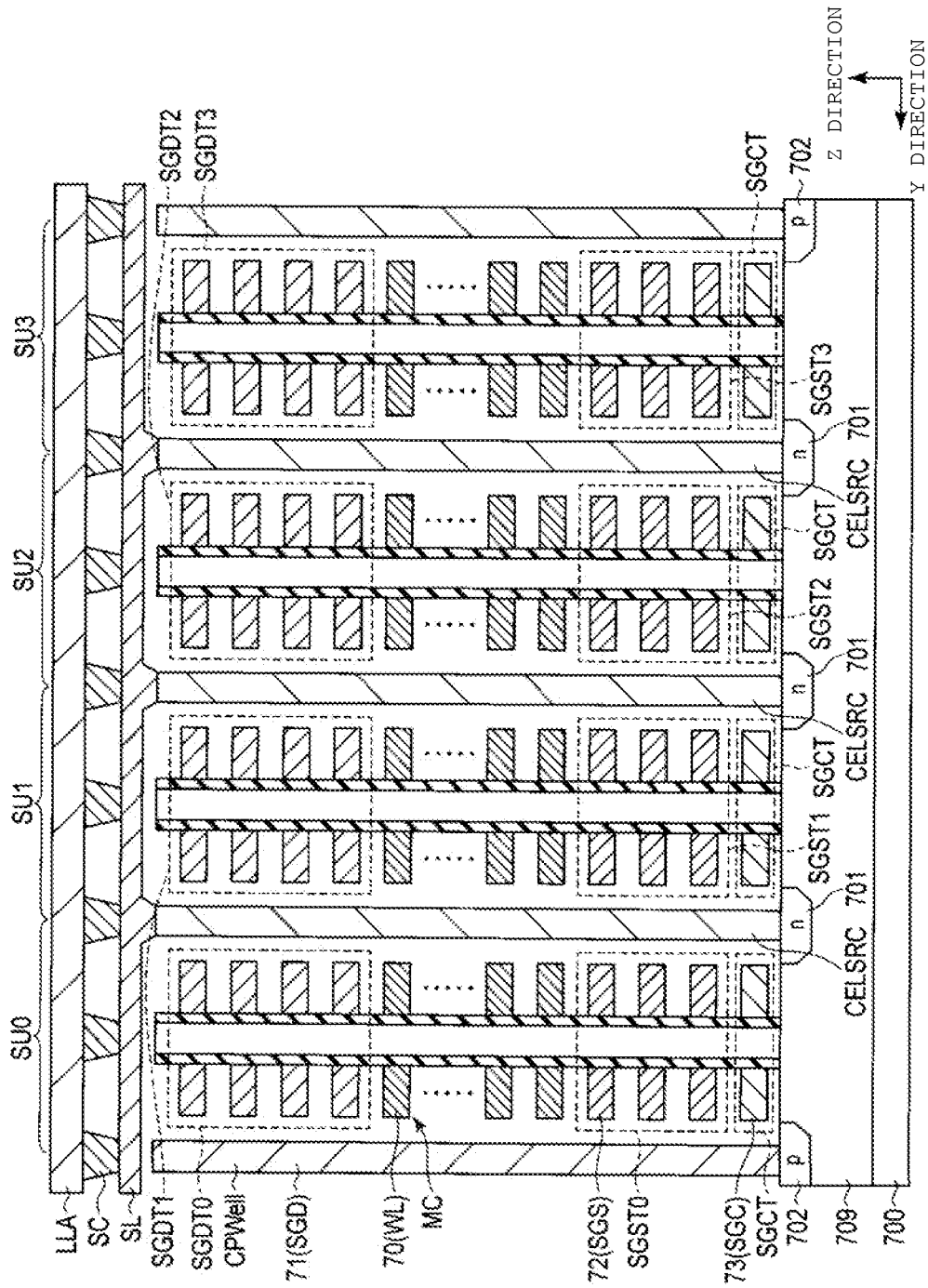
FIG. 10 is a schematic diagram illustrating a structural example of the semiconductor memory according to the first embodiment.

For example, in the structure of the NAND string illustrated in FIG. 9 to FIG. 11, the conductive layer 73 and the conductive layer 72A may be used in the common selection gate line SGC.

Figure 12:
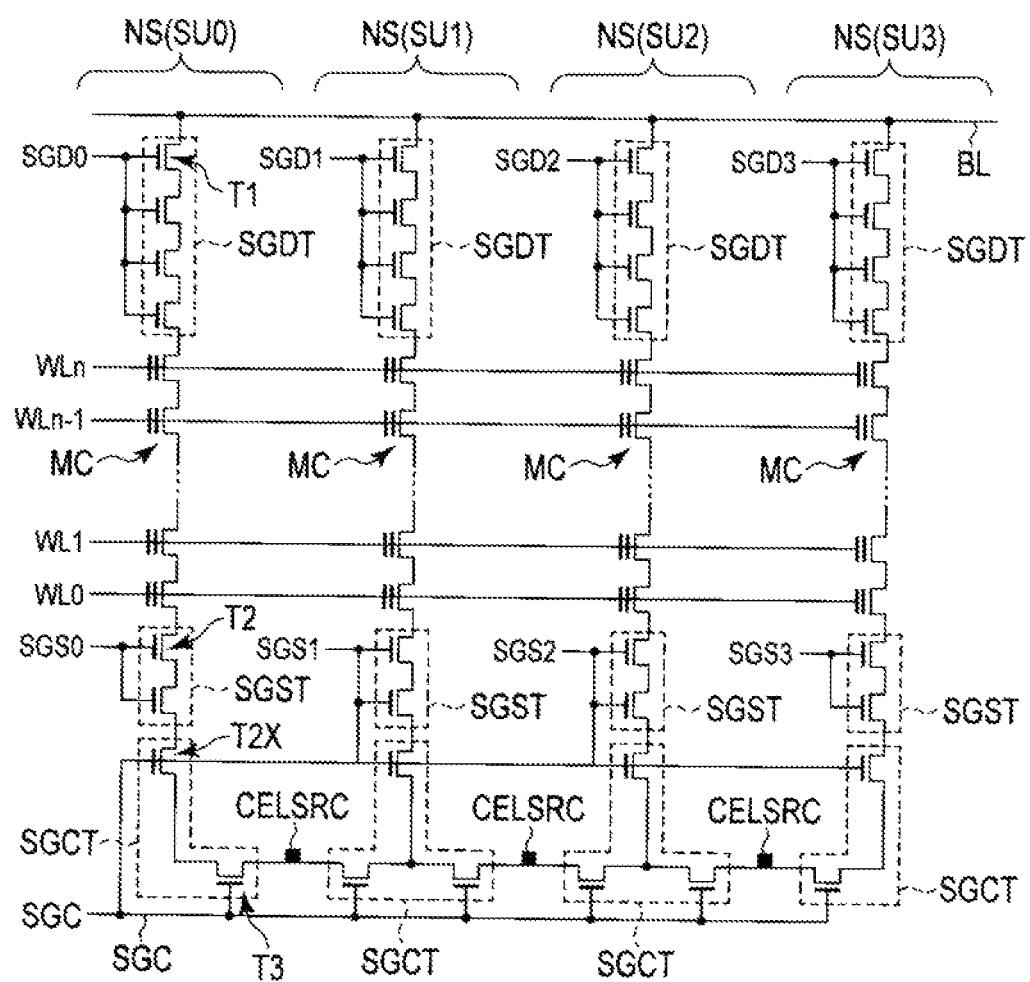
FIG. 12 is a diagram illustrating a modification example of the semiconductor memory according to the first embodiment.

When the common selection gate line SGC includes the two conductive layers 73 and 72A, the common selection gate transistor SGCT includes the transistor T3 which includes the conductive layer 73 as the gate electrode and a transistor T2X which includes the conductive layer 72A as the gate electrode, as with an equivalent circuit diagram of a modification example of the flash memory according to the embodiment illustrated in FIG. 12.

In this case, the conductive layers 72B and 72C are used as the source side selection gate line SGS and the gate electrode of the source side selection gate transistor SGST. The source line selection gate transistor SGST includes two transistors T2.

With the above-described configuration, in the embodiment, the memory controller 5 and the flash memory applies a voltage by which the common selection gate transistor SGCT turns ON to the common selection gate line SGC in the selected block when data in the flash memory is read.

Accordingly, the selected NAND string NS is electrically coupled with the multiple source line contacts CELSRC through the multiple channels formed in the semiconductor substrate 700.

(c) Operation Example

An operation example of the semiconductor memory according to the embodiment will be described with reference to FIG. 13 to FIG. 16. FIG. 1 to FIG. 12 are also appropriately used in order to describe the operation example of the semiconductor memory according to the embodiment.

(c-1) Writing Operation

An example of a writing operation in a three-dimensional structure NAND flash memory according to the embodiment will be described with reference to FIG. 13.

A description when a first string unit SU0 is selected among the multiple string units in the selected block BLK will be made.

The host device 600 transmits a writing command, data to be written, and an address (address of block and page) for writing the data to the storage device 500.

The memory controller 5 in the storage device 500 receives the data to be written and the address. The memory controller 5 outputs the data to be written and the address to the flash memory 1 according to the embodiment.

Circuits in the flash memory 1 drives the lines BL, WL, SGD, SGS, and SGC in the memory cell array under control of the memory controller 5.

The sense amplifier circuit 30 and the data latch circuit 35 transmit, to the bit line BL, a voltage in accordance with the data to be written.

The address decoder 203 of the selected block BLK supplies the selection signal BLKSEL of the H level to the selection switches WSW, DSW, SSW, and CSW. The address decoder 203 of the selected block BLK supplies the non-selection signal BLKSELn of the L level to the non-selection switches UDSW, USSW, and UCSW.

Accordingly, regarding the selected block BLK, the word line WL is electrically coupled with the CG line CG by the switch WSW in the ON state. The selection gate line SGD is electrically coupled with the lines SGDI and SGCI by the selection switches DSW and CSW in the ON state. The selection gate line SGS is electrically coupled with the lines SGSI and SGCI by the selection switches SSW and CSW in the ON state.

The address decoder 203 of the non-selected block BLK supplies the selection signal BLKSEL of the L level and the non-selection signal BLKSELn of the H level to the switch circuit 290.

Accordingly, regarding the non-selected block BLK, the word line WL is electrically isolated from the CG line CG and becomes a non-selection state. The selection gate lines SGD, SGS, and SGC of the non-selected block BLK are electrically coupled with the lines USGD, USGS, and USGC.

Figure 13:
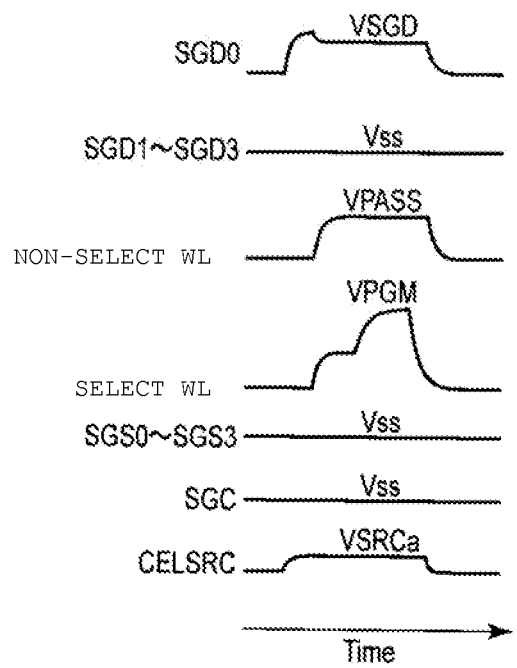
FIG. 13 is a view illustrating an operation example of the semiconductor memory according to the first embodiment.

As with a timing chart of voltages applied to the lines in the writing operation illustrated in FIG. 13, the word line/selection gate line driver 201 applies a voltage (drain side selection gate line selection voltage) VSGD to the drain side selection gate line SGD0 of the selected string unit SU0 through the line SGDI0 and the switch DSW0. The voltage VSGD of the drain side selection gate line SGD0 is approximately 2.4 V, for example. The word line/selection gate line driver 201 applies 0 V of a voltage (drain side selection gate line non-selection voltage) VSS to the drain side selection gate lines SGD1 to SGD3 of the non-selected string units SU1 to SU3 through the lines SGDI1 to SGDI3 and the switches DSW1 to DSW3.

Accordingly, the selection gate transistor SGDT connected to the drain side selection gate line SGD0 turns ON. On the other hand, the drain side selection gate transistor SGDT connected to the selection gate lines SGD1 to SGD3 turns OFF. With this, only the selection NAND string NS is connected to the bit line BL through the selection gate transistor SGDT in the ON state.

The source line/well control circuit 50 applies a voltage (source line voltage) VSRCa to the internal source line CELSRC at the substantially same timing as that of applying the voltage VSGD.

The word line/selection gate line driver 201 applies the voltage VSS to all of the source side selection gate lines SGS in the selected block BLK.

The common selection gate line driver 221 applies the voltage VSS from the voltage generation circuit 40 to the common selection gate line SGC. The voltage VSS is 0 V, for example.

Accordingly, the source side selection gate transistor SGST and the common selection gate transistor SGCT turn OFF. As a result, the NAND string NS and the source line SL in the block BLK are not electrically coupled with each other.

The voltage VSS is applied to the selection gate lines SGD, SDS, and SGC of the non-selected block BLK.

The word line/selection gate line driver 201 applies a non-selection voltage VPASS to the non-selected word line WL in the selected block BLK after the voltage VSGD is applied to the drain side selection gate line SGD0 and the source line CELSRC. The non-selection voltage VPASS is, for example, approximately 9 V when the writing operation is performed.

The word line/selection gate line driver 201 applies a voltage (for example, voltage VPASS) having the certain magnitude to the selected word line WL at the substantially same timing as that of applying the non-selection voltage VPASS. The word line/selection gate line driver 201 applies a program voltage VPGM to the selected word line WL subsequent to applying a certain voltage. The program voltage VPGM is, for example, approximately 20 V.

A threshold value of the selection cell is shifted to a value corresponding to data to be written by applying the program voltage VPGM.

The memory controller 5 executes reading for verification on the selection cell (selection page) and determines a threshold value of the selection cell after the program voltage VPGM is applied to the selected word line. With this, it is determined whether or not data to be written is written in the selection cell.

The memory controller 5 and the flash memory 1 repeatedly apply the program voltage VPGM and execute verification until the threshold value of the selection cell is shifted to a value corresponding to data to be written.

The memory controller 5 completes the writing operation of the flash memory 1 when the threshold value of the selection cell is determined to be in a range of the value corresponding to the data to be written.

If a voltage is applied to the drain side selection gate line SGD and the source line CELSRC before a voltage is applied to the word line, the voltage may be applied to the drain side selection gate line SGD at a timing different from a timing at which the voltage is applied to the source line CELSRC.

As described above, the writing operation of the flash memory including two source side selection gate lines which are electrically independent from each other is executed.

(c-2) Erasing Operation

Figure 14:
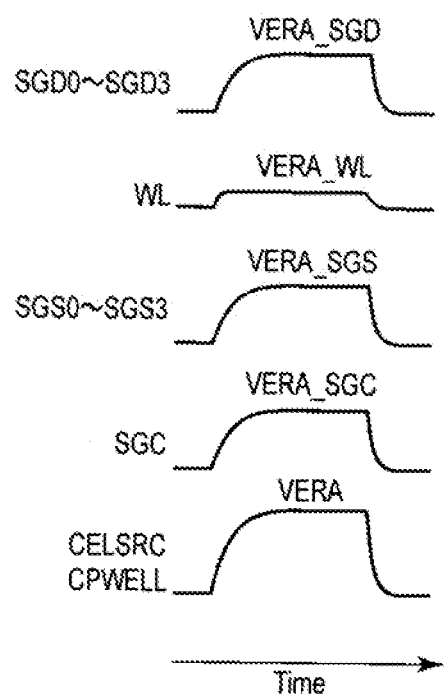
FIG. 14 is a view illustrating an operation example of the semiconductor memory according to the first embodiment.

An example of an erasing operation of the three-dimensional structure NAND flash memory according to the embodiment will be described with reference to FIG. 14. In the description of the erasing operation of the flash memory according to the embodiment, a description of an operation common with the writing operation of the above-described flash memory will be not repeated.

As with a timing chart of a voltage applied to the lines in the erasing operation illustrated in FIG. 14, the erasing operation of the flash memory according to the embodiment is executed as follows.

The memory controller 5 controls the erasing operation of the flash memory based on an erasing command and an address.

The memory controller 5 controls the circuit in the flash memory 1 and drives the lines WL, SGD, SGS, and SGC for the erasing operation of the selected block.

The word line/selection gate line driver 201 applies a voltage VERA_SGD to the drain side selection gate line SGD in the selected block BLK. The word line/selection gate line driver 201 applies a voltage VERA_SGS to the source side selection gate line SGS in the selected block BLK.

With this, the drain side selection gate transistor SGDT and the source side selection gate transistor SGST turn ON.

All of the NAND strings NS in the block BLK are electrically coupled with the bit line BL and the source line SL.

Control voltages VERA_SGD and VERA_SGS of the selection gate lines SGD and SGS have a value to extent that electrons are not emitted (or holes are not injected) from the memory film 79 of the selection gate transistors SGDT and SGST such that threshold values of the selection gate transistors SGDT and SGST including the memory film 79 does not vary due to the erasing operation on the memory cell MC.

The word line/selection gate line driver 201 applies a voltage VERA_WL to all of the word lines WL in the block BLK at the substantially same timing as a timing of applying a voltage to the selection gate lines SGD and SGS. The voltage VERA_WL is, for example, approximately 0.5 V.

The source line/well control circuit 50 applies an erasing voltage VERA to the source line SL, the source line contact CELSRC, the well contact CPWELL, and the P well region 709. The erasing voltage VERA is, for example, approximately 24 V.

In the embodiment, the common selection gate line driver 221 applies a voltage VERA_SGC to the common selection gate line SGC. The voltage VERA_SGC is lower than the voltage VERA. For example, the voltage VERA_SGC of the common selection gate line SGC is higher than the voltage VERA_SGS of the source side selection gate line SGS.

The erasing voltage VERA is applied to the semiconductor pillar 75 through the well region 709 by forming a channel in the substrate 700. Electrons in the memory film (charge accumulation layer) 79 are emitted to the inside of the semiconductor pillar 75 due to a potential difference between the word line WL and the semiconductor pillar 75. Additionally, holes in the semiconductor pillar 75 are injected into the memory film 79 due to a potential difference between the word line WL and the semiconductor pillar 75.

The voltage VERA_SGC of the common selection gate line SGC is controlled independently from the voltage VERA_SGS of the source side selection gate line SGS when the erasing operation is executed. Accordingly, a potential difference between the substrate 700 and the common selection gate line SGC and a potential difference between a lower portion of semiconductor pillar 75 and the common selection gate line SGC are reduced. Thus, an insulation breakdown of the gate insulating film 80 between the substrate 700 and the common selection gate line SGC (73) is prevented.

Fluctuation in the threshold value of the common selection gate transistor SGCT due to change of charges in the memory film is suppressed.

As a result, reliability in an operation of the common selection gate transistor SGCT is secured.

The voltage VERA_SGC of the common selection gate line SGC may be equal to or less than the voltage VERA_SGS of the source side selection gate line SGS. For example, a voltage the same as the voltage VERA_SGS may be applied to the common selection gate line SGC when the erasing operation is executed.

As described above, the erasing operation of the flash memory including two source side selection gate lines which are electrically independent from each other is executed.

(c-3) Reading Operation

A reading operation of the three-dimensional structure NAND flash memory according to the first embodiment will be described referring to FIG. 15 and FIG. 16.

The reading operation of the flash memory will be described when the string unit SU0 is selected among the multiple string unit in the selected block BLK.

The host device 600 transmits a reading command and an address to the memory controller 5 and requests for reading data.

The memory controller 5 controls an operation of the flash memory 1 based on the reading command.

The memory controller 5 controls the circuits in the flash memory 1 and drives the lines in the selected block and the non-selected block based on the reading command and the address.

The memory controller 5 and the internal control circuit 9 of the flash memory 1 drive the non-selected block as follows when the reading operation is executed.

The voltage generation circuit 40 generates various voltages applied to the non-selected block.

The decode signal BLKSELn of the H level causes the non-selection switches UDSW, USSW, and UCSW to turn ON in the switch circuit 290 corresponding to the non-selected block BLK. The selection gate lines SGD, SGS, and SGC in the non-selected block BLK are respectively connected to the lines USGDI, USGSI, and USGCI.

The word line/selection gate line driver 201 applies the voltage VSRC from the voltage generation circuit 40 to the drain side selection gate line SGD in the non-selected block BLK and the source side selection gate line SGS in the block BLK through the non-selection switches UDSW and USSW.

The non-selection voltage generation circuit 225 generates the non-selection voltage VSRC. As illustrated in a timing chart of voltages of the lines in the reading operation of FIG. 15, the non-selection voltage generation circuit 225 applies the non-selection voltage VSRC to the common selection gate line SGC in the non-selected block BLK through the non-selection switch UCSW.

The source line/well control circuit 50 applies the non-selection voltage VSRC to the source line SL and the source line contact CELSRC. The source line/well control circuit 50 applies the non-selection voltage VSRC to the P type well region 709 through the well line and the well contact CPWELL.

The 0 V of the voltage VSS may be applied to the selection gate lines SGD, SGS, and SGC in the non-selected block BLK, instead of the non-selection voltage VSRC, when the reading operation of the flash memory 1 is executed. The memory controller 5 determines which voltage of the two voltages VSS and VSRC is applied to the selection gate lines SGD, SGS, and SGC in the non-selected block BLK, based on information (setting parameter) stored in a fuse ROM in a chip of the flash memory.

The memory controller 5 and the internal control circuit 9 of the flash memory 1 drive the lines in the selected block BLK as follows.

The sense amplifier circuit 30 charges the bit line BL. The voltage generation circuit 40 generates multiple voltages applied to the lines in the selected block BLK.

Figure 15:
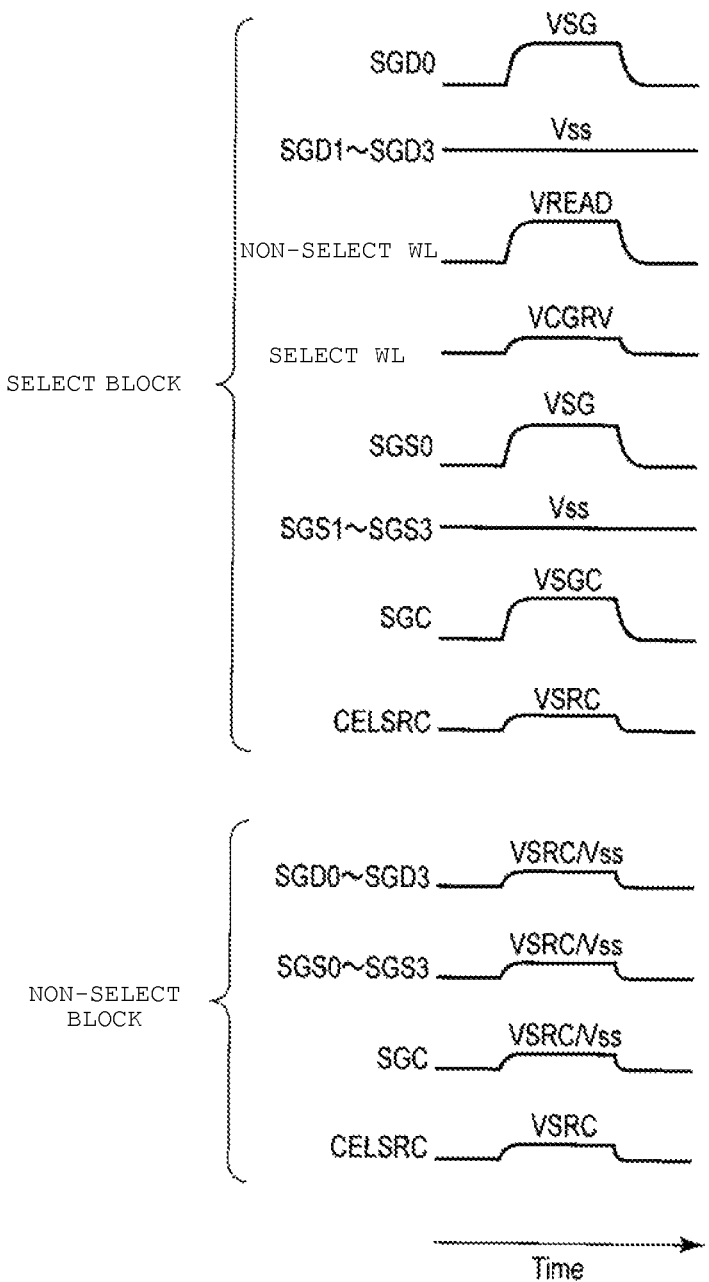
FIG. 15 is a view illustrating an operation example of the semiconductor memory according to the first embodiment.

As illustrated in FIG. 15, the source line/well control circuit 50 applies the voltage (source line voltage) VSRC to the source line SL in the selected block BLK. As a result, the voltage VSRC is applied to the source line contact CELSRC in the selected block BLK. The control voltage VSRC is, for example, approximately 0.5 V.

The decode signal BLKSEL of the H level causes the selection switches DSW, SSW, and CSW to turn ON in the switch circuit 290 corresponding to the selected block BLK.

The selection gate lines SGD, SGS, and SGC are respectively connected to the lines SGDI, SGSI, and SGCI in the selected block BLK.

The word line/selection gate line driver 201 applies a voltage Vss to the non-selection drain side selection gate lines SGD1 to SGD3 and the non-selection source side selection gate lines SGS1 to SGS3 in the selected block BLK.

The word line selection gate line driver 201 applies a voltage VSG to the drain side selection gate line SGD0 of the selected string unit SU0 through the selection switch DSW0. With this, the drain side selection gate transistor SGDT turns ON. A channel is generated at a position of the drain side selection gate transistor SGDT in the semiconductor pillar 75.

The word line/selection gate line driver 201 applies the voltage VSG to the source side selection gate line SGS0 in the selected string unit SU0 through the selection switch SSW0. With this, the source side selection gate transistor SGST of the selected string unit SU0 turns ON. A channel is generated at a position of the source side selection gate transistor SGST in the semiconductor pillar 75.

The voltage VSG applied to the drain side selection gate line SGD and the source side selection gate line SGS is, for example, approximately 6 V.

The word line/selection gate line driver 201 applies a non-selection voltage VREAD to the non-selected word line WL in the selected block BLK through the selection switch WSW. The non-selection voltage VREAD is, for example, approximately 7 V.

The word line/selection gate line driver 201 applies a selection voltage (determination voltage) VCGRV to the selected word line WL through the selection switch WSW. The selection voltage VCGRV is, for example, approximately 0.5 V. The selection voltage VCGRV has multiple values prepared in accordance with the number of bits able to be stored in the memory cell MC.

The memory controller 5 and the internal control circuit 9 drive the common selection gate line control circuit 202 in order to control the common selection gate line SGC in the embodiment. The common selection gate line driver 221 applies a voltage VSGC from the selection voltage generation circuit 220 (or circuit 40) to the common selection gate line SGC in the selected block BLK. The voltage VSGC causes the selection gate transistor SGCT connected to the common selection gate line SGC to turn ON. Accordingly, there is a region having a size to the extent that a channel is generated, in the semiconductor substrate 700 (P type well region) below the common selection gate line (gate electrode of selection gate transistor) SGC. The voltage VSGC is, for example, approximately 6 V.

The voltage VSGC applied to the common selection gate line SGC may be equal to the control voltage VSG of the drain side selection gate line SGD and the source side selection gate line SGS in the selected storing unit, in accordance with characteristics of the common selection gate transistor SGCT if a channel 900 is generated with a size to the extent of being formed in the substrate 700. In addition, the voltage VSGC may be different from the control voltage VSG.

Applying of the voltage VSGC causes the common selection gate transistor SGCT to turn ON in the multiple string units SU of the selected block BLK.

Figure 16:
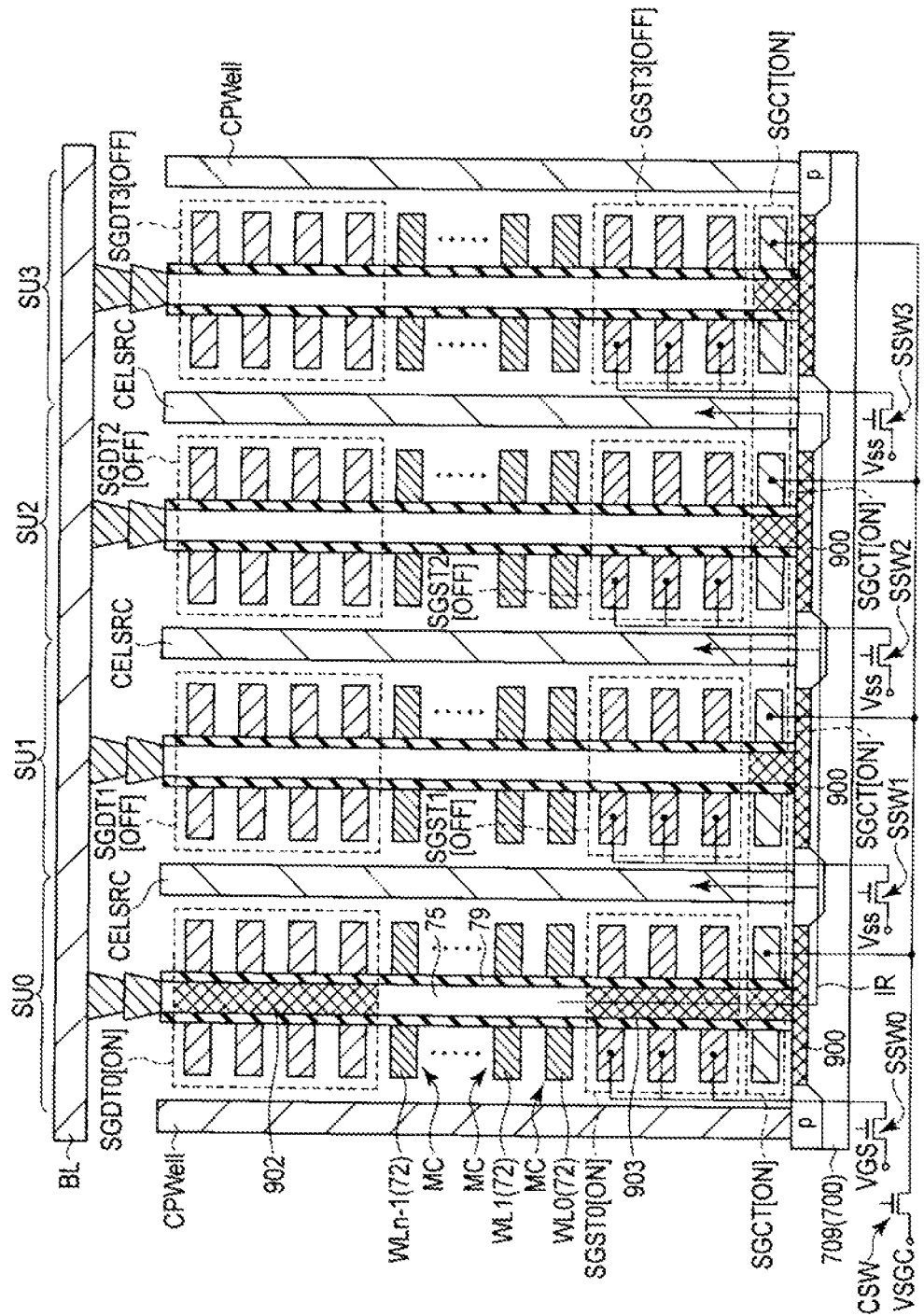
FIG. 16 is a diagram illustrating an operation example of the semiconductor memory according to the first embodiment.

As illustrated in FIG. 16, the channel 900 is generated in the semiconductor substrate 700 below the common selection gate transistor SGCT of the selected block BLK if a voltage is applied to the common selection gate line SGC of the flash memory according to the embodiment when data is read. A channel 901 is generated in the semiconductor pillar 75 facing the gate electrode 73 by the common selection gate transistor SGCT in the ON state.

Channels 902 and 903 are generated in the semiconductor pillar 75 by the selection gate transistors SGDT and SGST in the ON state.

A channel region (semiconductor pillar 75) of the selection cell MC is electrically coupled with the bit line BL and the source line SL by the selection gate transistors SGDT, SGST, and SGCT turning ON in the selected string unit SU0.

The drain side selection gate transistor SGDT and the source side selection gate transistor SGST of the non-selected string unit are in the OFF state. The source line contact CELSRC and the semiconductor pillar 75 of the non-selection NAND string NS are not electrically coupled with each other by the source side selection gate transistor SGST in the OFF state in the non-selected string unit even though the common selection gate transistor SGCT is in the ON state.

A reading voltage VCGR is applied to the word lines WL of the non-selected string units SU1 to SU3 in the selected block BLK when the multiple string units SU are connected to the common word lines WL. However, the selection gate transistors SGDT and SGST of the non-selected string units SU1 to SU3 are in the OFF state by the 0 V of the voltage. The non-selected string units SU1 to SU3 are not connected to the bit line BL and the source line SL.

The selection cell MC turns ON or OFF in accordance with the selection voltage VCGRV and a threshold value state of the selection cell MC.

When the threshold value of the selection cell MC is equal to or less than the selection voltage VCGRV, the selection cell turns ON. Accordingly, the bit line BL is connected to the substrate 700 and the source line contact CELSRC and the bit line BL becomes discharged. As illustrated in FIG. 16, the selected string unit SU0 is electrically coupled with the multiple source line contacts CELSRC through the channel 900 generated by the common selection gate transistor SGCT in the selected string unit SU0 and the channel 900 generated by the common selection gate transistor SGCT of the non-selected string units SU1 to SU3. A cell current IR flows from the bit line BL toward the multiple source line contacts CELSRC through the selection cell MC in the ON state.

When the threshold value of the selection cell MC is more than the selection voltage VCGR, the selection cell MC turns OFF. The bit line BL is cut off from the substrate 700 and the source line contact CELSRC by the selection cell MC in the OFF state, and a charging state of the bit line BL is held.

The sense amplifier circuit 30 detects a potential (charging state/discharging state) of the bit line BL. The detection result as data in the selection cell MC (data in the selection page) is output to the data latch circuit 35.

The memory controller 5 reads data in the data latch circuit 35 out of the inside of the memory controller 5 through the data input/output buffer 65. The memory controller 5 transmits the data read from the flash memory 1 to the host device 600.

As described above, reading of data from the selection cell MC is executed in the flash memory according to the embodiment.

When data is read, the magnitude of the voltage VSGC applied to the common selection gate line SGC may be adjusted in accordance with a position of the selected word line in the Z direction.

As described above, regarding a dimension (for example, diameter) of the semiconductor pillar in a direction parallel with the surface of the substrate, the diameter of the semiconductor pillar on the bit line BL side is smaller than the semiconductor pillar on the substrate side. For this reason, the magnitude of a cell current of the memory cell positioned on the bit line side may be different from the magnitude of a cell current of the memory cell on the substrate side.

For example, the magnitude of a voltage VSGCA when n/2 word lines WL0 to WLx−1 on the substrate side are selected among n word lines is different from the magnitude of a voltage VSGCB when n/2 word lines WLx to WLn−1 on the bit line side are selected among the n word lines, when data of the flash memory according to the embodiment is read.

In setting of the voltages VSGCA and VSGCB, the memory controller 5 and the flash memory 1 apply the voltage VSGCA to the common selection gate line SGC when data is read from the word lines WLx to WLn−1 on the bit line side. On the other hand, the memory controller 5 and the internal control circuit 9 apply the voltage VSGCB obtained by adding an offset value to the voltage VSGCA to the common selection gate line SGC when data is read from the word lines word line WL0 to WLx−1 on the substrate side. The offset value of the voltages VSGCA and VSGCB may be a positive value or a negative value.

Reading of data in the flash memory illustrated in FIG. 15 and FIG. 16 may also be applied to a case in which data is read for verification when the writing operation is executed in addition to a case in which data requested from the outside is read.

As illustrated in FIG. 15 and FIG. 16, in the flash memory according to the embodiment, the channel region (semiconductor pillar) 75 of the memory cell MC is cut off from the bit line BL, the semiconductor substrate 700, and the source line SL in the non-selected string unit SU (non-selection NAND string) by the drain side selection gate transistor SGDT and the source side selection gate transistor SGST in the OFF state. For this reason, a potential of the channel region in the memory cell MC increases by coupling the word line WL and the channel region (semiconductor pillar 75).

Even though the common selection gate transistor SGCT of the non-selected string unit SU turns ON as a result of increasing, an electric field is not generated between the word line WL and the channel region 75 or an electric field to be generated is small.

Accordingly, in the flash memory according to the embodiment, it is possible to reduce occurrence of reading disturbance in the non-selected string unit (NAND string).

The voltage VSGC is applied to the common selection gate lines SGC of the selected string unit SU and the non-selected string unit SU in the selected block BLK of the flash memory according to the embodiment by control of the memory controller 5 and the internal control circuit.

Accordingly, the common selection gate transistors SGCT of the selected string unit SU and the non-selected string unit SU turn ON. The channel 900 is generated in the entirety of the semiconductor substrate 700 in the selected block.

When data is read, the cell current IR in the selected string unit SU0 (selection NAND string) flows in the source line contact CELSRC between the selected string unit SU0 and the non-selected string unit SU1 which are adjacent to each other, and flows in the source line contact CELSRC between the non-selected string units SU1 to SU3 through the channel 900 in the substrate 700 below the non-selected string units SU1 to SU3.

In other words, the selected string unit SU0 is electrically coupled with all of the source line contacts CELSRC in the block BLK. A cell current of the selected string unit SU0 is divided to flow in all of the source line contacts CELSRC.

A cell current flowing in each of the source line contacts CELSRC is reduced in the multiple source line contacts CELSRC in the block BLK of the flash memory 1 according to the embodiment, compared to when only one source line contact CELSRC is connected to the selected string unit SU0.

In the flash memory according to the embodiment, a voltage drop in the source line contact CELSRC becomes small even though a resistance value of the source line contact CELSRC is high. Accordingly, in the flash memory according to the embodiment, when data is read, it is possible to prevent shift of a gate-source voltage of the selection cell from a desired value due to shift of a potential of the source line contact CELSRC from a preset value and to prevent widening of a threshold value distribution of the memory cell.

As a result, it is possible for the flash memory according to the embodiment to secure reliability in an operation of the flash memory.

In the flash memory according to the embodiment, an amount of a current supplied to a plug SP for connecting the shunt line LL and the source line SL decreases. As a result, it is possible to reduce deterioration of the source line contact CELSRC and a shunt section due to an excessive cell current such as electro-migration in the source line contact CELSRC and fusing of the source line contact CELSRC and the shunt section in the flash memory of the embodiment.

It is possible to widen a distance between the shunts in the flash memory of the embodiment by reducing an amount of a current flowing in the source line contact CELSRC. As a result, it is possible to reduce the chip size of the flash memory and to reduce chip cost in the flash memory according to the embodiment.

As described above, according to the embodiment, it is possible to provide a flash memory having a high reliability with low cost.

(2) Second Embodiment

A semiconductor memory (for example, three-dimensional structure NAND flash memory) according to a second embodiment will be described referring to FIG. 17 to FIG. 20.

Figure 17:
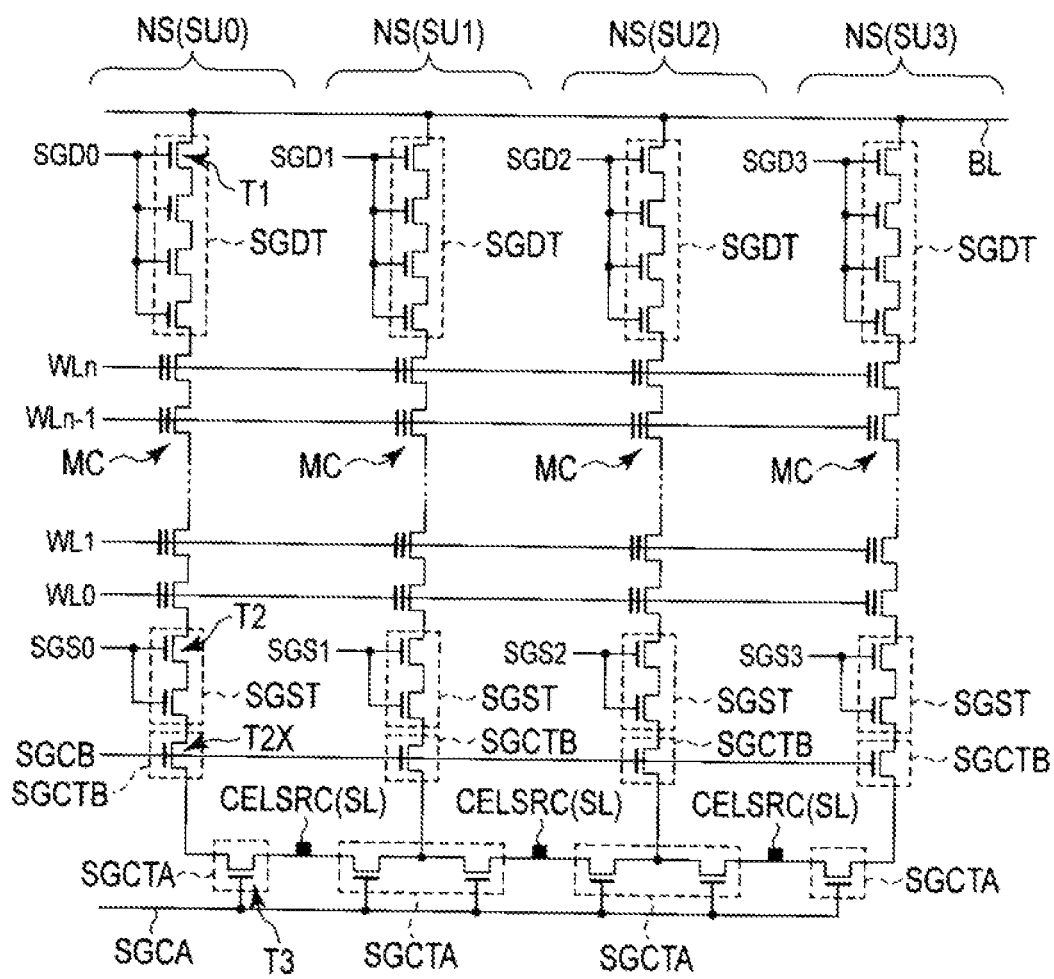
FIG. 17 is a diagram illustrating a configuration example of a semiconductor memory according to a second embodiment.

As illustrated in FIG. 17, the NAND flash memory 1 having a three-dimensional structure according to the embodiment includes multiple common selection gate lines SGCA and SGCB.

Multiple common selection gate transistors SGCTA and SGCTB are respectively connected to the multiple common selection gate lines SGCA and SGCB.

Figure 18:
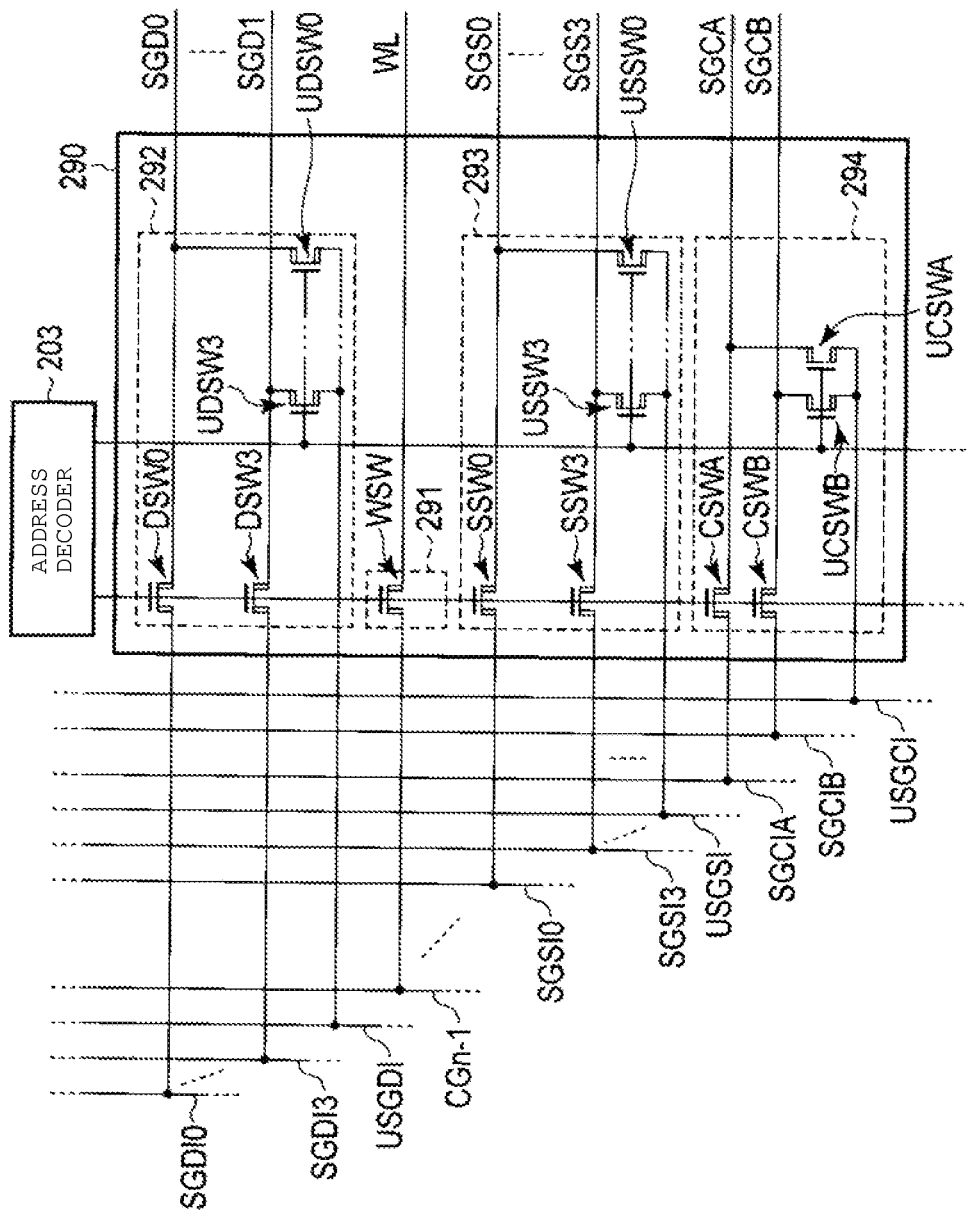
FIG. 18 is a diagram illustrating a configuration example of the semiconductor memory according to the second embodiment.

As illustrated in FIG. 18, a common selection gate line switch unit 294A includes two selection switches CSWA and CSWB respectively corresponding to the two common selection gate lines SGCA and SGCB.

One ends of the switches CSWA and CSWB are respectively connected to the common selection gate lines SGCA and SGCB. Another ends of the switches CSWA and CSWB are respectively connected to lines SGCIA and SGCIB. Control terminals of the switches CSWA and CSWB are connected to the selection signal line of the address decoder 203. The two lines SGCIA and SGCIB are connected to the common selection gate line driver 221.

The switch unit 294 includes non-selection switches UCSWA and UCSWB.

One ends of the switches UCSWA and UCSWB are respectively connected to the common selection gate lines SGCA and SGCB. Another ends of the switches UCSWA and UCSWB are connected to the line USGCA and the non-selection voltage generation circuit 225. Control terminals of the switches UCSWA and UCSWB are connected to the non-selection signal line of the address decoder 203.

Regarding a structure of the flash memory according to the second embodiment, the conductive layer 73 is used as the first common selection gate line SGCA among the multiple conductive layers in the FIG. 10 and FIG. 11. The conductive layer 73 refers to the first common selection gate line (hereinafter, also referred to as a lower side common selection gate line) SGCA and is commonly used as a gate electrode of the common selection gate transistor SGCTA in the transistor SGCTA.

The conductive layer 72A is used as the second common selection gate line (hereinafter, also referred to as an upper side common selection gate line) SGCB and a gate electrode of the second common selection gate transistor SGCTB. The second common selection gate line SGCB is commonly connected to the multiple (all) second common selection gate transistors SGCTB in the block BLK.

The second common selection gate transistor SGCTB has a channel region in only the semiconductor pillar 75 differently from the first common selection gate transistor SGCTA.

The first and the second common selection gate lines SGCA and SGCB are connected to a power source (e.g., voltage source, power source terminal) different from each other. Accordingly, it is possible to control gate voltages of the first and the second common selection gate transistors SGCTA and SGCTB independently from each other.

An operation of the three-dimensional structure flash memory according to the second embodiment will be described using FIG. 19 and FIG. 20.

Figure 19:
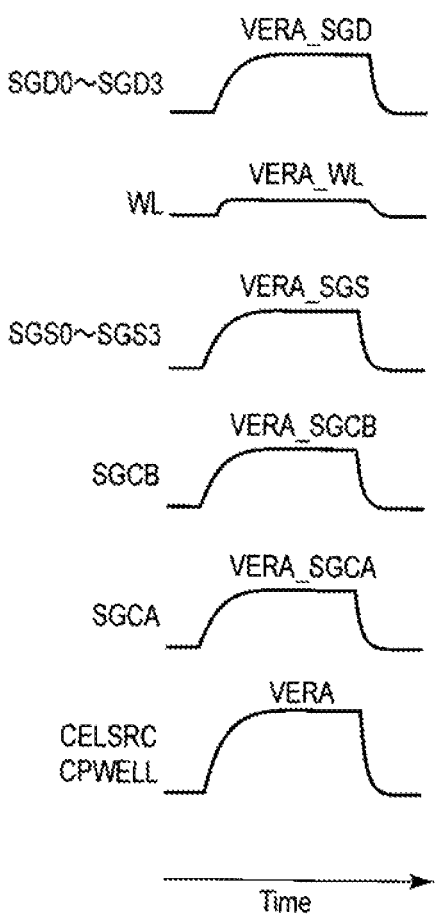
FIG. 19 is a view illustrating an operation example of the semiconductor memory according to the second embodiment.

As with a timing chart of voltages applied to the lines in the erasing operation illustrated in FIG. 19, the common selection gate line driver 221 applies a voltage VERA_SGCA to the lower side common selection gate line SGCA and applies a voltage VERA_SGCB to the upper side common selection gate line SGC1 in the erasing operation of the flash memory according to the embodiment. For example, the voltage VERA_SGCA is higher than the voltage VERA_SGCB.

Accordingly, it is possible to suppress breakdown of the gate insulating film 80 when the erasing operation is executed, in the flash memory according to the embodiment.

Figure 20:
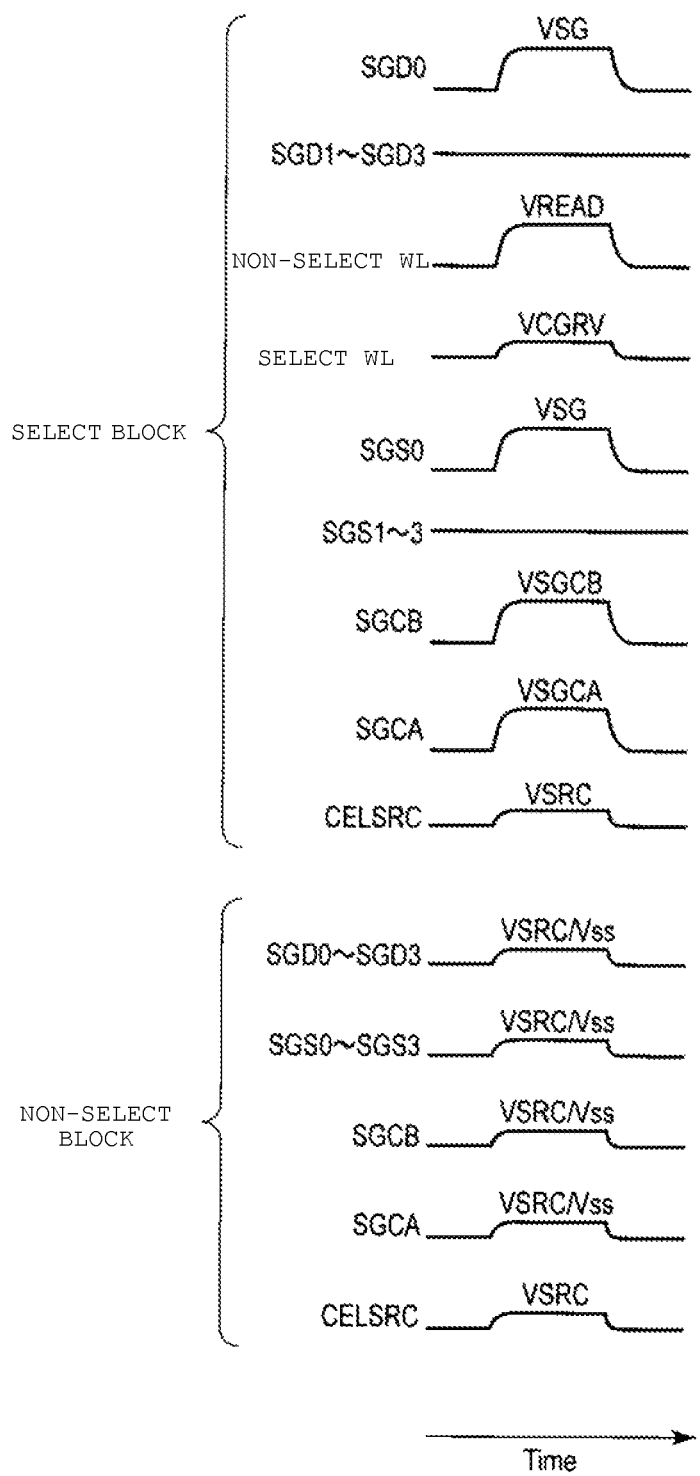
FIG. 20 is a view illustrating an operation example of the semiconductor memory according to the second embodiment.

As with a timing chart of voltages applied to the lines in the reading operation illustrated in FIG. 20, the reading operation of the flash memory according to the embodiment is different from that of the first embodiment in that voltages are independently applied to the two common selection gate lines SGCA and SGCB.

The common selection gate line driver 221 applies a voltage VSGCA to the lower side common selection gate line SGCA through the switch CSWA in the ON state. The common selection gate line driver 221 applies a voltage VSGCB to the upper side common selection gate line SGCB at the substantially same timing as a timing of applying the voltage VSGCA through the switch CSWB in the ON state.

For example, it is preferable that the voltage VSGA applied to the common selection gate line SGCA be higher than the voltage VSGB applied to the common selection gate line SGCB in order to form a channel in the substrate 700 and to transmit a cell current.

The non-selection voltage generation circuit 225 applies the voltage VSRC (or voltage Vss) to both of the common selection gate lines SGCA and SGCB in the non-selected block BLK when data is read.

Accordingly, similarly to the first embodiment, the selected NAND string NS is connected to the multiple source line contact CELSRC through multiple channels in the substrate 700.

A writing operation of the three-dimensional structure NAND flash memory according to the embodiment is substantially the same as that of the first embodiment. In the embodiment, the common selection gate line driver 221 applies the voltage VSS to two common selection gate lines SGC0 and SGC1 which is driven independently when the writing operation is executed.

As described above, according to the second embodiment, it is possible to provide a flash memory having high reliability with low cost.

(3) Third Embodiment

A semiconductor memory (for example, three-dimensional structure flash memory) according to a third embodiment will be described referring to FIG. 21 to FIG. 25.

Figure 21:
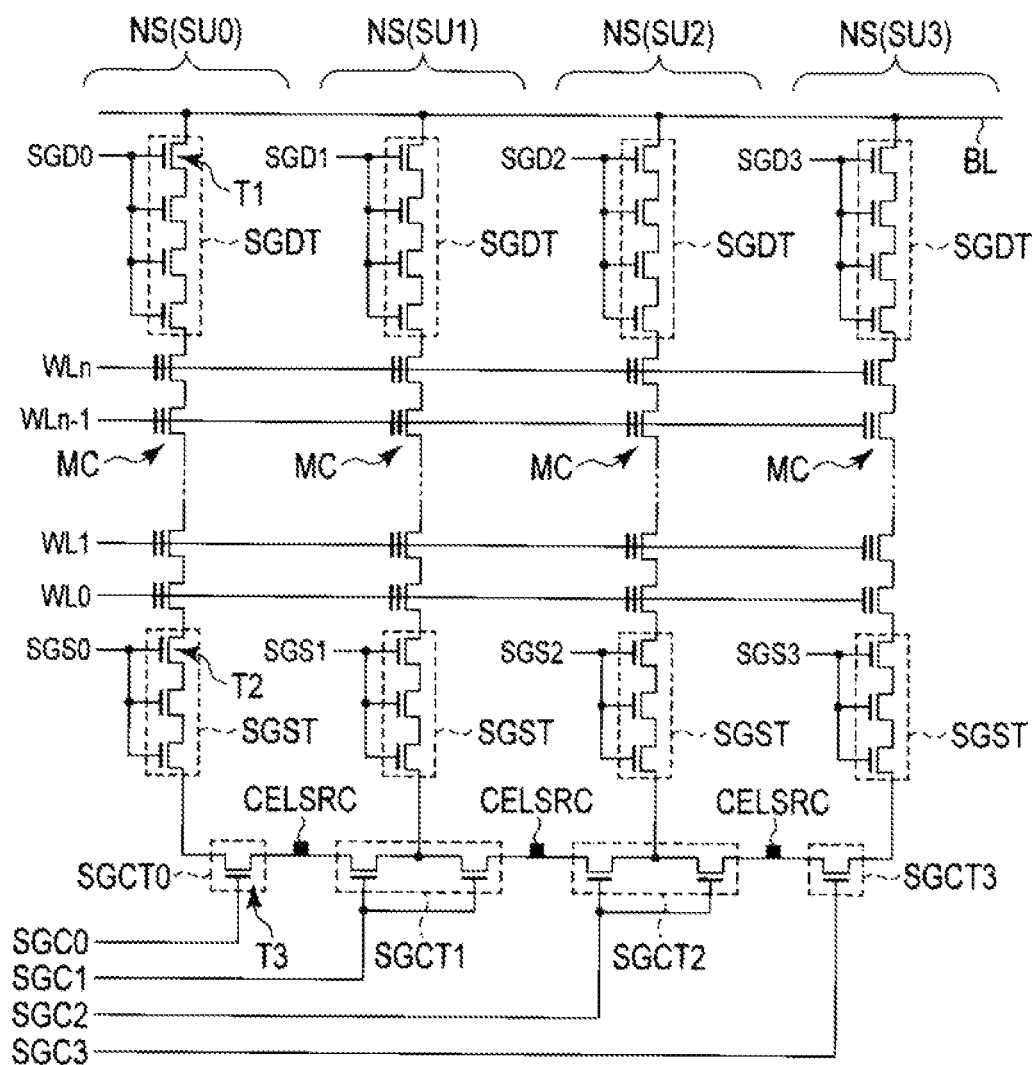
FIG. 21 is a diagram illustrating a configuration example of a semiconductor memory according to a third embodiment.

As illustrated in FIG. 21, the NAND flash memory having a three-dimensional structure according to the embodiment includes independent common selection gate lines SGC0, SGC1, SGC2, and SGC3 for each string unit SU.

When the block BLK includes four string units SU, the block BLK includes four common selection gate lines SGC.

The common selection gate transistors SGCT0 to SGCT3 are respectively connected to the common selection gate lines SGC0 to SGC3. The common selection gate transistors SGCT0 to SGCT3 may be driven independently for the string units SU0 to SU3.

Figure 22:
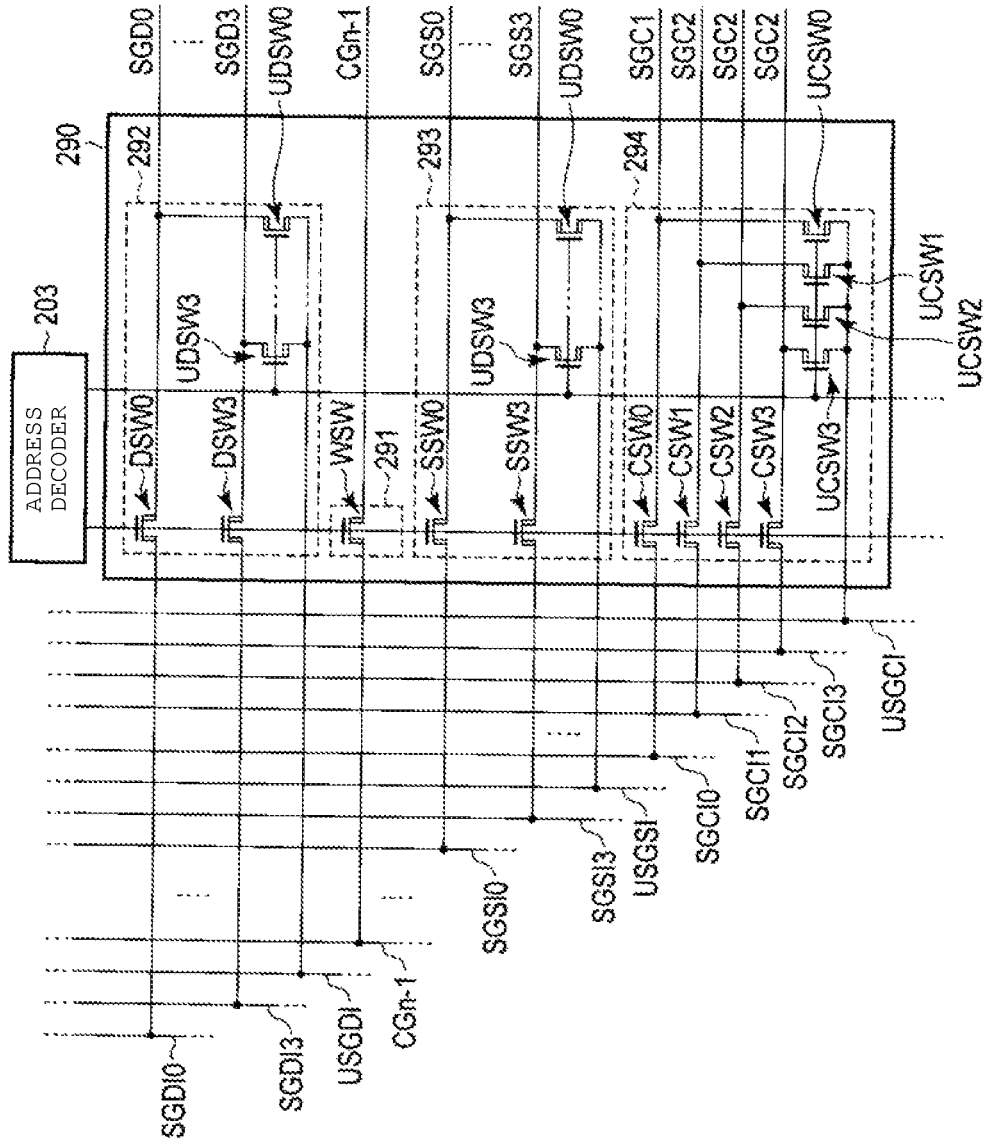
FIG. 22 is a diagram illustrating a configuration example of the semiconductor memory according to the third embodiment.

As illustrated in FIG. 22, the switch unit 294 of the switch circuit 290 includes four selection switches CSW. The four selection switches CSW0 to CSW3 respectively correspond to the four common selection gate lines SGC0 to SGC3.

One ends of the switches CSW0 to CSW3 are connected to the common selection gate lines SGC0 to SGC3. Another ends of the switches CSW0 to CSW3 are connected to lines SGCI0 to SGCI3. Four lines SGCI are connected to the common selection gate line driver 221.

The switch unit 294 includes four non-selection switches UCSW. One ends of the non-selection switches UCSW0 to UCSW3 are respectively connected to the common selection gate lines SGC0 to SGC3. Another ends of the non-selection switches UCSW are respectively connected to the lines USGCI.

The common selection gate line driver 221 may control the common selection gate lines SGC0 to SGC3 independently.

In the embodiment, the conductive layers as the common selection gate lines SGC are separated from each other in the block BLK, similarly to the source side selection gate lines SGS.

Figure 23:
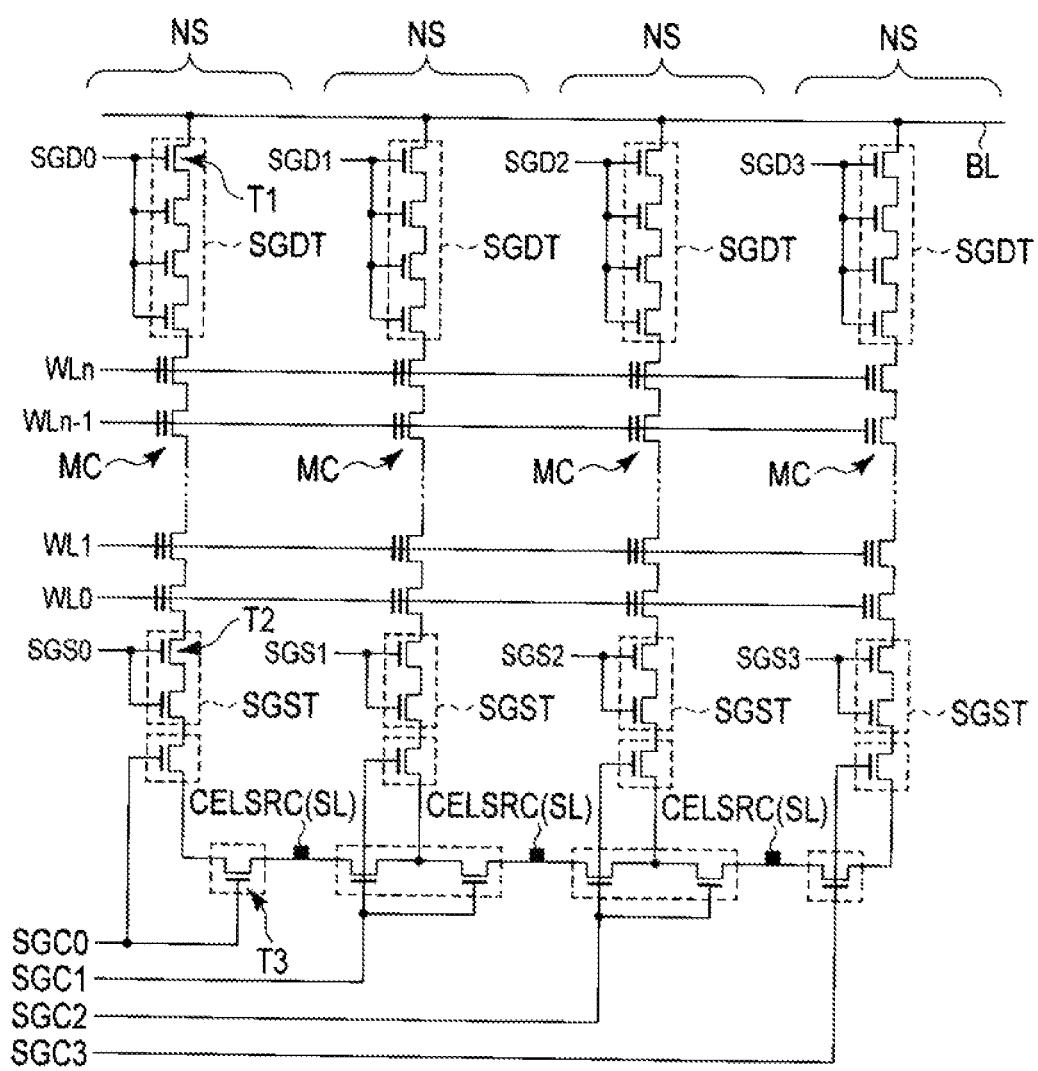
FIG. 23 is a diagram illustrating a configuration example of the semiconductor memory according to the third embodiment.

As illustrated in FIG. 23, similarly to the example illustrated in FIG. 13, the common selection gate lines SGC0 to SGC3 may include the two conductive layers 73 and 72A which are stacked thereon. In this case, the common selection gate transistors SGCT0 to SGCT3 include the transistor T3 on the substrate 700 and the transistor T2X on the side surface of the semiconductor pillar 75.

A reading operation of the three-dimensional structure NAND flash memory according to the third embodiment will be described referring to FIG. 24.

Figure 24:
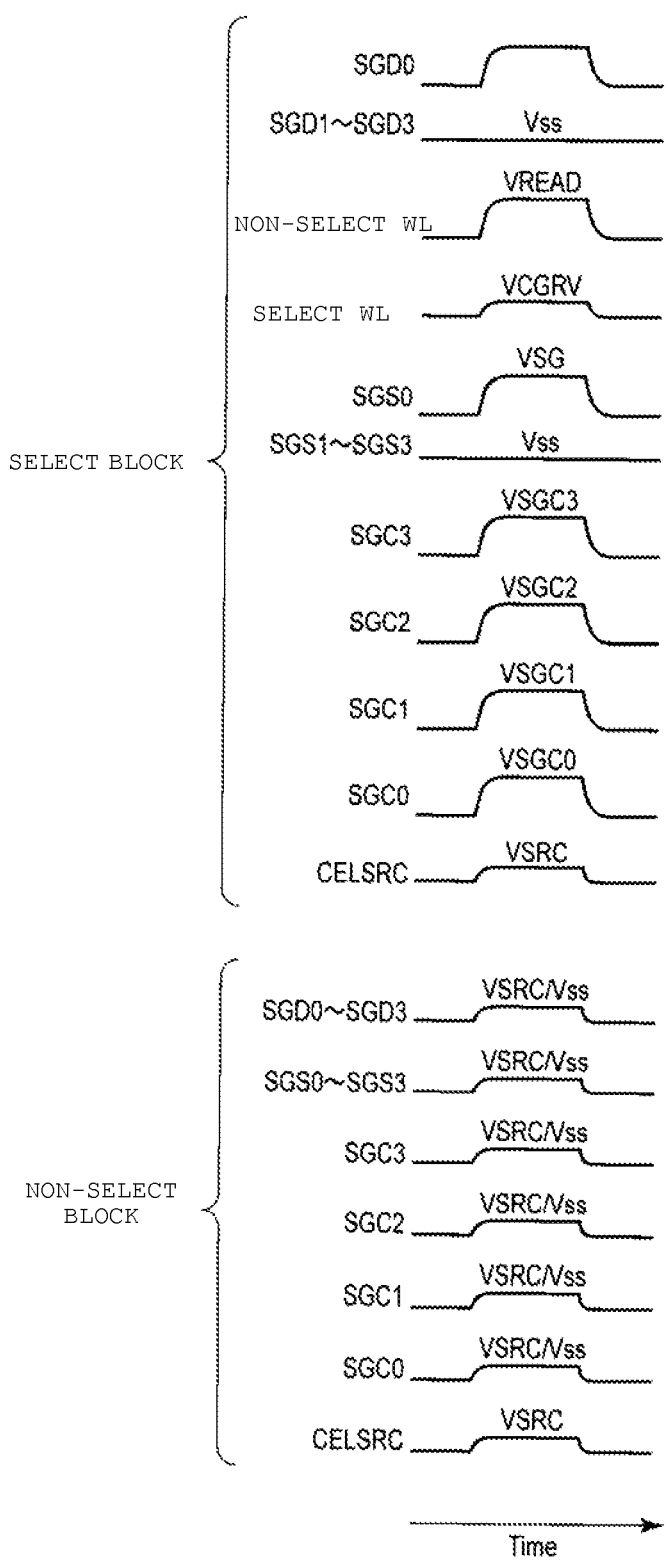
FIG. 24 is a view illustrating an operation example of the semiconductor memory according to the third embodiment.

As with a timing chart of voltages applied to the lines in the reading operation illustrated in FIG. 24, for example, the common selection gate line driver 221 applies voltages VSGC0 to VSGC3 to the independent common selection gate lines SGC0 to SGC3 at substantially the same timing through the switch CSW0 to CSW3 in the ON state.

Thus, in the flash memory according to the embodiment, a channel is generated in the semiconductor substrate 700 below the common selection gate line SGC such that the selection NAND string NS is electrically coupled with the multiple common selection gate line even though the common selection gate lines SGC0 to SGC3 are independent, similarly to the example illustrated in FIG. 16.

In the embodiment, the selection gate lines SGC0 to SGC3 are provided independently for the string units SU0 to SU3. For this reason, voltage having the magnitude different from each other may be applied to the selection gate lines SGC0 to SGC3 of the string units SU0 to SU3. It is possible to change an applied voltage to the selection gate lines SGC depending on a position (address) of the selected string unit on the substrate.

For example, as illustrated in FIG. 16, when the string unit SU0 is selected, a channel of the common selection gate transistor SGCT3 of the string unit SU3 hardly contributes to distribute a cell current from the string unit SU0 and to reduce resistance between the substrate and the source line contact.

Figure 25:
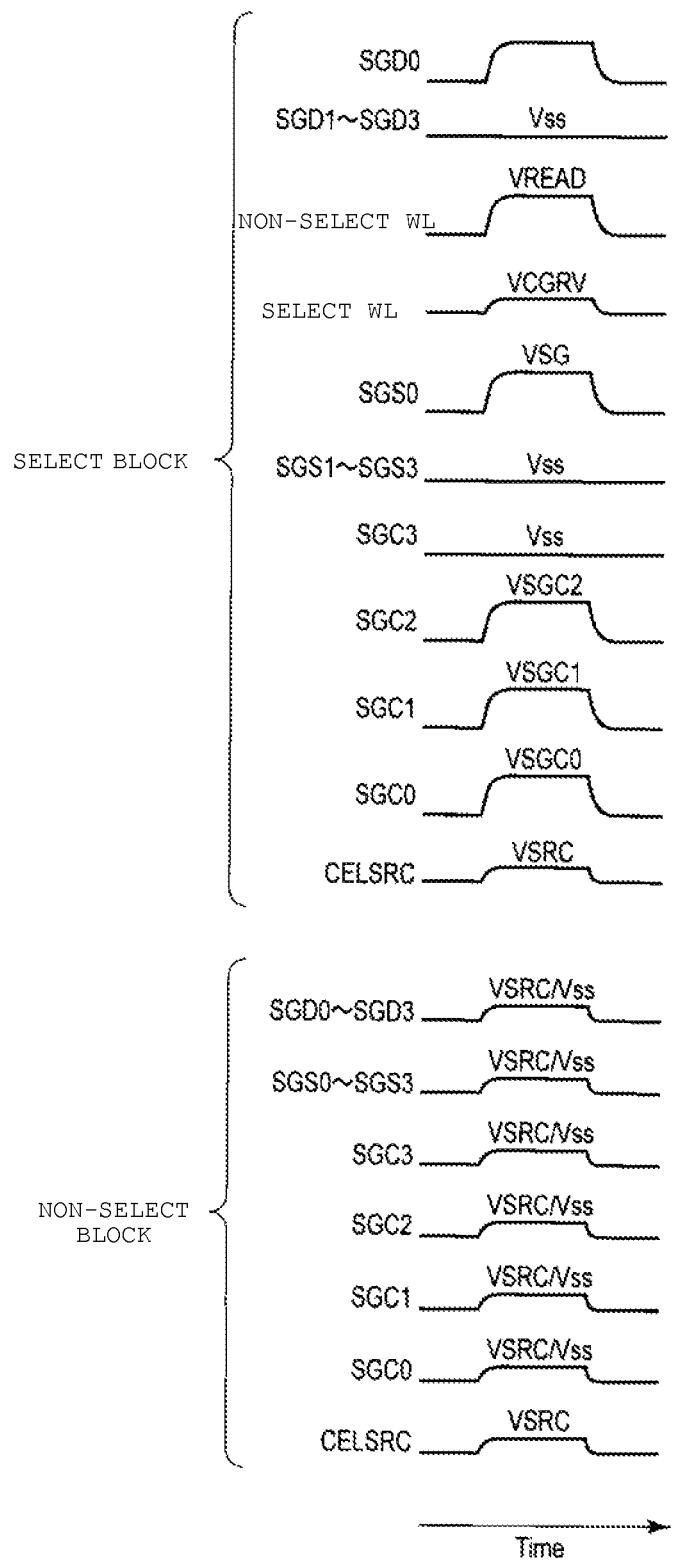
FIG. 25 is a view illustrating an operation example of the semiconductor memory according to the third embodiment.

When data is read from the NAND string NS of the string unit SU0 illustrated in FIG. 25, a voltage applied to the selection gate line SGC3 of the string unit SU3 at the farthest position from the string unit SU0 may be 0 V.

When the selection gate line SGC is provided independently for the string unit SU, in accordance with a layout of the block BLK, a voltage applied to the selection gate line SGC in the string unit SU on a boundary side between the blocks BLK may have the magnitude different from that of a voltage applied to the selection gate line SGC in the string unit SU on a middle side of the block BLK. This is because the number of the source line contacts CELSRC in the vicinity of the string unit SU is different for each string unit SU in accordance with a layout of the block BLK and thus an amount of a cell current flowing in the source line contact CELSRC is adjusted by a driving force control of the selection gate transistor SGCT.

The writing operation of the three-dimensional structure NAND flash memory according to the embodiment is different from those according to the first embodiment and the second embodiment in that the voltage Vss is applied to the common selection gate lines SGC independent from each other. The erasing operation of the three-dimensional structure NAND flash memory according to the embodiment is different from the erasing operation according to the first embodiment and the second embodiment in that the voltage VERA_SGC is applied to the common selection gate lines SGC.

As described above, in the semiconductor memory according to the third embodiment, it is possible to provide a flash memory having high reliability with low cost.

(4) Fourth Embodiment

A semiconductor memory according to a fourth embodiment will be described referring to FIG. 26.

Figure 26:
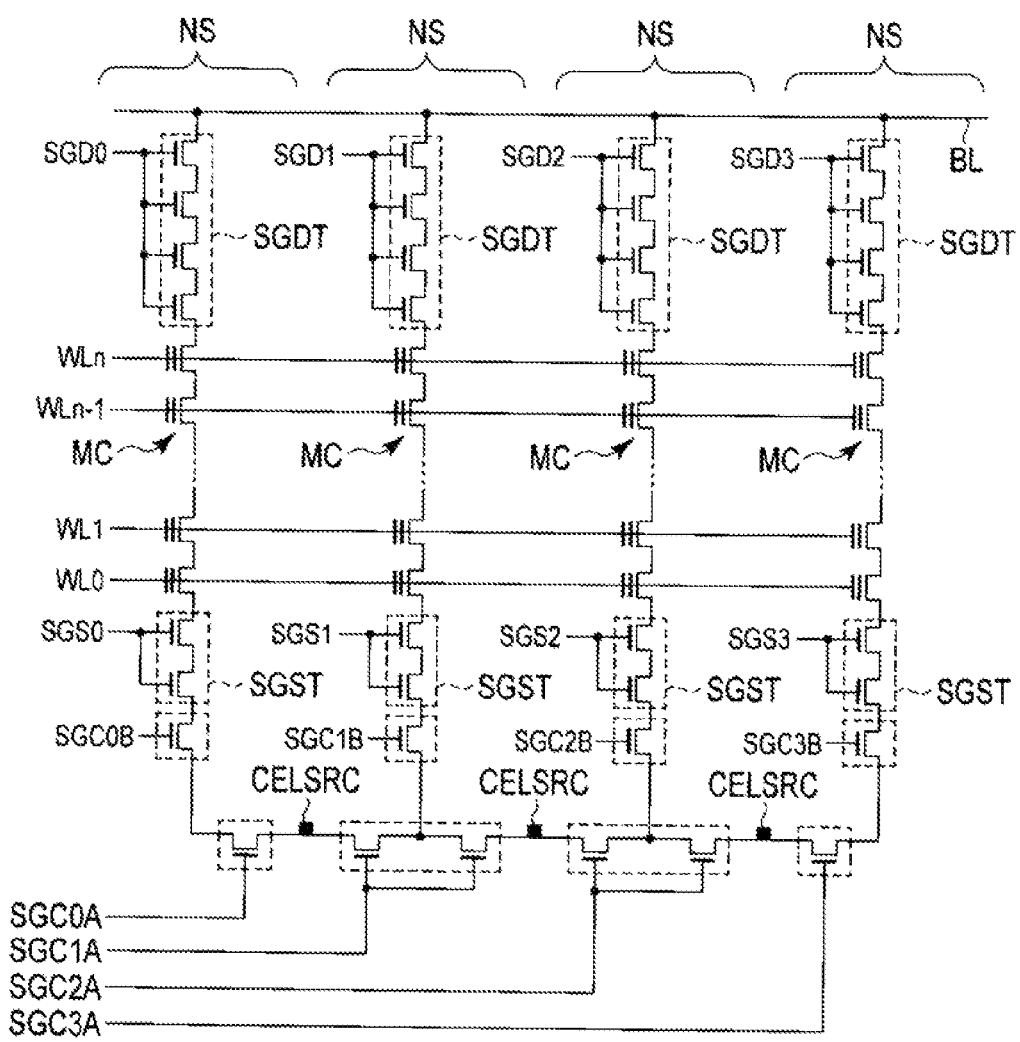
FIG. 26 is a diagram illustrating a configuration example of a semiconductor memory according to a fourth embodiment.

As illustrated in FIG. 26, the NAND flash memory 1 having a three-dimensional structure according to the embodiment includes lower side common selection gate lines SGC0A to SGC0A and upper side common selection gate lines SGC0B to SGC0B for each string unit SU.

The multiple lower side common selection gate lines SGC0A to SGC3A and the multiple upper side common selection gate lines SGC0B to SGC3B are driven independently.

Upper side common selection gate transistors SGCT0B to SGCT0B are respectively connected to the multiple upper side common selection gate lines SGC0B to SGC3B. In the embodiment, the block BLK includes eight common selection gate lines SGC.

Regarding the switch circuit 290, the common selection gate switch unit 294 includes eight selection switches CSW respectively corresponding to four lower side common selection gate lines SGC0A to SGC3A and four upper side common selection gate lines SGC0B to SGC3B.

The common selection gate switch unit 294 includes eight non-selection switches UCSW respectively corresponding to the upper side and lower side common selection gate lines SGC.

Eight lines SGCI are provided between the common selection gate line driver 221 and the switch circuit 290 such that the eight lines SGCI respectively correspond to the four upper side common selection gate line and the four lower side common selection gate line.

The operation of the flash memory according to the embodiment may be executed by combination with the operation described in the second embodiment (FIG. 20 and FIG. 21) and the third embodiment (FIG. 24 and FIG. 25).

As described above, in the flash memory according to the fourth embodiment, it is possible to provide a flash memory having high reliability with low cost.

(5) Fifth Embodiment

A semiconductor memory (for example, three-dimensional structure NAND flash memory) according to a fifth embodiment will be described using FIG. 27 and FIG. 28.

The flash memory according to the embodiment may adjust threshold values (ON voltage) of the selection gate transistors SGDT, SGST, and SGCT including the memory film (charge accumulation layer and charge trapping film).

For example, the selection gate transistors SGDT and SGST are formed on the side surface of the semiconductor pillar 75 substantially simultaneously by a manufacturing process common with the memory cell MC. For this reason, it is difficult to control the threshold values of the selection gate transistors SGDT and SGST by using implantation of impurities into the channel region (semiconductor pillar).

Data may be incorrectly written due to boost leakage when data is written in the memory cell MC in a state where control of the threshold values of the selection gate transistors SGDT and SGST is difficult. Thus, an off leakage current of the non-selected block/non-selected string may increase and a reading margin may be reduced when data is written in the memory cell MC.

The flash memory according to the embodiment may adjust the threshold values (threshold value voltage) of the selection gate transistors SGDT, SGST, and SGCT by executing an operation similar to the writing operation and the erasing operation on the memory cell MC in the selection gate transistors SGDT, SGST, and SGCT including the memory film 79 under control of the host device 600 and the memory controller 5.

The threshold values of the selection gate transistors SGDT, SGST, and SGCT change by injection of charges into the memory film (charge trapping film) 79 or emission of charges from the memory film 79.

For example, the host device 600 (or test apparatus) transmits, to the storage device 500 (or flash memory), a command for selecting the selection gate transistor (selection gate line) and an address including information on the selection gate transistor of which the threshold value is to be adjusted when the threshold value of the selection gate transistor is adjusted.

The memory controller 5 and the internal control circuit 9 access the NAND string NS and the selection gate transistor (selection gate line) based on the address and the command. The memory controller 5 and the internal control circuit 9 execute the writing operation or the erasing operation of the selection gate transistor for adjusting the threshold value of the transistor on the NAND string NS including the selection gate transistor which is a target for adjusting the threshold value.

Figure 27:
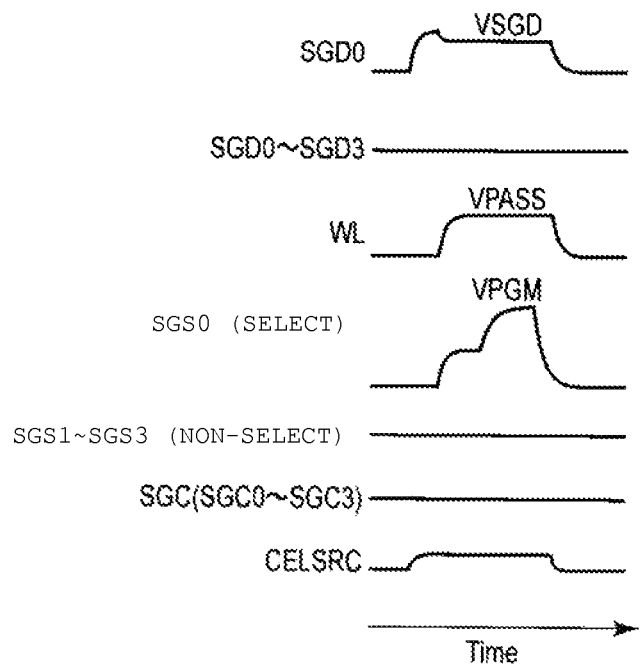
FIG. 27 is a view illustrating an operation example of a semiconductor memory according to a fifth embodiment.

FIG. 27 is a timing chart of voltages of the lines in the flash memory when the threshold value voltage of the source side selection gate transistor including the memory film is adjusted by injection of charges (writing operation) into the memory film.

A case will be described in which, in the flash memory illustrated in FIG. 7, the writing operation for adjusting the threshold value of the selection gate transistor is executed on the selection gate transistor SGST of the selection gate line SGS0 of the string unit SU0 in the block BLK.

As illustrated in FIG. 27, the sense amplifier circuit 30 transmits a voltage used for adjusting the threshold value of the selection gate transistor SGS0 to the bit line BL when the threshold value voltage of the selection gate transistor is adjusted by the injection of charges (writing operation) into the memory film.

The word line/selection gate line driver 201 applies the program voltage VPGM to the source side selection gate line SGS0 through the switch circuit 290, substantially similar to applying of the program voltage to the selected word line when the writing operation is executed on the memory cell MC.

The word line/selection gate line driver 201 applies the non-selection voltage VPASS to the word line WL. The word line/selection gate line driver 201 applies the voltage (ON voltage) VSGD to the drain side selection gate line SGD0.

The common selection gate line driver 221 applies, for example, 0 V to the common selection gate line SGC. A voltage resulting from a potential difference between the source side selection gate line SGS0 and the common selection gate line SGC is applied to the inter-layer insulating film between the source side selection gate line SGS0 and the common selection gate line SGC when the program voltage is applied to the source side selection gate line. A voltage applied to the common selection gate line SGC may be a voltage of a value other than 0 V in order to reduce a voltage applied to the inter-layer insulating film.

The word line/selection gate line driver 201 applies 0 V to the drain side selection gate lines SGD1 to SGD3 and applies 0 V to the source side selection gate lines SGC1 to SGC3 in the string units (non-selected storing unit) SU1 to SU3 including the selected gate transistor of which the threshold value is not adjusted.

Applying the program voltage VPGM to the selection gate line SGS0 causes charges to be injected into the memory film 79 of the source side selection gate transistor SGST0.

Accordingly, the threshold value of the source side selection gate transistor SGST0 changes.

Verification may be executed on the selection gate transistor SGST after the program voltage is applied to the selection gate line SGS. The threshold value of the selection gate transistor SGST is determined whether or not to be shifted to a target value by the verification.

The word line/selection gate line driver 201 applies the reading voltage VCGRV to the selection gate line SGS0 when verification is executed on the selection gate transistor SGST. The word line/selection gate line driver 201 applies the non-selection voltage VREAD to the word line WL. The word line/selection gate line driver 201 applies the voltage VSG to the drain side selection gate line SGD0. The word line/selection gate line driver 201 applies the voltage VSGC to the common selection gate line SGC.

The word line/selection gate line driver 201 applies 0 V to the drain side selection gate lines SGD1 to SGD3 and applies 0 V to the source side selection gate lines SGS1 to SGS3 in the non-selected string units SU1 to SU3 when verification is executed on the selection gate transistor.

The memory controller and the internal control circuit perform to apply the program voltage and to execute verification one or more times until the threshold value of the selection gate transistor SGST is shifted to the target value.

In this manner, the threshold value of the selection gate transistor SGST including the memory film (charge accumulation layer) is adjusted by the writing operation on the selection gate transistor SGST.

The threshold value of the drain side selection gate transistor SGDT and the common selection gate transistor SGCT may be adjusted by an operation substantially similar to adjustment of the threshold value for the source side selection gate transistor SGST by using the writing operation.

The voltages VPGM and VPASS used when the writing operation is executed on the selection gate transistor may be different from voltages used when the writing operation is executed in the memory cell. For example, it is preferable that threshold value adjustment for the common selection gate transistor SGCT by using the writing operation be smaller than the writing voltage VPGM used for threshold value adjustment for the drain side/source side selection gate transistor, in order to avoid insulating breakdown of the gate insulating film 80.

The voltages VCGRV, VREAD, VSG, and VSGC used for verification of the selection gate transistor may be different from the voltages VCGRV, VREAD, VSG, and VSGC used when the verification or the reading operation is executed on the memory cell.

A case in which the erasing operation for the selection gate transistor is executed in the flash memory illustrated in FIG. 6 will be described with reference to FIG. 28.

Figure 28:
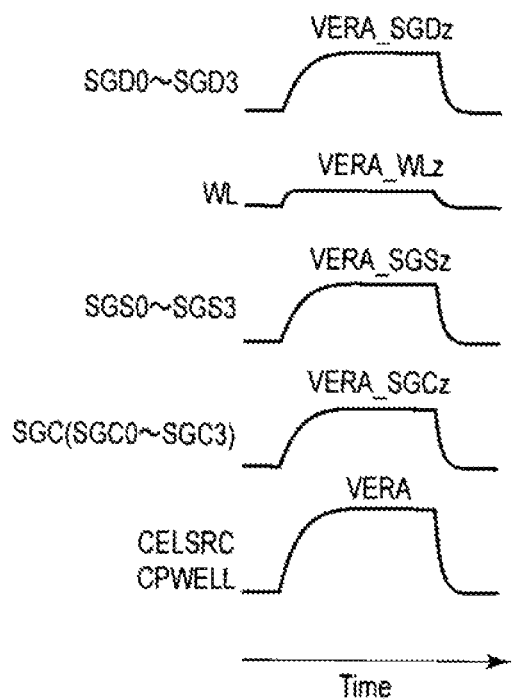
FIG. 28 is a view illustrating an operation example of the semiconductor memory according to the fifth embodiment.

The word line/selection gate line driver 201 applies the erasing voltage VERA to the source line contact (source line) CELSRC and the well contact (P type well region) CPWELL under control of the memory controller 5 and the circuit in the flash memory 1 when the threshold value of the source side selection gate transistor is adjusted by emission of charges from the memory film (erasing operation), as in a timing chart of voltages of the lines in the flash memory illustrated in FIG. 28.

The word line/selection gate line driver 201 applies a voltage VERA_SGDz to the drain side selection gate line SGD. The word line/selection gate line driver 201 applies a voltage VERA_WLz to the word line WL. The word line/selection gate line driver 201 applies the voltage VERA_SGSz to the source side selection gate line SGS.

The common selection gate line driver 221 applies the voltage VERA_SGCz to the common selection gate line SGC.

Accordingly, the selection gate transistors SGDT, SGST, and SGCT in the selected block BLK turn ON.

The erasing voltage VERA is applied to the semiconductor pillar 75 and transmitted to the channel region of the transistor.

Electrons in the memory film 79 of the selection gate transistor SGST are emitted into the semiconductor pillar 75 by a potential difference occurring between the source side selection gate line SGS and the semiconductor pillar (channel region of the transistor).

In this manner, the threshold value of the selection gate transistor SGST including the memory film (charge accumulation layer) is adjusted by the erasing operation for the selection gate transistor SGST.

The threshold value of the drain side selection gate transistor SGDT and the common selection gate transistor SGCT may be adjusted by an operation substantially similar to adjustment of the threshold value for the source side selection gate transistor SGST by using the erasing operation.

Since the erasing operation on the memory cell is executed by a block, adjustment of threshold value for the selection gate transistor by using an operation similar to the erasing operation is also executed by a block. The voltage VERA_SGDz is applied to all of the drain side selection gate lines SGD in the block BLK. The voltage VERA_SGSz is applied to all of the source side selection gate lines SGS in the block BLK.

The voltage VERA_SGCz of the common selection gate line SGC may be the same as or different from the voltage VERA_SGC of the common selection gate line SGC in the erasing operation of the memory cell MC when the threshold value of the selection gate transistor SGST is adjusted by emission of charges from the memory film 79 (or injection of holes into the memory film).

The voltage VERA_WLz applied to the word line WL is higher than the voltage VERA_WL of the word line in the erasing operation of the memory cell MC such that the erasing operation is not executed on the memory cell MC when the threshold value of the selection gate transistor SGST is adjusted. If the voltages VERA_WL and VERA_WLz of the word line WL are substantially the same as the erasing voltage VERA, erasing of data in the memory cell MC does not occur.

The voltage VERA_SGSz for adjusting the threshold value of the selection gate transistor SGST is lower than the voltage VERA_SGS of the source side selection gate line SGS in the erasing operation of the memory cell MC. For example, the voltage VERA_SGSz of the source side selection gate line SGS is approximately 0.5 V.

The source side selection gate transistor SGST and the drain side selection gate transistor SGDT include the multiple conductive layers as the gate electrode. However, the common selection gate transistor SGCT includes one conductive layer as the gate electrode. The common selection gate transistor SGCT includes the gate insulating film 80 on the substrate 700. In order to prevent breakdown of the common selection gate transistor SGCT, it is preferable that the gate voltage of the common selection gate transistor SGCT when the threshold value of the common selection gate transistor is adjusted be smaller than the gate voltages of the selection gate transistors SGST and SGDT when the threshold values of the source side/drain side selection gate transistors SGST and SGDT are adjusted.

Adjusting the threshold value of the selection gate transistor by using the erasing operation may be executed for each storing unit. Verification may be executed on the selection transistor SGCT on which the erasing operation is executed in order to determine the threshold value.

In the embodiment, an example of adjusting the threshold value of the selection gate transistor in the flash memory having the structure illustrated in the first embodiment (FIG. 6) is described. The threshold value of the selection gate transistor in the flash memory according to the second to fourth embodiments may be adjusted by using substantially the same operation as the operation illustrated in FIG. 27 and FIG. 28.

The common selection gate transistor SGCT includes the channel region provided in the semiconductor substrate 700. The common selection gate transistor SGCT may adjust the threshold value of the transistor by ion-implantation into the channel region.

Figure 29:
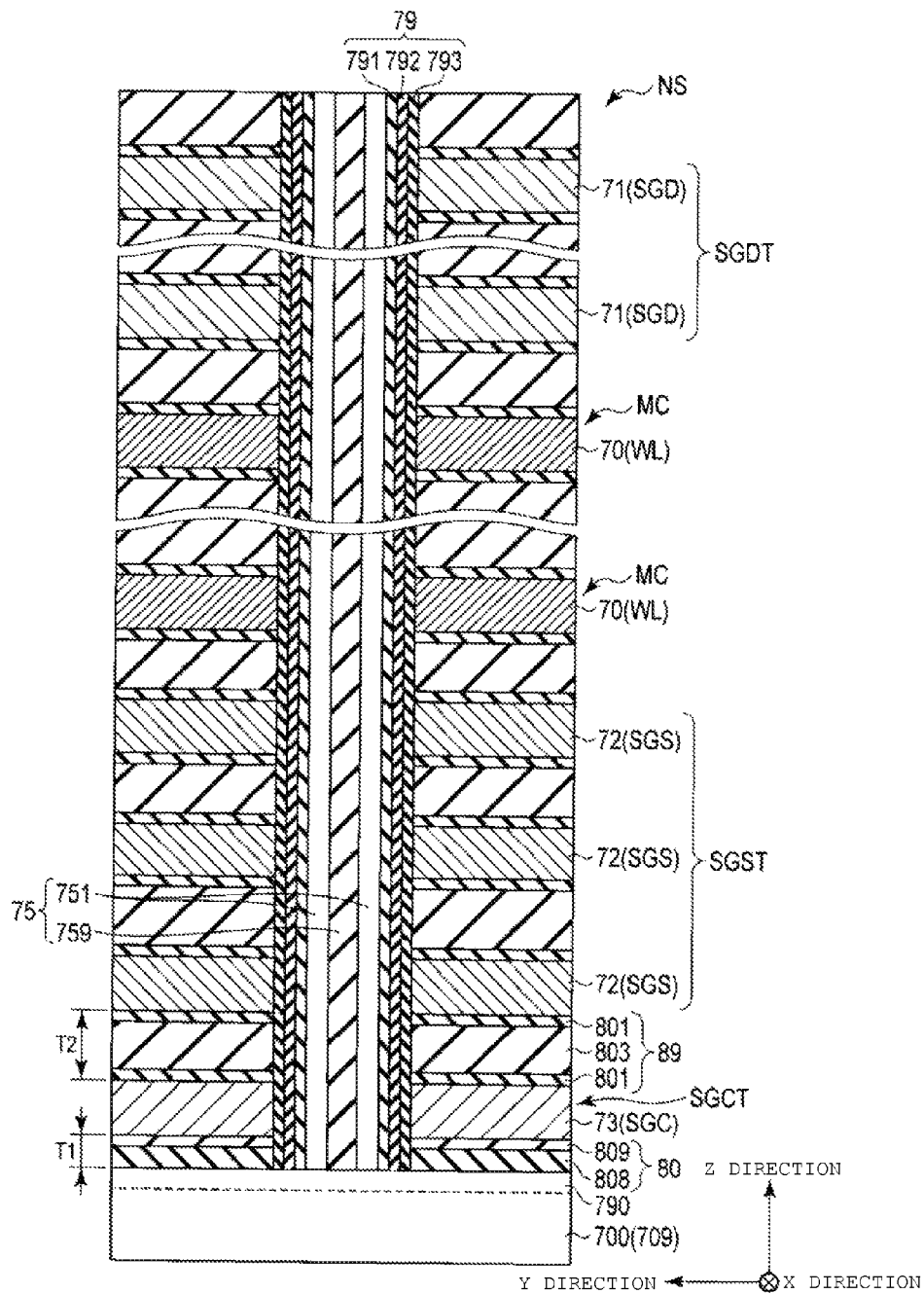
FIG. 29 is a diagram illustrating a modification example of the semiconductor memory according to the fifth embodiment.

For example, as in the structural example illustrated in FIG. 29, an impurity region 790 is formed in the channel region (P type well region) below the gate electrode (conductive layer) 73 by ion-implantation. A normally-on type (depletion type) common selection gate transistor SGCT may be formed.

The selection gate transistor SGDT may be formed by using a manufacturing process different from a manufacturing process of the memory cell MC such that the drain side selection gate transistor SGDT is positioned on an upper end of the semiconductor pillar. For example, the gate insulating film of the drain side selection gate transistor SGDT may have a structure in which only the insulating film 791 or only the insulating film 793 is included due to removal of the memory film (charge trapping film). The gate insulating film of the selection gate transistor SGDT may be formed from an insulating film different from a film included in the memory film 79.

As described above, the flash memory according to the embodiment may adjust the threshold value of the selection gate transistor by using substantially the same operation as the writing operation or the erasing operation on the memory cell.

Consequently, according to the embodiment, it is possible to provide a flash memory having high reliability with low cost.

(6) Sixth Embodiment

A semiconductor memory (for example, three-dimensional structure NAND flash memory) according to a sixth embodiment will be described referring to FIG. 30 and FIG. 31.

In the NAND flash memory having a three-dimensional structure, a level of difficulty in processing on a bottom portion side of a stacked body is higher than a level of difficulty in processing on an upper portion side of the stacked body.

For this reason, the common selection gate line SGC may become short-circuited with the source side selection gate line SGS.

As will be described later, the flash memory according to the embodiment may execute an operation requested from the outside even when the common selection gate line SGC and the source side selection gate line SGS become short-circuited.

The reading operation of the flash memory according to the embodiment will be described when the common selection gate line SGC becomes short-circuited with the source side selection gate line SGS1 of the second string unit SU1 in the flash memory according to the first embodiment.

The short circuit generated between the common selection gate line SGC and the source side selection gate line SGS is detected by a test process of the flash memory. The memory controller 5 (or circuit in the flash memory) recognizes the short circuit generated between the common selection gate line SGC and the source side selection gate line SGS as failure information when the flash memory is used in practice (in use by a user). The memory controller 5 controls an operation of the flash memory based on the failure information.

For example, the flash memory according to the embodiment controls the voltage of the source side selection gate line SGS in order to reduce an influence on the short circuit between the selection gate lines SGC and SGS under control of the memory controller 5 and the internal control circuit.

Figure 30:
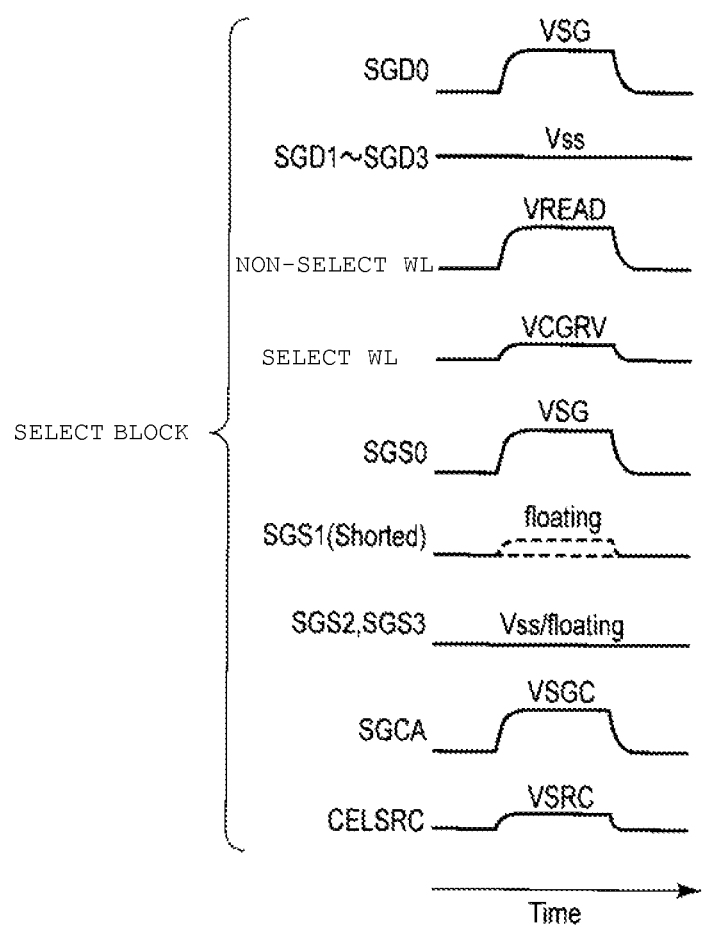
FIG. 30 is a view illustrating an operation example of a semiconductor memory according to a sixth embodiment.

The memory controller 5 drives the flash memory and executes the reading operation of the flash memory when the string unit (for example, string unit SU0) including the source side selection gate line SGS which does not become short-circuited with the common selection gate line SGC in the reading operation of FIG. 30, as illustrated in the timing chart of the voltages of the lines.

The word line/selection gate line driver 201 applies the voltage VSG to the source side selection gate line SGS0 of the selected string unit SU0. The common selection gate line driver 221 applies the voltage VSGC to the common selection gate line SGC.

The word line/selection gate line driver 201 applies the voltage Vss to the source side selection gate lines SGS2 and SGS3 of the non-selected storing unit.

In the embodiment, the word line/selection gate line driver 201 causes the source side selection gate line SGS1 including a short circuit with the common selection gate line SGC to become floating.

Accordingly, reading of data may be executed in a state where an influence of a short circuit generated between the common selection gate line SGC and the source side selection gate line SGS1 is reduced.

In reading of data, the non-selection source side selection gate line which does not become short-circuited with the common selection gate line may be in a floating state.

The memory controller 5 drives the flash memory 1 and controls the reading operation of the flash memory 1 when the string unit SU1 including the source side selection gate line (here, selection gate line SGC1) which becomes short-circuited with the common selection gate line SGC is selected.

Figure 31:
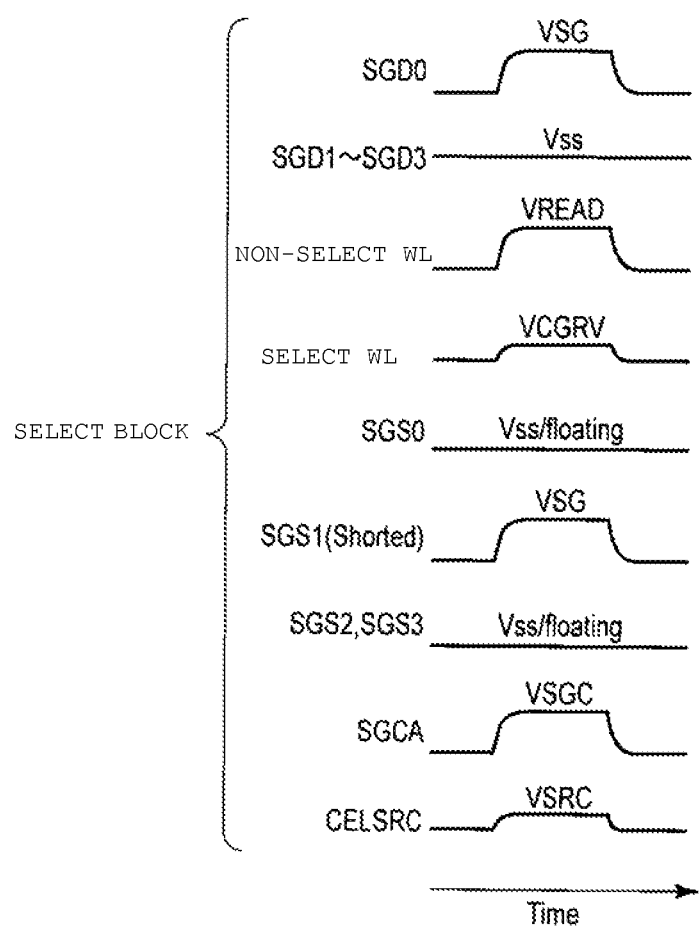
FIG. 31 is a view illustrating an operation example of the semiconductor memory according to the sixth embodiment.

In this case, as in the timing chart of the voltages of the lines in the reading operation of FIG. 31, the word line/selection gate line driver 201 causes the non-selection source side selection gate lines SGS0 to SGS3 to become floating, similarly to, for example, the operation in FIG. 30. Additionally the word line/selection gate line driver 201 applies the voltage Vss to the source side selection gate lines SGS0 to SGS3.

The word line/selection gate line driver 201 applies the voltage VSG to the source side selection gate line SGS1 including a short circuit with the common selection gate line SGC.

The common selection gate line driver 221 applies the voltage VSG to the common selection gate line SGC.

Accordingly, the source side selection gate line SGS1 and the common selection gate line SGC which include a short circuit have the same potential.

As a result, it is possible to reduce an influence of a short circuit generated between the source side selection gate line SGS1 and the common selection gate line SGC.

When the source side selection gate line SGS other than the source side selection gate line SGS1 of the above-described string unit SU1 becomes short-circuited with the common selection gate line SGC, it is possible to reduce an influence of a short circuit generated between the common selection gate line SGC and the source side selection gate line SGS and to execute an operation of the flash memory.

The reading operation of the flash memory used as an example is described. However, the memory controller 5 and the internal control circuit 9 causes the source side selection gate line SGS to be in the floating state or causes the common selection gate line SGC and the source side selection gate line which include a short circuit to have the same potential in the writing operation and the erasing operation of the flash memory. Accordingly, it is possible to reduce an influence of a short circuit generated between the lines and to execute an operation.

As described above, according to the sixth embodiment, even though a short circuit is generated between the source side selection gate line and the common selection gate line, it is possible to reduce an influence of the generated short circuit and to drive the flash memory.

As a result, according to the embodiment, it is possible to increase reliability of a flash memory.

(7) Modification Example

A modification example of the flash memory according to the embodiment will be described referring to FIG. 32 to FIG. 41.

(a) First Modification Example

A modification example of the three-dimensional structure flash memory according to the embodiment will be described using FIG. 32 to FIG. 34.

A configuration of the switch circuit 290 in the row decoder 209 is not limited to the above-described example.

Figure 32:
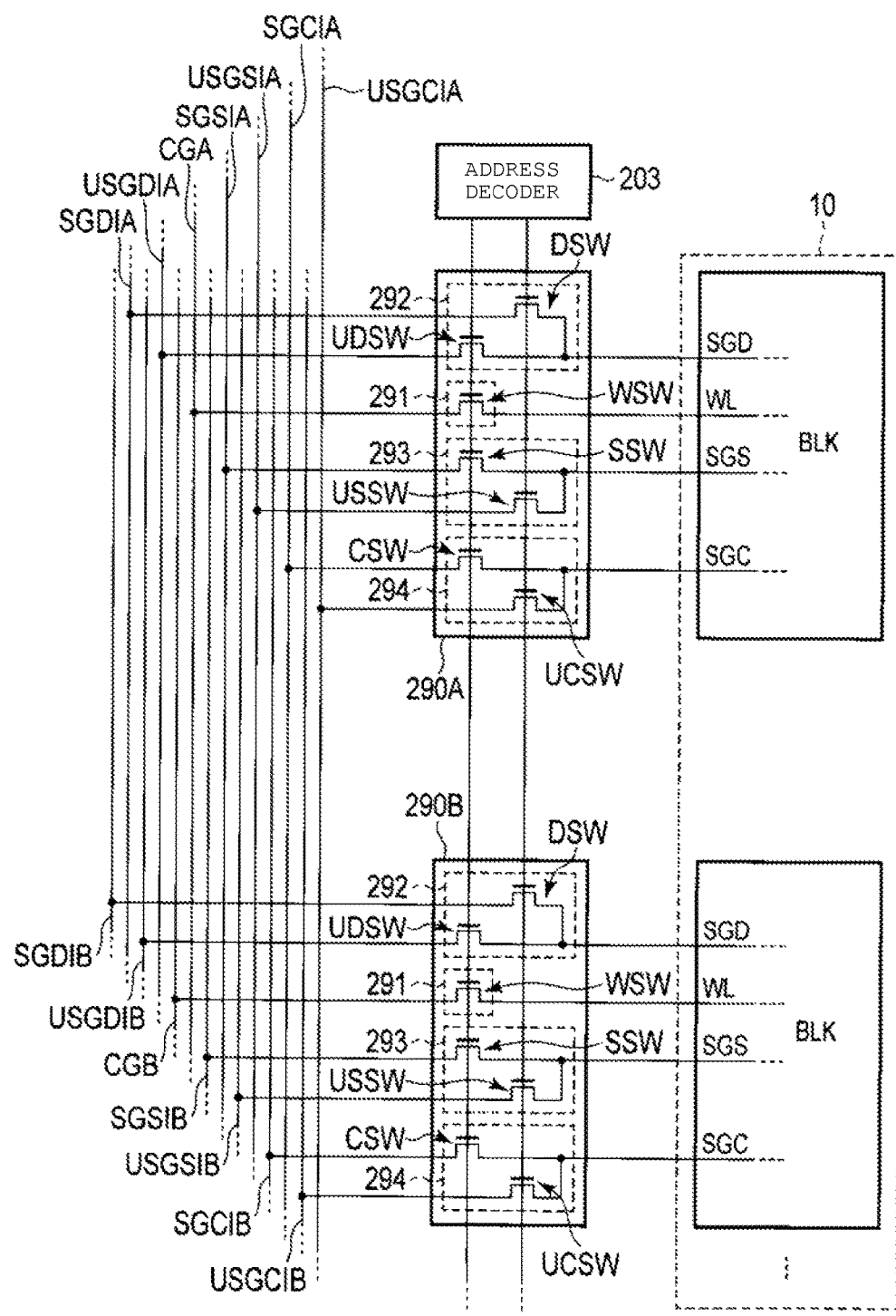
FIG. 32 is a diagram illustrating a modification example of the semiconductor memory according to the embodiment.
Figure 33:
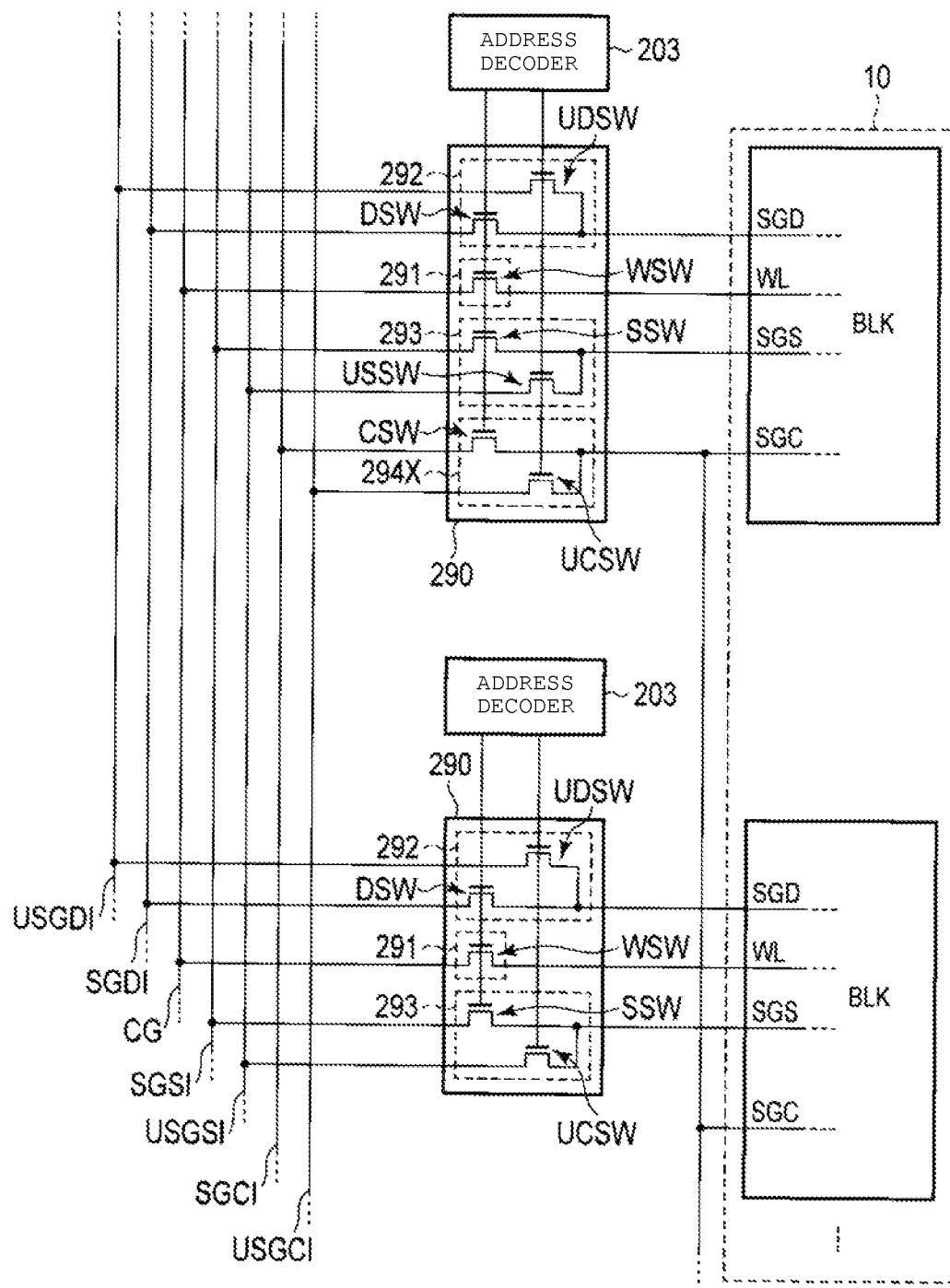
FIG. 33 is a diagram illustrating a modification example of the semiconductor memory according to the embodiment.
Figure 34:
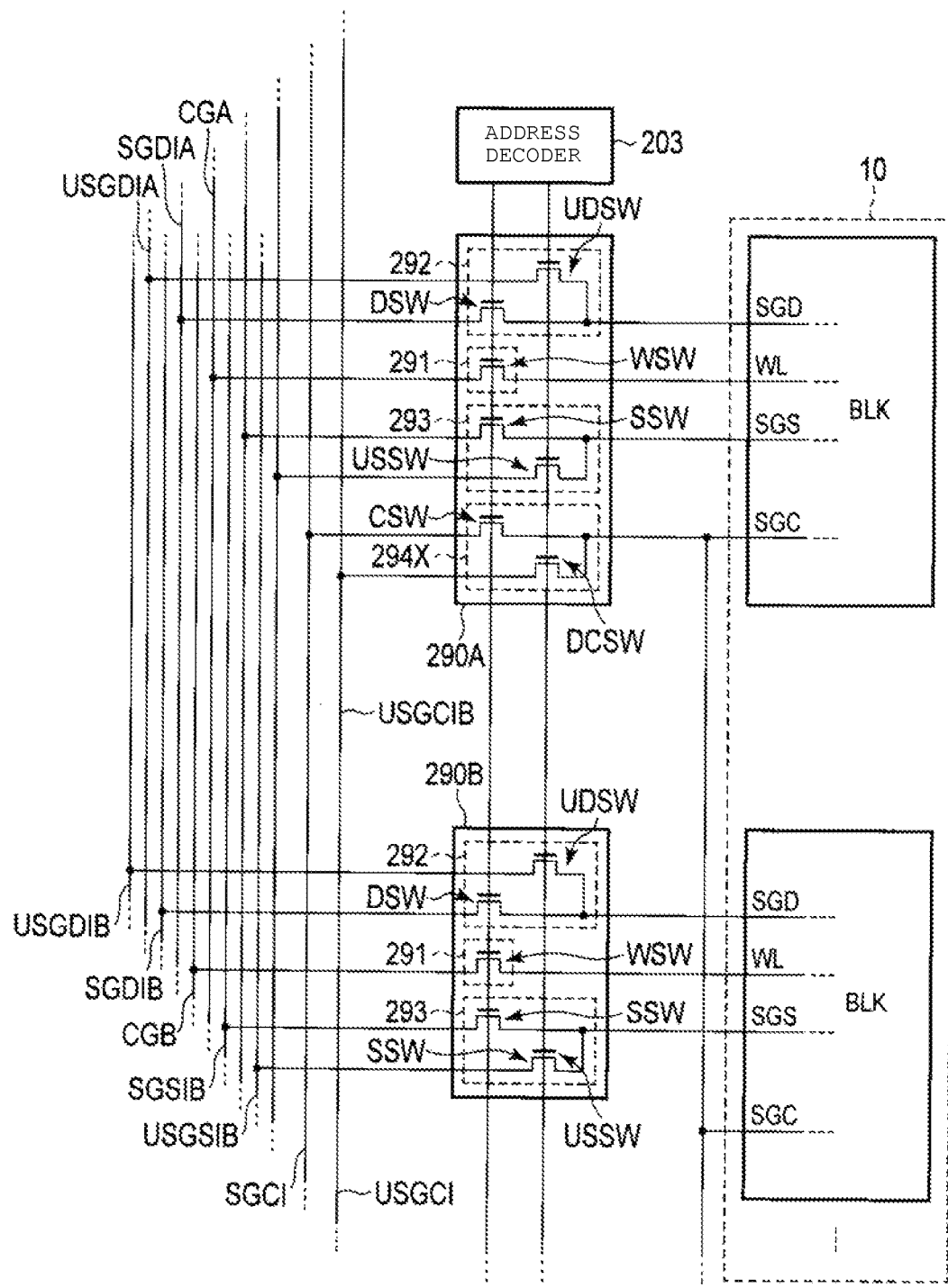
FIG. 34 is a diagram illustrating a modification example of the semiconductor memory according to the embodiment.

The switch circuit illustrated in FIG. 32 to FIG. 34 may be applied to the flash memory according to the above-described embodiments. FIG. 32 to FIG. 34 illustrate one line and a selection/non-selection switches corresponding to the one line for simple illustration.

As in a modification example of FIG. 32, the multiple blocks BLK and the multiple switch circuits 290 may commonly use one address decoder 203.

When the address decoder 203 is commonly used with the multiple blocks BLK, two blocks BLK adjacent to each other are connected to the driver through the lines different from each other.

For example, the multiple even-numbered blocks BLK are connected to the common lines CGA, SGDIA, USGDIA, SGSIA, USGSIA, SGCIA, and USGCIA through a switch circuit 290A.

For example, the multiple odd-numbered blocks BLK are connected to the common lines CGB, SGDIB, USGDIB, SGSIB, USGSIB, SGCIB, and USGCIB through a switch circuit 290B.

With a configuration in FIG. 32, it is possible to reduce a layout region for the address decoder 203 in the chip in the flash memory including switch circuits in FIG. 33.

As in a modification example of FIG. 33, the multiple blocks BLK and the multiple switch circuits 290 may employ a switch unit 294X of the common selection gate line SGC.

In the non-selected block, since the source side selection gate transistor SGS turns OFF, an incorrect operation is hardly executed in the non-selected block even though the multiple blocks BLK commonly use the switch of the common selection gate line SGC.

When the multiple blocks BLK and the multiple switch circuits 290 employ a switch unit 294X in common, it is possible to reduce a layout region for the switch unit 294X in the chip in the flash memory including the switch circuit in FIG. 33.

As illustrated in FIG. 34, both the address decoder 203 and the switch unit 294X may be employed in common by the multiple blocks BLK and the multiple switch circuits 290.

With FIG. 32 to FIG. 34, it is possible to reduce the chip size of the flash memory according to the embodiment and to reduce the chip cost.

(b) Second Modification Example

A modification example of the three-dimensional structure flash memory according to the embodiment will be described using FIG. 35 to FIG. 39.

Figure 35:
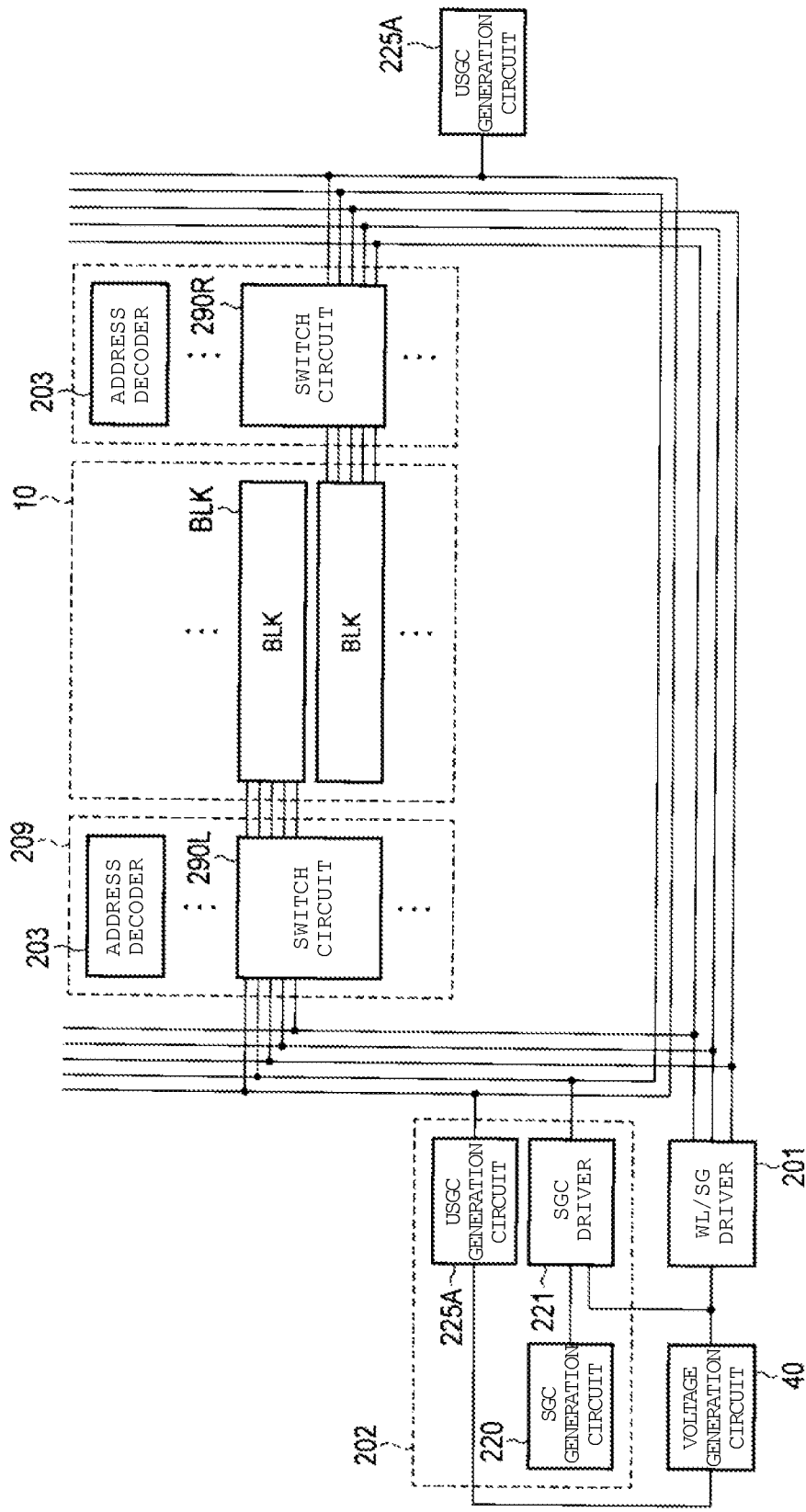
FIG. 35 is a diagram illustrating a modification example of the semiconductor memory according to the embodiment.

As illustrated in FIG. 35, regarding a switch circuit for the adjacent blocks, switch circuits 290L and 290R may be disposed on sides mutually opposite to each other based on the block BLK. For example, the switch circuit 290L is disposed on one end side of the odd-numbered block BLK and the switch circuit 290R is disposed on another end side of the even-numbered block BLK.

The multiple switch circuits 290L and 290R which are disposed on the sides mutually opposite to each other are connected to the common drivers 201 and 221 through the lines. For example, it is preferable that the non-selection voltage generation circuit (USGC voltage generation circuit) 225 be disposed on both of one end side of the memory cell array 10 and another end side thereof, in order to avoid an influence of voltage drop due to increase in the length of the line.

When the lines in the two blocks BLK adjacent to each other are drawn toward the sides mutually opposite to each other, it is possible to expand a disposition space of the switch circuits 290L and 290R in the block BLK. For example, it is possible to expand dimensions of the switch circuits 290L and 290R in a block disposition direction by two blocks.

Accordingly, an allowable degree in change of a pitch between the lines is improved in the switch circuits 290L and 290R.

The flash memory of the modification example may have a changed pitch between the lines with a large allowable degree in the row decoder 209 having a large area even though a pitch between the lines becomes small in the memory cell array (block) due to miniaturization of the memory. As a result, it is possible to suppress generation of a short circuit between the lines and between the contact and the line in the flash memory of the modification example.

Each of FIG. 36 to FIG. 39 illustrates a modification example of the switch circuit.

Figure 36:
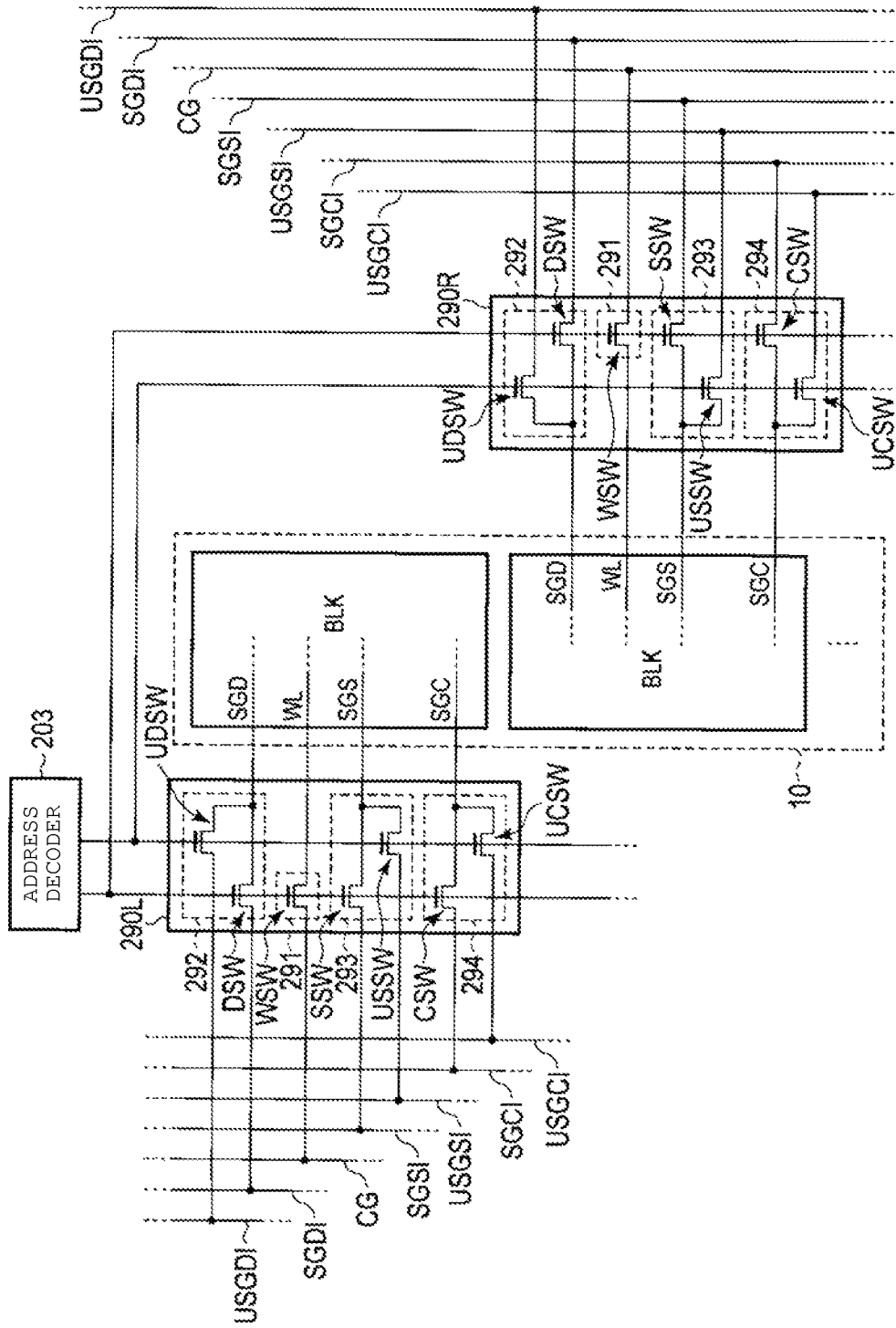
FIG. 36 is a diagram illustrating a modification example of the semiconductor memory according to the embodiment.

As in the modification example illustrated in FIG. 36, one address decoder 203 may also be provided in common to two or more switch circuits 290A and 290B when the switch circuits 290L and 290R are provided on one end side or another end side of the block.

Figure 37:
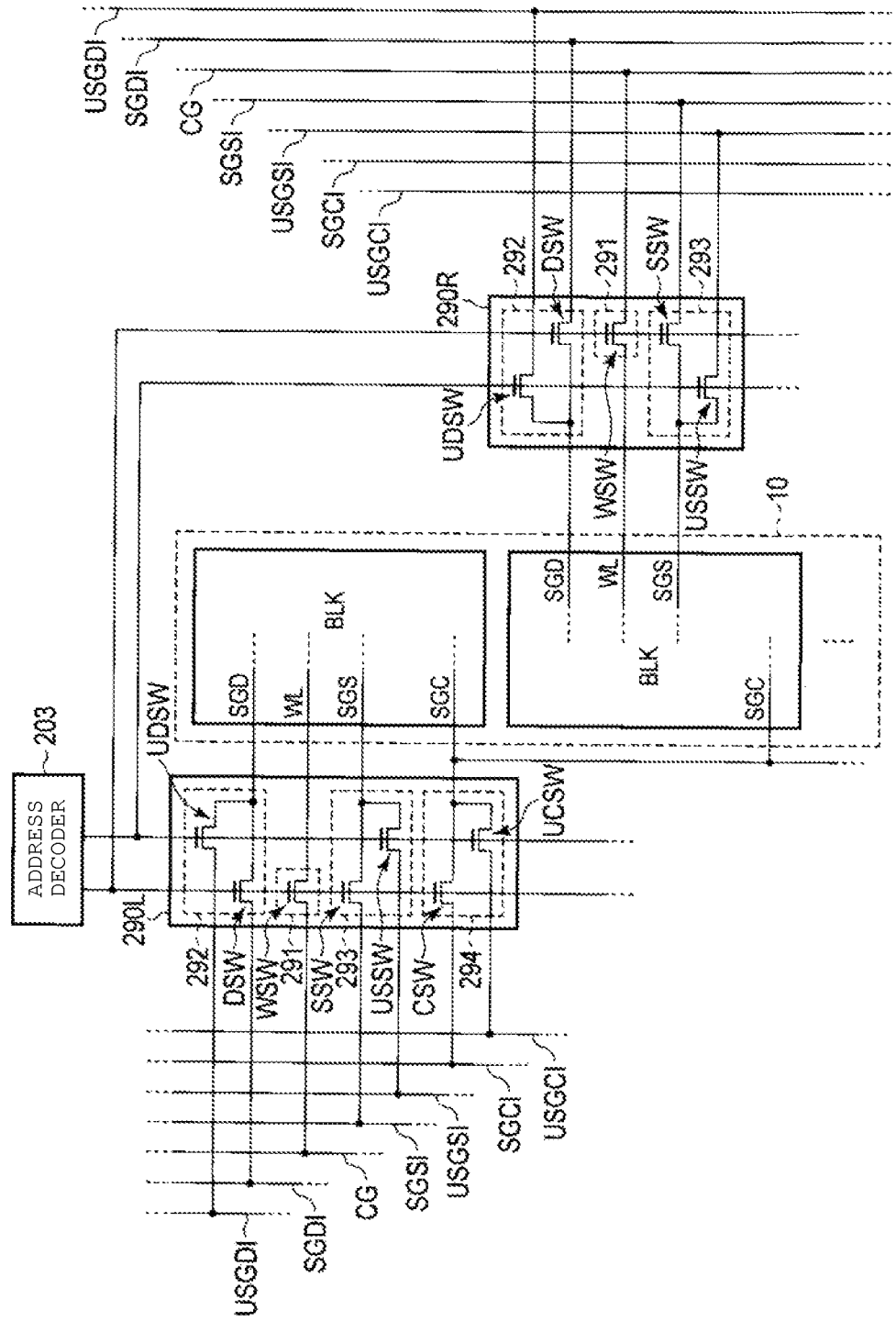
FIG. 37 is a diagram illustrating a modification example of the semiconductor memory according to the embodiment.

As in the modification example illustrated in FIG. 37, the common selection gate line switch unit 294 may be disposed in only one switch circuit 290A and the two or more switch circuits 290A and 290B may employ the switch unit 294 in common.

Figure 38:
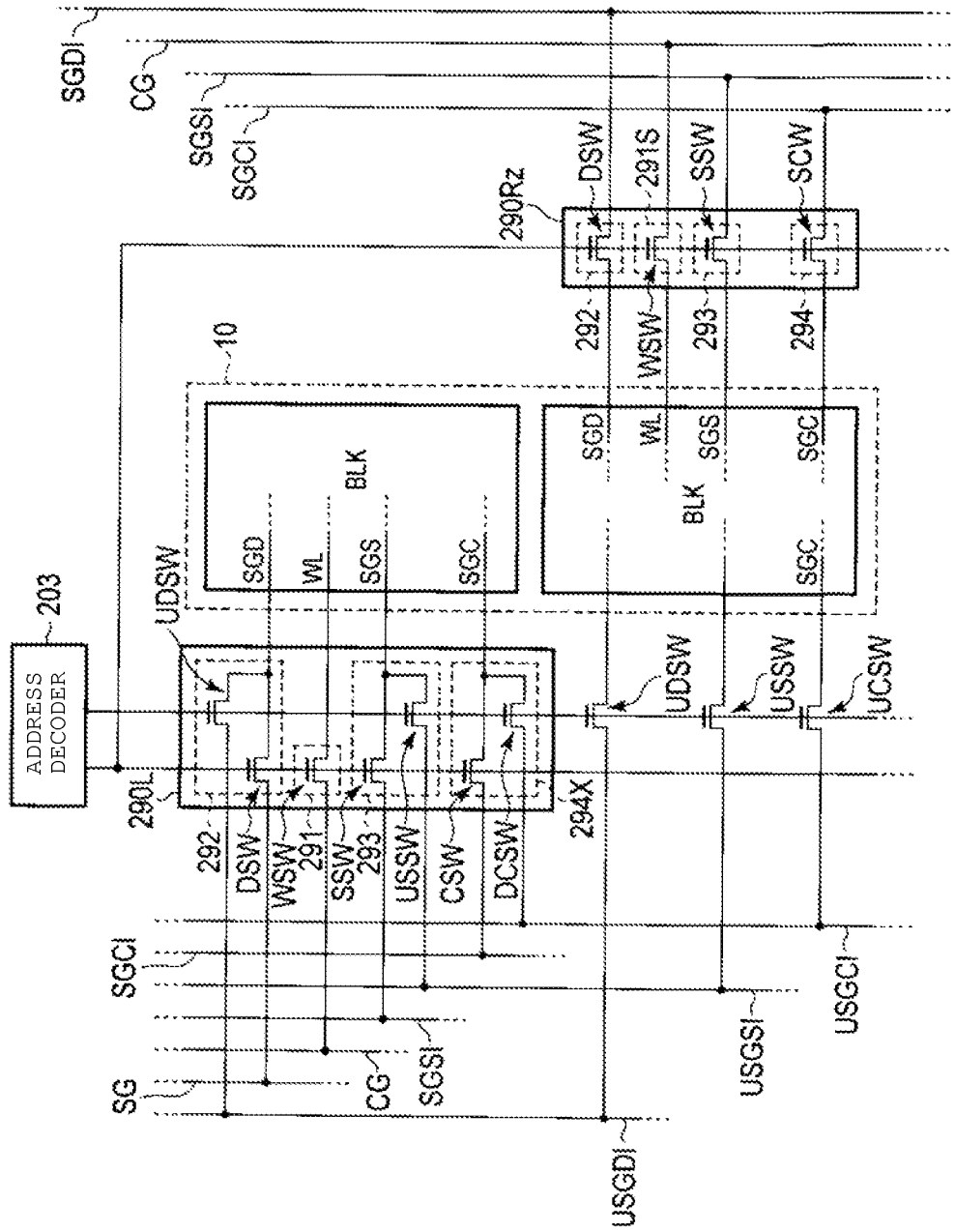
FIG. 38 is a diagram illustrating a modification example of the semiconductor memory according to the embodiment.

As in the modification example illustrated in FIG. 38, the multiple non-selection switches UDSW, USSW, and USW of the selection gate lines SGD, SGS, and SGC may be provided on only one end side of the block BLK. Accordingly, it is possible to reduce the layout space of the switches and the lines in a switch circuit 290Rz on another end side of the memory cell array 10, in the flash memory including the switch circuits of FIG. 38.

Figure 39:
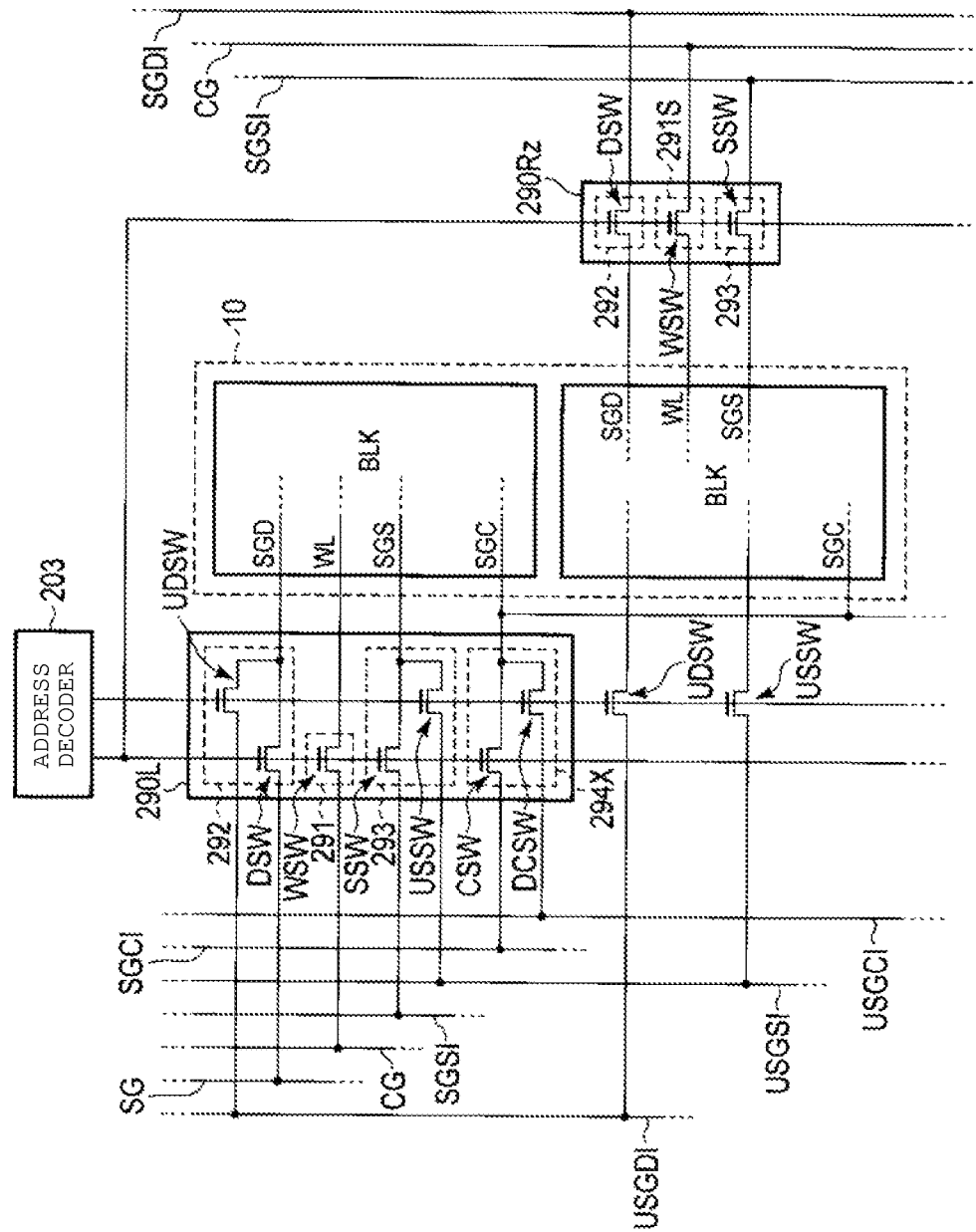
FIG. 39 is a diagram illustrating a modification example of the semiconductor memory according to the embodiment.

As illustrated in FIG. 39, the non-selection switches UDSW, USSW, and UCSW may be disposed on one end side of the memory cell array. Both of the address decoder 203 and the switch unit 294X may be provided in common for the multiple blocks BLK and the multiple switch circuits 290.

Since the switch circuits 290L and 290R in FIG. 35 to FIG. 39 are different from each other in view of only a direction in which the word line WL and the selection gate lines SGD, SGS, and SGC are drawn, an internal configuration of the switch circuits 290L and 290R in the modification example may be applied to any one of the switch circuits according to the first to fourth embodiments (FIG. 7, FIG. 18, FIG. 22, and the like).

As described above, any one of the switch circuits illustrated in FIG. 35 to FIG. 39 may be applied to the flash memory according to the respective embodiments.

According to Second Modification Example illustrated in FIG. 35 to FIG. 39, it is possible to reduce the chip size of the flash memory of the embodiment and to reduce chip cost.

(c) Third Modification Example

The Third Modification Example of the three-dimensional structure flash memory according to the embodiment will be described using FIG. 40 and FIG. 41.

Figure 40:
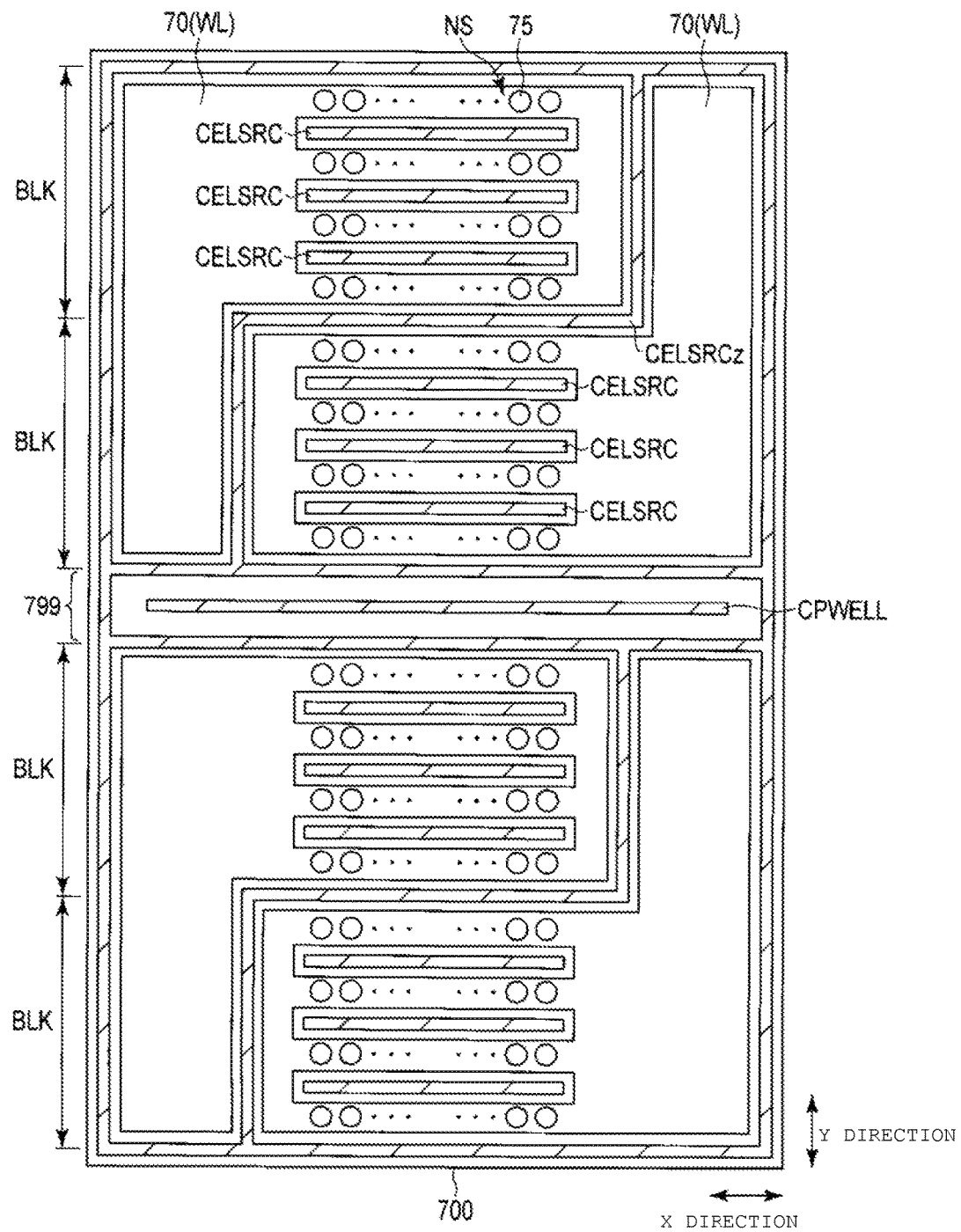
FIG. 40 is a diagram illustrating a modification example of the semiconductor memory according to the embodiment.
Figure 41:
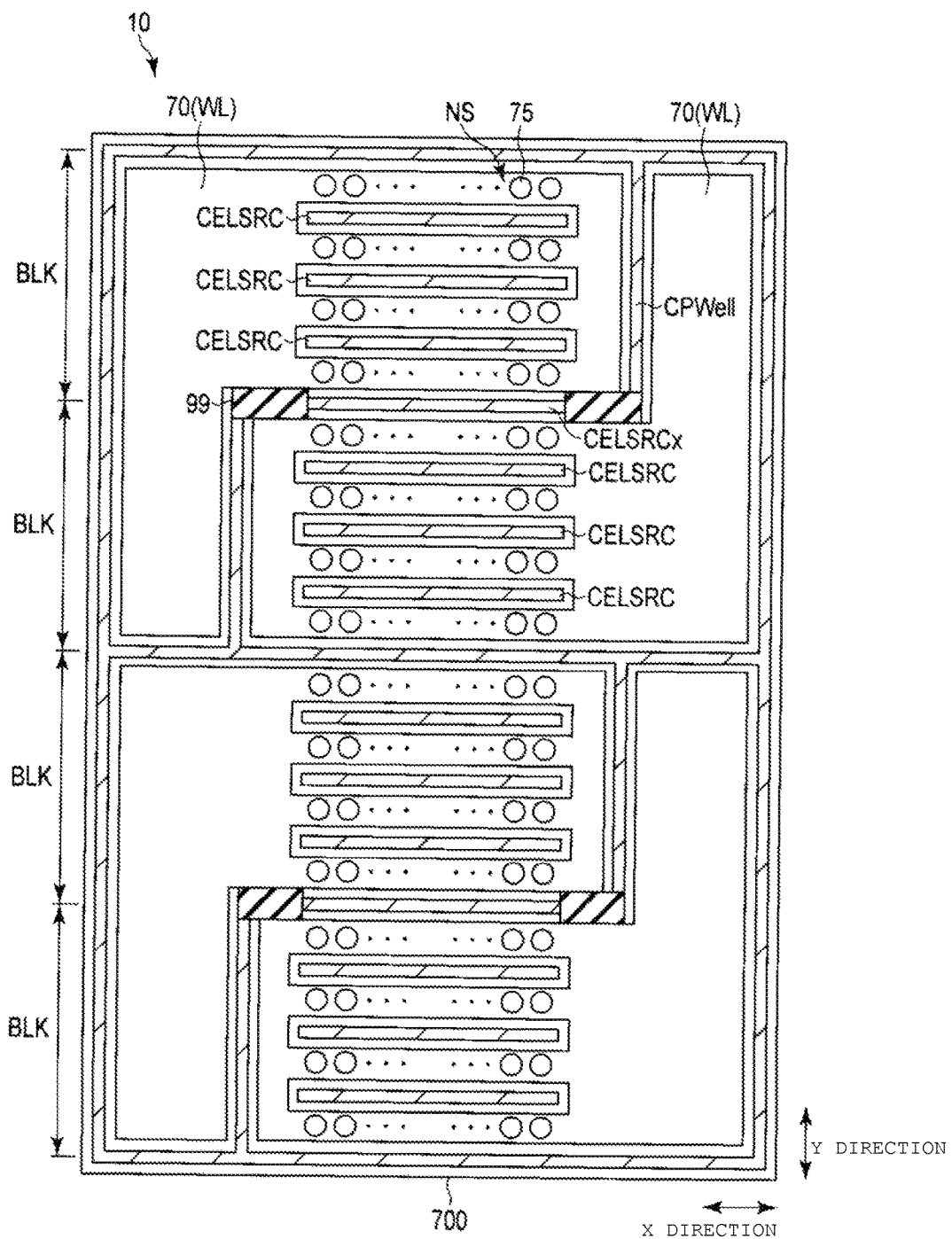
FIG. 41 is a diagram illustrating a modification example of the semiconductor memory according to the embodiment.

In the memory cell array 10, the well contact CPWELL and the source line contact CELSRC may have the structure illustrated in FIG. 40 or FIG. 41.

FIG. 40 and FIG. 41 illustrate simply a planar shape of the multiple conductive layers stacked on the substrate.

As in a top view illustrating a schematic layout of the memory cell array illustrated in FIG. 40, source line contacts CELSRCz are provided between the block BLK adjacent to each other. The source line contacts CELSRCz surround the block BLK in every direction. With this, five source line contacts CELSRC are parallel with the Y direction in one block BLK.

A region 799 (referred to as a well contact region below) is provided between the blocks BLK. The well contact CPWELL is provided in the region 799. The well contact CPWELL has a plate-shape structure.

In the example illustrated in FIG. 40, the well contact region 799 is provided by two blocks. In accordance with the configuration of the flash memory, the well contact regions 799 may be provided at a distance (for example, a distance by four blocks) larger than a length of two blocks in the memory cell array 10.

It is possible to reduce resistance between the source line SL and the substrate 700 by increasing the number (connection frequency of contact CELSRC and well region 709) of the source line contacts CELSRC in the block BLK. As a result, it is possible to reduce the frequency of performing shunt on the source line SL.

A Source line contact CELSRCx is provided between two blocks, as in the top view illustrating the schematic layout of the memory cell array illustrated in FIG. 40.

The source line contact CELSRCx positioned at a boundary between the two blocks BLK is formed in such a manner that a portion 90 is separated from the well contact CPWELL by the insulator 99 and the portion 90 is positioned at a boundary between the blocks in the well contact CPWELL formed to surround the block BLK during a manufacturing process of the flash memory.

In this manner, the portion 90 containing the same material as that of the well contact CPWELL is used as the source line contact CELSRCx.

The number of the source line contacts CELSRC connected to one block BLK increases due to the memory cell array having the structure illustrated in FIG. 41.

In the memory cell array 10 in FIG. 41, it is possible to reduce an area of the well contact region between the blocks BLK.

The flash memory including the memory cell array of the modification example in FIG. 40 or FIG. 41 may be communized to two blocks BLK to which the address decoder is adjacent, as in FIG. 32 or FIG. 36. In the flash memory according to the modification examples in FIG. 40 and FIG. 41, the common selection gate line SGC may be controlled by the common switch unit 294X, as in FIG. 33 or FIG. 37.

As described above, the memory cell array (block) including the source line contacts and the well contacts illustrated in FIG. 40 and FIG. 41 may be applied to the flash memory.

According to the modification example of the embodiment illustrated in FIG. 40 and FIG. 41, it is possible to reduce resistance between the source line and the substrate and to reduce the shunt region.

The flash memory according to the embodiment may be a multilevel memory.

For example, a two-bit multilevel flash memory has threshold values of the Erase level, A level, B level, and C level.

A reading operation of the multilevel flash memory includes a determination voltage as follows.

A determination voltage applied to a word line selected for the reading operation of the A level is, for example, in a range of 0 V to 0.55 V. The determination voltage of the A level is not limited to these values and may be in any range among a range of 0.1 V to 0.24 V, a range of 0.21 V to 0.31 V, a range of 0.31 V to 0.4 V, a range of 0.4 V to 0.5 V, and a range of 0.5 V to 0.55 V.

A determination voltage applied to a word line selected for the reading operation of the B level is, for example, in a range of 1.5 V to 2.3 V. The determination voltage of the B level is not limited to these values and may be in any range among a range of 1.65 V to 1.8 V, a range of 1.8 V to 1.95 V, a range of 1.95 V to 2.1 V, and a range of 2.1 V to 2.3 V.

A determination voltage applied to a word line selected for the reading operation of the C level is, for example, in a range of 3.0 V to 4.0 V. The determination voltage of the C level is not limited to these values and may be in any range among a range of 3.0 V to 3.2 V, a range of 3.2 V to 3.4 V, a range of 3.4 V to 3.5 V, a range of 3.5 V to 3.6 V, and a range of 3.6 V to 4.0 V.

A period (tR) of the reading operation may be any one among a period of 25 µs to 38 µs, a period of 38 µs to 70 µs, and a period of 70 µs to 80 µs, for example.

A writing operation of the multilevel flash memory includes a program operation and a verification operation.

In the writing operation of the multilevel flash memory, a voltage applied at first to a word line selected in the program operation is in a range of 13.7 V to 14.3 V, for example. The voltage is not limited to the value and may be in one of a range of 13.7 V to 14.0 V and a range of 14.0 V to 14.6 V.

When the writing operation is executed on the memory cell of the odd-numbered word line, a voltage applied at first to the selected word line may be different from a voltage applied at first to the selected word line when the writing operation is executed on the memory cell of the even-numbered word line.

When the program operation is executed by an incremental step pulse program (ISPP) method, a step-up voltage is approximately 0.5 V, for example.

The non-selection voltage (pass voltage) applied to the non-selected word line is in a range of 6.0 V to 7.3 V, for example. The non-selection voltage is not limited to the value and may be, for example, in a range of 7.3 V to 8.4 V. The non-selection voltage may also be equal to or less than 6.0 V.

The pass voltage to be applied may be changed depending on which the non-selected word line is the odd-numbered word line or the even-numbered word line.

A period (tProg) of the writing operation may be any one among a period of 1,700 µs to 1,800 µs, a period of 1,800 µs to 1,900 µs, and a period of 1,900 µs to 2,000 µs, for example.

In an erasing operation of the multilevel flash memory, a voltage applied at first to the well region is in a range of 12 V to 13.6 V, for example. The well region is formed on the upper portion of the semiconductor substrate and the memory cell is disposed above the well region. The voltage is not limited to the value and may be in any range among a range of 13.6 V to 14.8 V, a range of 14.8 V to 19.0 V, a range of 19.0 V to 19.8 V, and a range of 19.8 V to 21 V, for example.

A period (tErase) of the erasing operation may be any one among a period of 3,000 µs to 4,000 µs, a period of 4,000 µs to 5,000 µs, and a period of 4,000 µs to 9,000 µs.

The semiconductor memory according to the embodiment is not limited to a semiconductor memory having a structure in which the conductive layer (gate electrode) 73 surrounds the side surface of the semiconductor pillar 75 through the memory film 79.

For example, the memory cell array 10 may be provided on a semiconductor layer which is on an upper surface of the insulating film (inter-layer insulating film) covering the semiconductor substrate 70. In this case, the semiconductor pillar 75 is, for example, a semiconductor layer obtained by performing epitaxial growth on the semiconductor substrate 70. The conductive layer 73 covers the side surface of the semiconductor pillar 75 obtained by performing epitaxial growth through the memory film 79. The memory film 79 may be an oxide film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory comprising:
a first memory string including a first selection transistor above a semiconductor substrate, a second selection transistor above the first selection transistor, first memory cells above the second selection transistor, and a third selection transistor above the first memory cells;
a second memory string including a fourth selection transistor, a fifth selection transistor above the fourth selection transistor, second memory cells above the fifth selection transistor, and a sixth selection transistor above the second memory cells;
a first line connected to gate electrodes of the first selection transistor and the fourth selection transistor;
a second line connected to a gate electrode of the second selection transistor;
a third line, different from the second line, connected to a gate electrode of the fifth selection transistor;
a first voltage generation circuit configured to generate a first voltage to the first line;
a second voltage generation circuit configured to generate a second voltage to the second line;
a control circuit configured to independently control the application of the first and second voltages; and
a row decoder including a block decoder and a plurality of transfer transistors, the transfer transistors including a first transistor, a second transistor, a third transistor, and a fourth transistor, one ends of the first and second transistors being connected to the first line, one ends of the third and fourth transistors being connected to the second line, a gate of the first transistor being connected to a gate of the third transistor, and a gate of the second transistor being connected to a gate of the fourth transistor.

2. The memory according to claim 1, wherein, during a read operation of a first memory cell, the control circuit is configured to apply a first voltage to the first line, and apply a second voltage to the second line, the first voltage being higher than the second voltage.

3. The memory according to claim 2, further comprising:
a source line connected to first ends of the memory strings;
a first bit line connected to a second end of the first memory string;
a second bit line connected to a second end of the second memory string; and
multiple word lines, each of which is commonly connected to a gate electrode of one of the first memory cells and a gate electrode of one of the second memory cells.

4. The memory according to claim 1, wherein, during a write operation of a first memory cell, the control circuit is configured to apply a zero voltage to the first line and the second line.

5. The memory according to claim 1, wherein, during an erase operation, the control circuit is configured to apply a third voltage to the first line and to apply a fourth voltage to the second line, the third voltage and the fourth voltage being different from the zero voltage.

6. The memory according to claim 1, further comprising:
a substrate contact formed in a diffusion region of the semiconductor substrate of a first conductivity type; and a source line contact formed in a diffusion region of the semiconductor substrate of a second conductivity type, between the first and second memory strings, wherein during an erasing operation, the control circuit applies an erasing voltage to the substrate contact and the source line contact, applies the first voltage to the first line, and applies the second voltage to the second line.

7. The memory according to claim 6, wherein the second voltage is different from the first voltage and is lower than the erasing voltage.

8. The memory according to claim 1, wherein
the first selection transistor has a first channel region in the semiconductor substrate and a second channel region in a first semiconductor pillar, the first semiconductor pillar extending above the semiconductor substrate, and
the second selection transistor has a channel region in the first semiconductor pillar.

9. A semiconductor memory comprising:
first and second semiconductor pillars extending above a semiconductor substrate;
a first memory string including a first selection gate transistor having a first channel region in the semiconductor substrate and a second channel region in the first semiconductor pillar, a second selection gate transistor above the first selection gate transistor having a channel region in the first semiconductor pillar, memory cells above the second selection gate transistor having channel regions in the first semiconductor pillar, and a third selection gate transistor above the multiple memory cells having a channel region in the first semiconductor pillar;
a second memory string including a first selection gate transistor having a first channel region in the semiconductor substrate and a second channel region in the second semiconductor pillar, a second selection gate transistor above the first selection gate transistor having a channel region in the second semiconductor pillar, memory cells above the second selection gate transistor having channel regions in the second semiconductor pillar, and a third selection gate transistor above the multiple memory cells having a channel region in the second semiconductor pillar;
a first source side selection gate line connected to a gate electrode of the first selection gate transistor of the first memory string;
a second source side selection gate line connected to a gate electrode of the first selection gate transistor of the second memory string;
a third source side selection gate line connected to a gate electrode of the second selection gate transistor of the first memory string;
a fourth source side selection gate line connected to a gate electrode of the second selection gate transistor of the second memory string;
a first drain side selection gate line connected to a gate electrode of the third selection gate transistor of the first memory string;
a second drain side selection gate line connected to a gate electrode of the third selection gate transistor of the second memory string;
a first voltage generation circuit configured to generate a first voltage to be applied in common to the first and second source side selection gate lines; and
a second voltage generation circuit configured to generate a second voltage to be applied to the third and fourth source side selection gate lines.

10. The memory according to claim 9, further comprising:
a control circuit configured to independently control the application of the first and second voltages.

11. The memory according to claim 10, wherein, during a read operation of a memory cell in the first memory string, the control circuit causes the first selection gate transistor of the first and second memory strings to turn ON, the second selection gate transistor of the first memory string to turn ON, and the second selection gate transistor of the second memory string to turn OFF.

12. The memory according to claim 11, further comprising:
a source line contact above the semiconductor substrate between the first and second memory strings;
a source line connected to first ends of the memory strings through the source line contact and diffusion regions in the semiconductor substrate;
a first bit line connected to a second end of the first memory string through the first semiconductor pillar;
a second bit line connected to a second end of the second memory string through the second semiconductor pillar; and
multiple word lines, each of which is commonly connected to a gate electrode of one of the memory cells in the first string and a gate electrode of one of the memory cells in the second string, wherein
during the read operation of the memory cell in the first memory string, a current flows through the source line contact, the semiconductor substrate, and the first semiconductor pillar.

13. The memory according to claim 9, further comprising:
a substrate contact formed in a diffusion region of the semiconductor substrate of a first conductivity type; and
a source line contact formed in a diffusion region of the semiconductor substrate of a second conductivity type, between the first and second memory strings, wherein
during an erasing operation, the control circuit applies an erasing voltage to the substrate contact and the source line contact, applies the first voltage from the first voltage circuit to the first and second source side selection gate lines, and applies the second voltage from the second voltage circuit to the third and fourth selection gate lines.

14. The memory according to claim 13, wherein the second voltage is different from the first voltage and is lower than the erasing voltage.

15. A semiconductor memory comprising:
a first memory string including a first selection transistor above a semiconductor substrate, a second selection transistor above the first selection transistor, first memory cells above the second selection transistor, and a third selection transistor above the first memory cells;
a second memory string including a fourth selection transistor, a fifth selection transistor above the fourth selection transistor, second memory cells above the fifth selection transistor, and a sixth selection transistor above the second memory cells;
a first line connected to gate electrodes of the first selection transistor and the fourth selection transistor;
a second line connected to a gate electrode of the second selection transistor;
a third line, different from the second line, connected to a gate electrode of the fifth selection transistor;
a first voltage generation circuit configured to generate a first voltage to the first line; and
a second voltage generation circuit configured to generate a second voltage to the second line, wherein
the first selection transistor has a first channel region in the semiconductor substrate and a second channel region in a first semiconductor pillar, the first semiconductor pillar extending above the semiconductor substrate, and
the second selection transistor has a channel region in the first semiconductor pillar.

* * * * *